(12) United States Patent
Katakura et al.

(10) Patent No.: US 12,043,749 B2
(45) Date of Patent: Jul. 23, 2024

(54) METHOD FOR PRODUCING INK COMPOSITION

(71) Applicant: SUMITOMO CHEMICAL COMPANY, LIMITED, Tokyo (JP)

(72) Inventors: Shiro Katakura, Osaka (JP); Yuki Yokoi, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 17/802,517

(22) PCT Filed: Mar. 14, 2022

(86) PCT No.: PCT/JP2022/011304
§ 371 (c)(1),
(2) Date: Aug. 25, 2022

(87) PCT Pub. No.: WO2022/202439
PCT Pub. Date: Sep. 29, 2022

(65) Prior Publication Data
US 2023/0135345 A1 May 4, 2023

(30) Foreign Application Priority Data
Mar. 24, 2021 (JP) .................. 2021-049924

(51) Int. Cl.
*H01L 51/00* (2006.01)
*C09D 11/106* (2014.01)
(Continued)

(52) U.S. Cl.
CPC ............ *C09D 11/106* (2013.01); *C09D 11/52* (2013.01); *H10K 30/30* (2023.02); *H10K 85/113* (2023.02);
(Continued)

(58) Field of Classification Search
CPC .... C09D 11/106; C09D 11/52; H10K 85/113; H10K 85/151; H10K 30/30; H10K 85/215
See application file for complete search history.

(56) References Cited

U.S. PATENT DOCUMENTS

| | | | | |
|---|---|---|---|---|
| 2011/0204344 A1* | 8/2011 | Kakimoto | ............. | H10K 71/15 206/524.1 |
| 2022/0013741 A1* | 1/2022 | Inokuchi | ............. | H10K 71/811 |
| 2022/0359825 A1* | 11/2022 | Lheureux | ............. | H10K 50/00 |

FOREIGN PATENT DOCUMENTS

| | | |
|---|---|---|
| CN | 111263982 A | 6/2020 |
| JP | 2020-080328 A | 5/2020 |

(Continued)

OTHER PUBLICATIONS

Office Action issued in corresponding Korean Patent Application No. 10-2022-7030149, dated Jan. 11, 2023.
(Continued)

*Primary Examiner* — Victor A Mandala
*Assistant Examiner* — Colleen E Snow
(74) *Attorney, Agent, or Firm* — Foley & Lardner LLP

(57) ABSTRACT

Provided is an ink composition capable of improving external quantum efficiency of a photoelectric conversion element. A method for producing an ink composition containing a p-type semiconductor material, an n-type semiconductor material, and a solvent, the method comprising: a step of preparing one or more compositions in which one or both of the p-type semiconductor material and the n-type semiconductor material are dissolved in the solvent; and a step of storing the composition for 4 days or longer to prepare the ink composition. The p-type semiconductor material contains a polymer compound having a donor-acceptor structure.

11 Claims, 3 Drawing Sheets

(51) Int. Cl.
  *C09D 11/52* (2014.01)
  *H10K 30/30* (2023.01)
  *H10K 85/10* (2023.01)
  *H10K 85/20* (2023.01)
  *C08K 5/01* (2006.01)
  *H10K 39/32* (2023.01)

(52) U.S. Cl.
  CPC ......... *H10K 85/151* (2023.02); *H10K 85/215* (2023.02); *C08K 5/01* (2013.01); *C08K 2201/001* (2013.01); *H10K 39/32* (2023.02)

(56) References Cited

FOREIGN PATENT DOCUMENTS

| | | | |
|---|---|---|---|
| KR | 1020170070252 A | | 6/2017 |
| WO | WO-2016/076213 A1 | | 5/2016 |
| WO | WO-2019/082844 A1 | | 5/2019 |
| WO | WO-2019/124506 A1 | | 6/2019 |
| WO | WO-2020/260214 A1 | | 12/2020 |

OTHER PUBLICATIONS

Office Action issued in corresponding Singaporean Patent Application No. 202280003007.1, dated Feb. 24, 2023.
Japanese Patent Office, "Decision to Grant a Patent," issued in connection with Japanese Patent Application No. 2021-049924, dated Jul. 20, 2021.
Strobel et al., "Organic photodiodes: printing, coating, benchmarks, and applications," Flexible and Printed Electronics, vol. 4, 2019, Apr. 30, 2001, pp. 1-27.
Japanese Patent Office, "Notice of Reasons for Refusal," issued in connection with Japanese Patent Application No. 2021-049924, dated Jun. 8, 2021.
Office Action issued in corresponding Chinese Patent Application No. 202280003007.1, dated Aug. 15, 2023.

\* cited by examiner

[Fig.1]
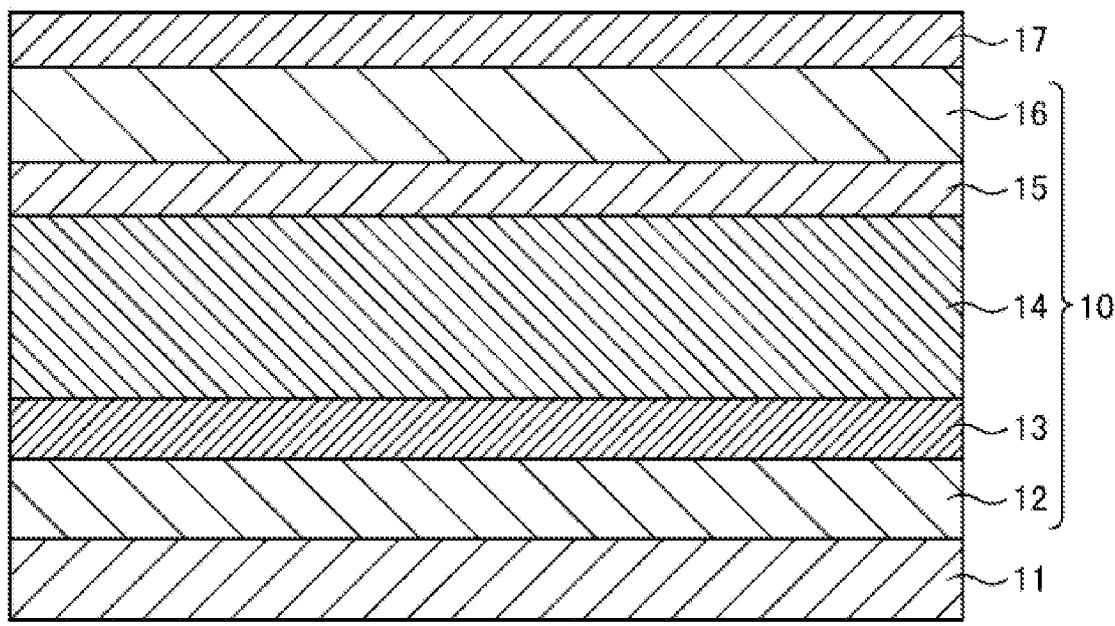
[Fig.2]
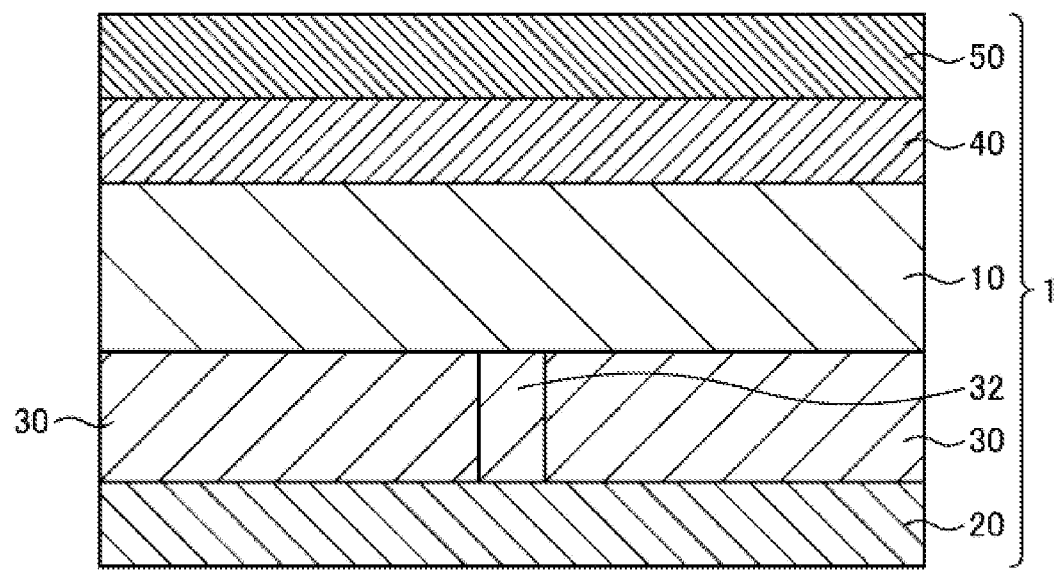

[Fig.3]
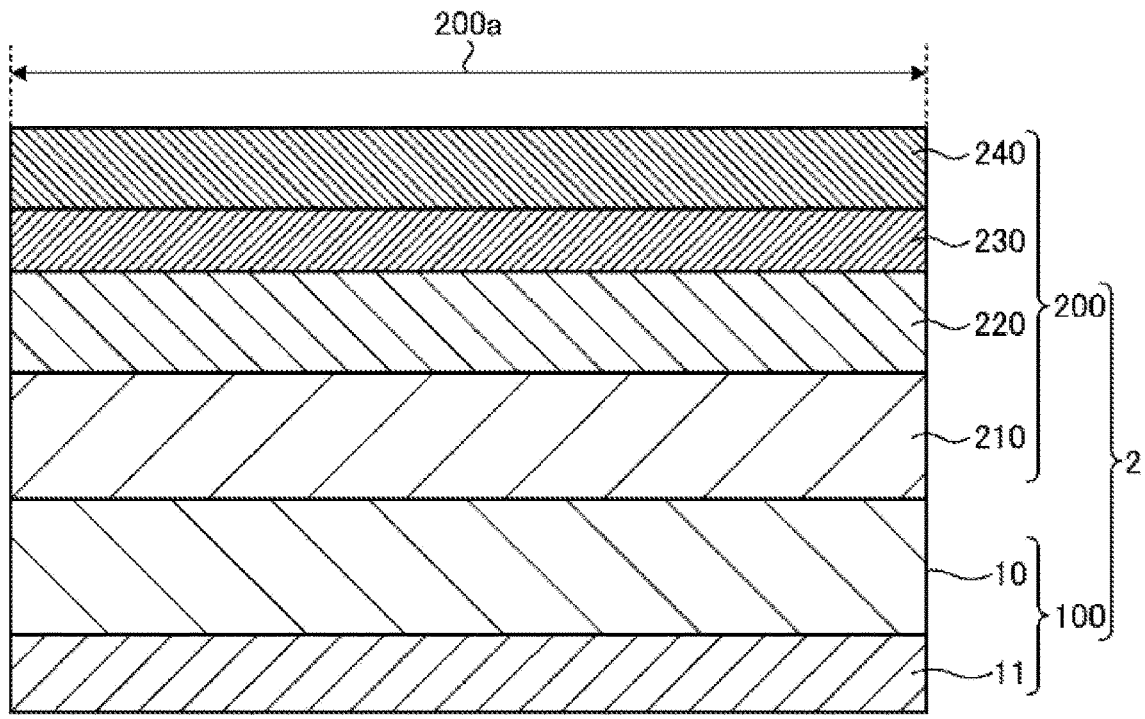
[Fig.4]
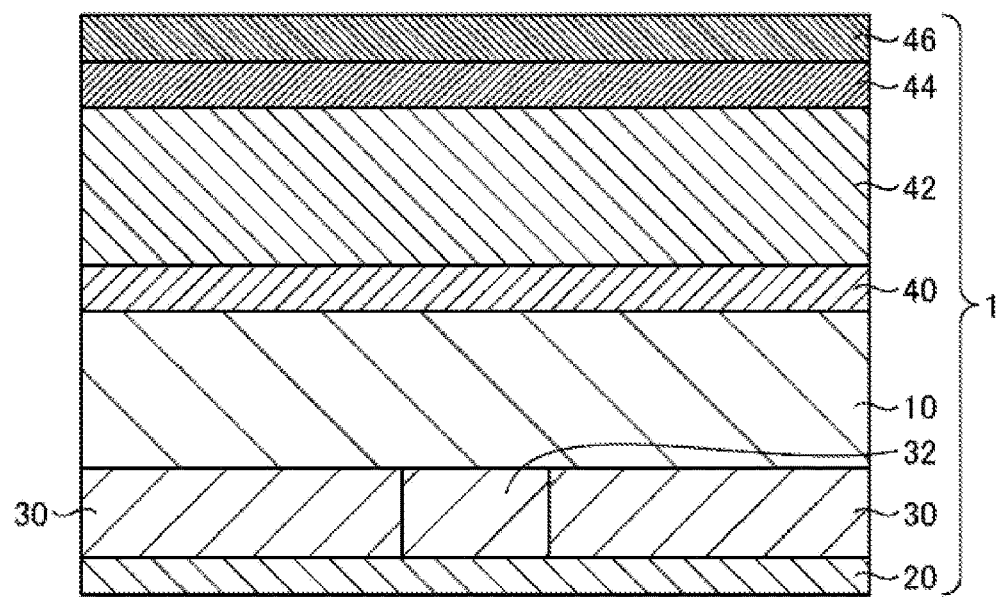

[Fig.5]
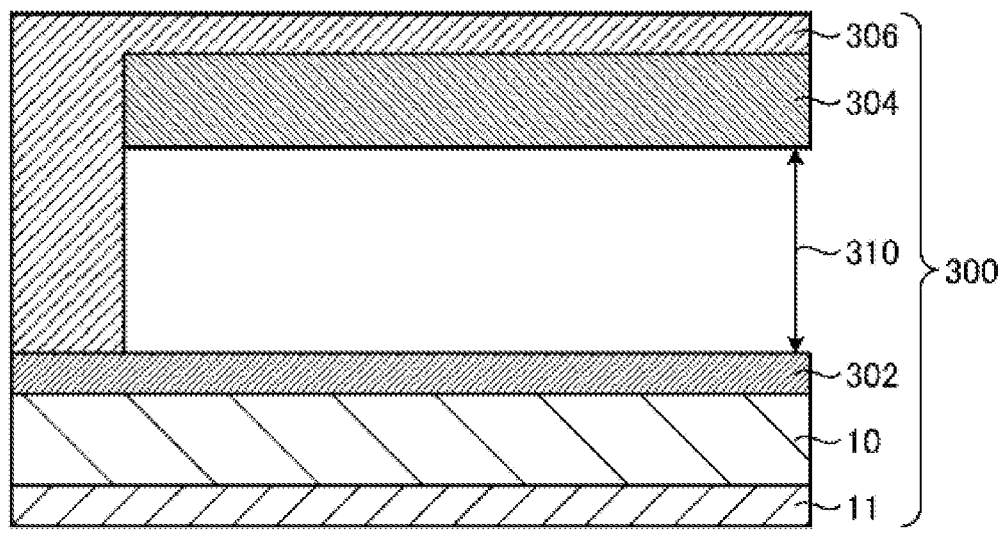
[Fig.6]
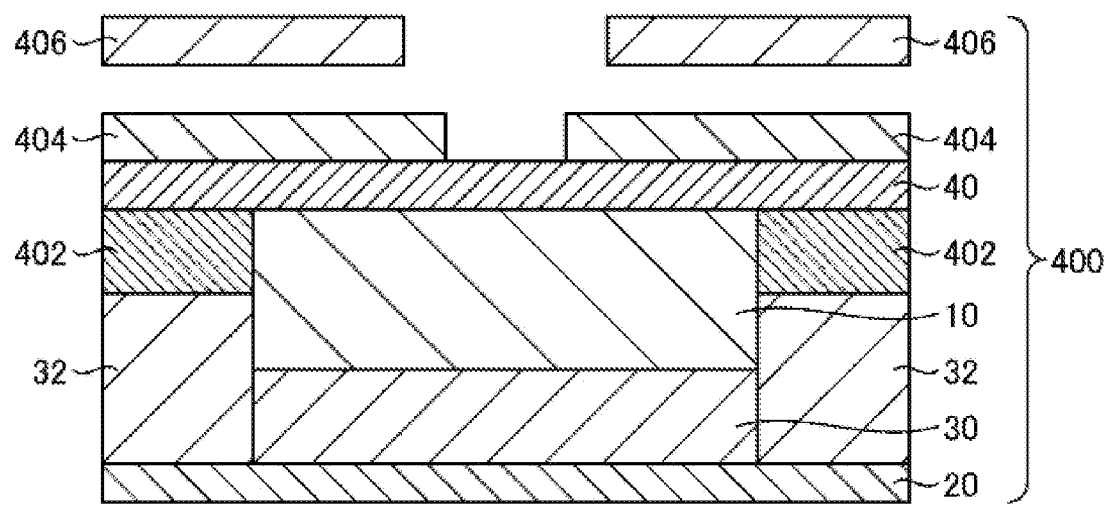

METHOD FOR PRODUCING INK COMPOSITION

CROSS-REFERENCE TO RELATED APPLICATIONS

The present application claims priority under 37 U.S.C. § 371 to International Patent Application No. PCT/JP2022/011304, filed Mar. 14, 2022, which claims priority to and the benefit of Japanese Patent Application No. 2021-049924, filed on Mar. 24, 2021. The contents of these applications are hereby incorporated by reference in their entireties.

TECHNICAL FIELD

The present invention relates to an ink composition for forming a functional layer of a photoelectric conversion element, and a method for producing the same.

BACKGROUND ART

A photoelectric conversion element is, for example, an extremely useful device from the viewpoint of energy saving and reduction of a carbon dioxide emission amount, and has attracted attention.

In manufacturing a photoelectric conversion element, for example, a photodetector (organic photodetector (OPD)), it is known that a manufacturing method of forming functional layers such as an active layer, an electron transport layer, and a hole transport layer by a coating method of applying an ink composition to an object to be coated is applied (see Non-Patent Document 1).

PRIOR ART DOCUMENTS

Non-Patent Document

Non-Patent Document 1: Strobel 2019 Flex. Print. Electron. 4 043001

SUMMARY OF THE INVENTION

Problems to be Solved by the Invention

As described above, in a photoelectric conversion element manufactured by a coating method using an ink composition, it is required to further improve photoelectric conversion efficiency, and specifically, for example, it is required to further improve external quantum efficiency (EQE), which is an index of the photoelectric conversion efficiency.

Means for Solving the Problems

The present inventors have intensively studied to improve external quantum efficiency of a photoelectric conversion element, and to further improve photoelectric conversion efficiency, and have found a method for producing an ink composition capable of further improving external quantum efficiency, thereby completing the present invention.

Therefore, the present invention provides the following [1] to [12].

[1] A method for producing an ink composition containing a p-type semiconductor material, an n-type semiconductor material, and a solvent, the method including:
 a step of preparing one or more compositions in which one or both of the p-type semiconductor material and the n-type semiconductor material are dissolved in the solvent; and
 a step of storing the composition for 4 days or longer to prepare the ink composition.

[2] The method for producing an ink composition according to [1], in which the p-type semiconductor material contains a polymer compound having a donor-acceptor structure.

[3] The method for producing an ink composition according to [1] or [2], in which the p-type semiconductor material contains a polymer compound containing a constitutional unit represented by the following Formula (I) and/or a constitutional unit represented by the following Formula (II):

[Chem. 1]

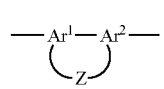
(I)

in Formula (I), $Ar^1$ and $Ar^2$ each independently represent a trivalent aromatic heterocyclic group which may have a substituent, and Z represents a group represented by any one of the following Formulas (Z-1) to (Z-7),

[Chem. 2]

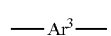
(II)

in Formula (II), $Ar^3$ represents a divalent aromatic heterocyclic group,

[Chem. 3]

(Z-1)

(Z-2)

(Z-3)

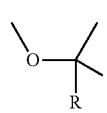
(Z-4)

(Z-5)

(Z-6)

(Z-7)

in Formulas (Z-1) to (Z-7), R represents
a hydrogen atom,
a halogen atom,
an alkyl group which may have a substituent,
a cycloalkyl group which may have a substituent, an alkenyl group which may have a substituent,
a cycloalkenyl group which may have a substituent,
an alkynyl group which may have a substituent,
a cycloalkynyl group which may have a substituent,
an aryl group which may have a substituent,
an alkyloxy group which may have a substituent,
a cycloalkyloxy group which may have a substituent,
an aryloxy group which may have a substituent,
an alkylthio group which may have a substituent,
a cycloalkylthio group which may have a substituent,
an arylthio group which may have a substituent,
a monovalent heterocyclic group which may have a substituent,
a substituted amino group which may have a substituent,
an imine residue which may have a substituent,
an amide group which may have a substituent,
an acid imide group which may have a substituent,
a substituted oxycarbonyl group which may have a substituent,
a cyano group,
a nitro group,
a group represented by —C(=O)—$R^c$, or
a group represented by —$SO_2$—$R^d$,
$R^c$ and $R^d$ each independently represent
a hydrogen atom,
an alkyl group which may have a substituent,
a cycloalkyl group which may have a substituent,
an aryl group which may have a substituent,
an alkyloxy group which may have a substituent,
a cycloalkyloxy group which may have a substituent,
an aryloxy group which may have a substituent, or
a monovalent heterocyclic group which may have a substituent, and
in Formulas (Z-1) to (Z-7), when the number of R's is two, the two R's may be the same as or different from each other.

[4] The method for producing an ink composition according to any one of [1] to [3], in which the n-type semiconductor material contains a fullerene derivative.

[5] The method for producing an ink composition according to any one of [1] to [3], in which the n-type semiconductor material contains a non-fullerene compound.

[6] The method for producing an ink composition according to any one of [1] to [5], in which the solvent contains an aromatic hydrocarbon.

[7] The method for producing an ink composition according to any one of [1] to [6], in which the step of preparing the composition is performed under a condition of 0° C. or higher and 200° C. or lower.

[8] The method for producing an ink composition according to any one of [1] to [7], in which the step of storing the composition is performed under light shielding.

[9] The method for producing an ink composition according to any one of [1] to [8], in which the step of preparing the composition includes a step of preparing two or more compositions, and the step of preparing the ink composition includes a step of mixing the two or more compositions.

[10] The method for producing an ink composition according to any one of [1] to [9], in which the step of preparing the ink composition further includes a step of filtering the composition.

[11] A solidified film obtained by solidifying the ink composition produced by the method for producing an ink composition according to any one of [1] to [10].

[12] A photodetector including a first electrode, a second electrode, and an active layer provided between the first electrode and the second electrode, in which the active layer is the solidified film according to [11].

Effect of the Invention

According to the method for producing an ink composition of the present invention, an ink composition capable of further improving external quantum efficiency of a photoelectric conversion element can be provided by storing the ink composition for a predetermined period of time after the preparation

BRIEF DESCRIPTION OF THE DRAWINGS

FIG. 1 is a view schematically illustrating a configuration example of a photoelectric conversion element.
FIG. 2 is a view schematically illustrating a configuration example of an image detection unit.
FIG. 3 is a view schematically illustrating a configuration example of a fingerprint detection unit.
FIG. 4 is a view schematically illustrating a configuration example of an image detection unit for an X-ray imaging device.
FIG. 5 is a view schematically illustrating a configuration example of a vein detection unit for a vein authentication device.
FIG. 6 is a view schematically illustrating a configuration example of an image detection unit for an indirect time-of-flight (TOF) type distance measuring device.

MODE FOR CARRYING OUT THE INVENTION

Hereinafter, embodiments of the present invention will be described with reference to the drawings. Note that the drawings merely schematically illustrate the shape, size, and arrangement of constituent elements to the extent that the invention can be understood.

The present invention is not limited by the following description, and each constituent element can be appropriately changed without departing from the gist of the present invention. In the drawings used in the following description, the same constituent elements are denoted by the same reference numerals, and redundant description may be omitted.

In addition, the configuration according to the embodiment of the present invention is not necessarily used in the arrangement of the illustrated example.

1. Description of Common Terms

In the present specification, a "polymer compound" means a polymer having a molecular weight distribution and a number average molecular weight of $1 \times 10^3$ or more and $1 \times 10^8$ or less in terms of polystyrene. A constitutional unit contained in the polymer compound is 100 mol % in total.

In the present specification, a "constitutional unit" means a unit derived from a monomer compound (monomer) that is one or more units present in the polymer compound.

In the present specification, a "hydrogen atom" may be a light hydrogen atom or a heavy hydrogen atom.

In the present specification, examples of a "halogen atom" include a fluorine atom, a chlorine atom, a bromine atom, and an iodine atom.

An aspect of "which may have a substituent" includes both aspects of a case where all hydrogen atoms constituting a compound or group are unsubstituted and a case where some or all of one or more hydrogen atoms are substituted by a substituent.

Examples of the substituent include a halogen atom, an alkyl group, a cycloalkyl group, an alkenyl group, a cycloalkenyl group, an alkynyl group, a cycloalkynyl group, an alkyloxy group, a cycloalkyloxy group, an alkylthio group, a cycloalkylthio group, an aryl group, an aryloxy group, an arylthio group, a monovalent heterocyclic group, a substituted amino group, an acyl group, an imine residue, an amide group, an acid imide group, a substituted oxycarbonyl group, a cyano group, an alkylsulfonyl group, and a nitro group.

In the present specification, an "alkyl group" may have a substituent. The "alkyl group" may have any of a linear shape, a branched shape, or a cyclic shape unless otherwise specified. The number of carbon atoms of a linear alkyl group is usually 1 to 50, preferably 1 to 30, and more preferably 1 to 20, without including the number of carbon atoms of the substituent. The number of carbon atoms of a branched or cyclic alkyl group is usually 3 to 50, preferably 3 to 30, and more preferably 4 to 20, without including the number of carbon atoms of the substituent.

Specific examples of the alkyl group include unsubstituted alkyl groups such as a methyl group, an ethyl group, an n-propyl group, an isopropyl group, an n-butyl group, an isobutyl group, a tert-butyl group, an n-pentyl group, an isoamyl group, a 2-ethylbutyl group, an n-hexyl group, a cyclohexyl group, an n-heptyl group, a cyclohexylmethyl group, a cyclohexylethyl group, an n-octyl group, a 2-ethylhexyl group, a 3-n-propylheptyl group, an adamantyl group, an n-decyl group, a 3,7-dimethyloctyl group, a 2-ethyloctyl group, a 2-n-hexyl-decyl group, an n-dodecyl group, a tetradecyl group, a hexadecyl group, an octadecyl group, and an icosyl group; and substituted alkyl groups such as a trifluoromethyl group, a pentafluoroethyl group, a perfluorobutyl group, a perfluorohexyl group, a perfluorooctyl group, a 3-phenylpropyl group, a 3-(4-methylphenyl)propyl group, a 3-(3,5-di)-n-hexylphenyl)propyl group, and a 6-ethyloxyhexyl group.

The "cycloalkyl group" may be a monocyclic group or a polycyclic group. The cycloalkyl group may have a substituent. The number of carbon atoms of the cycloalkyl group is usually 3 to 30 and preferably 3 to 20 without including the number of carbon atoms of the substituent.

Examples of the cycloalkyl group include alkyl groups having no substituent, such as a cyclopentyl group, a cyclohexyl group, a cycloheptyl group, and an adamantyl group, and a group in which a hydrogen atom in these groups is substituted with a substituent such as an alkyl group, an alkyloxy group, an aryl group, or a fluorine atom.

Specific examples of a cycloalkyl group having a substituent include a methylcyclohexyl group and an ethylcyclohexyl group.

The "alkenyl group" may be linear or branched. The alkenyl group may have a substituent. The number of carbon atoms of the alkenyl group is usually 2 to 30 and preferably 2 to 20 without including the number of carbon atoms of the substituent.

Examples of the alkenyl group include alkenyl groups having no substituent, such as a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group, and a 7-octenyl group, and a group in which a hydrogen atom in these groups is substituted with a substituent such as an alkyloxy group, an aryl group, or a fluorine atom.

The "cycloalkenyl group" may be a monocyclic group or a polycyclic group. The cycloalkenyl group may have a substituent. The number of carbon atoms of the cycloalkenyl group is usually 3 to 30 and preferably 3 to 20 without including the number of carbon atoms of the substituent.

Examples of the cycloalkenyl group include cycloalkenyl groups having no substituent, such as a cyclohexenyl group, and a group in which a hydrogen atom in these groups is substituted with a substituent such as an alkyl group, an alkyloxy group, an aryl group, or a fluorine atom.

Examples of a cycloalkenyl group having a substituent include a methylcyclohexenyl group and an ethylcyclohexenyl group.

The "alkynyl group" may be linear or branched. The alkynyl group may have a substituent. The number of carbon atoms of the alkynyl group is usually 2 to 30 and preferably 2 to 20 without including the number of carbon atoms of the substituent.

Examples of the alkynyl group include alkynyl groups having no substituent, such as an ethynyl group, a 1-propynyl group, a 2-propynyl group, a 2-butynyl group, a 3-butynyl group, a 3-pentynyl group, a 4-pentynyl group, a 1-hexynyl group, and a 5-hexynyl group, and a group in which a hydrogen atom in these groups is substituted with a substituent such as an alkyloxy group, an aryl group, or a fluorine atom.

The "cycloalkynyl group" may be a monocyclic group or a polycyclic group. The cycloalkynyl group may have a substituent. The number of carbon atoms of the cycloalkynyl group is usually 4 to 30 and preferably 4 to 20 without including the number of carbon atoms of the substituent.

Examples of the cycloalkynyl group include cycloalkynyl groups having no substituent, such as a cyclohexenyl group, and a group in which a hydrogen atom in these groups is substituted with a substituent such as an alkyl group, an alkyloxy group, an aryl group, or a fluorine atom.

Examples of a cycloalkynyl group having a substituent include a methylcyclohexanyl group and an ethylcyclohexenyl group.

The "alkyloxy group" may be linear or branched. The alkyloxy group may have a substituent. The number of carbon atoms of the alkyloxy group is usually 1 to 30 and preferably 1 to 20 without including the number of carbon atoms of the substituent.

Examples of the alkyloxy group include alkyloxy groups having no substituent, such as a methoxy group, an ethoxy group, an n-propyloxy group, an isopropyloxy group, an n-butyloxy group, an isobutyloxy group, a tert-butyloxy group, an n-pentyloxy group, an n-hexyloxy group, an n-heptyloxy group, an n-octyloxy group, a 2-ethylhexyloxy group, an n-nonyloxy group, an n-decyloxy group, a 3,7-dimethyloctyloxy group, a 3-heptyldodecyloxy group, and a lauryloxy group, and a group in which a hydrogen atom in these groups is substituted with a substituent such as an alkyloxy group, an aryl group, or a fluorine atom.

A cycloalkyl group included in the "cycloalkyloxy group" may be a monocyclic group or a polycyclic group. The cycloalkyloxy group may have a substituent. The number of carbon atoms of the cycloalkyloxy group is usually 3 to 30 and preferably 3 to 20 without including the number of carbon atoms of the substituent.

Examples of the cycloalkyloxy group include cycloalkyloxy groups having no substituent, such as a cyclopentyloxy group, a cyclohexyloxy group, and a cycloheptyloxy group, and a group in which a hydrogen atom in these groups is substituted with a substituent such as a fluorine atom or an alkyl group.

The "alkylthio group" may be linear or branched. The alkylthio group may have a substituent. The number of carbon atoms of the alkylthio group is usually 1 to 30 and preferably 1 to 20 without including the number of carbon atoms of the substituent.

Examples of an alkylthio group which may have a substituent include a methylthio group, an ethylthio group, an n-propylthio group, an isopropylthio group, an n-butylthio group, an isobutylthio group, a tert-butylthio group, an n-pentylthio group, an n-hexylthio group, an n-heptylthio group, an n-octylthio group, a 2-ethylhexylthio group, an n-nonylthio group, an n-decylthio group, a 3,7-dimethyloctylthio group, a 3-heptyldodecylthio group, a laurylthio group, and a trifluoromethylthio group.

A cycloalkyl group included in the "cycloalkylthio group" may be a monocyclic group or a polycyclic group. The cycloalkylthio group may have a substituent. The number of carbon atoms of the cycloalkylthio group is usually 3 to 30 and preferably 3 to 20 without including the number of carbon atoms of the substituent.

Examples of a cycloalkylthio group which may have a substituent include a cyclohexylthio group.

A "p-valent aromatic carbocyclic group" means a remaining atomic group obtained by removing p hydrogen atoms directly bonded to carbon atoms constituting a ring from an aromatic hydrocarbon which may have a substituent. The p-valent aromatic carbocyclic group may further have a substituent.

The "aryl group" means a monovalent aromatic carbocyclic group. The aryl group may have a substituent. The number of carbon atoms of the aryl group is usually 6 to 60 and preferably 6 to 48 without including the number of carbon atoms of the substituent.

Examples of the aryl group include aryl groups having no substituent, such as a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group, and a 4-phenylphenyl group, a group in which a hydrogen atom in these groups is substituted with a substituent such as an alkyl group, an alkyloxy group, an aryl group, or a fluorine atom.

The "aryloxy group" may have a substituent. The number of carbon atoms of the aryloxy group is usually 6 to 60 and preferably 6 to 48 without including the number of carbon atoms of the substituent.

Examples of the aryloxy group include aryloxy groups having no substituent, such as a phenoxy group, a 1-naphthyloxy group, a 2-naphthyloxy group, a 1-anthracenyloxy group, a 9-anthracenyloxy group, and a 1-pyrenyloxy group, and a group in which a hydrogen atom in these groups is substituted with a substituent such as an alkyl group, an alkyloxy group, or a fluorine atom.

The "arylthio group" may have a substituent. The number of carbon atoms of the arylthio group is usually 6 to 60 and preferably 6 to 48 without including the number of carbon atoms of the substituent.

Examples of an arylthio group which may have a substituent include a phenylthio group, a C1-C12 alkyloxyphenylthio group, a C1-C12 alkylphenylthio group, a 1-naphthylthio group, a 2-naphthylthio group, and a pentafluorophenylthio group. The "C1-C12" indicates that the number of carbon atoms of a group described immediately after that is 1 to 12. Furthermore, the "Cm-Cn" indicates that the number of carbon atoms of a group described immediately after that is m to n. The same applies to the following.

The "p-valent heterocyclic group" (p represents an integer of 1 or more) means a remaining atomic group obtained by removing p hydrogen atoms among hydrogen atoms directly bonded to carbon atoms or heteroatoms constituting a ring from a heterocyclic compound which may have a substituent. A "p-valent aromatic heterocyclic group" is included in the "p-valent heterocyclic group". The "p-valent aromatic heterocyclic group" means a remaining atomic group obtained by removing p hydrogen atoms among hydrogen atoms directly bonded to carbon atoms or heteroatoms constituting a ring from an aromatic heterocyclic compound which may have a substituent.

The aromatic heterocyclic compound includes a compound in which an aromatic ring is fused to a heterocyclic ring even when the heterocyclic ring itself does not exhibit aromaticity, in addition to a compound in which a heterocyclic ring itself exhibits aromaticity.

Among the aromatic heterocyclic compounds, specific examples of the compound in which a heterocyclic ring itself exhibits aromaticity include oxadiazole, thiadiazole, thiazole, oxazole, thiophene, pyrrole, phosphole, furan, pyridine, pyrazine, pyrimidine, triazine, pyridazine, quinoline, isoquinoline, carbazole, and dibenzophosphole.

Among the aromatic heterocyclic compounds, specific examples of the compound in which an aromatic ring is fused to a heterocyclic ring even when the heterocyclic ring itself does not exhibit aromaticity include phenoxazine, phenothiazine, dibenzoborole, dibenzosilole, and benzopyran.

The p-valent heterocyclic group may have a substituent. The number of carbon atoms of the p-valent heterocyclic group is usually 2 to 60 and preferably 2 to 20 without including the number of carbon atoms of the substituent.

Examples of the monovalent heterocyclic group include a monovalent aromatic heterocyclic group (for example, a thienyl group, a pyrrolyl group, a furyl group, a pyridyl group, a quinolyl group, an isoquinolyl group, a pyrimidinyl group, and a triazinyl group), a monovalent non-aromatic heterocyclic group (for example, a piperidyl group and a piperazyl group), and a group in which a hydrogen atom in these groups is substituted with a substituent such as an alkyl group, an alkyloxy group, or a fluorine atom.

The "substituted amino group" means an amino group having a substituent. As the substituent of the amino group, an alkyl group, an aryl group, and a monovalent heterocyclic group are preferable. The number of carbon atoms of the substituted amino group is usually 2 to 30 without including the number of carbon atoms of the substituent.

Examples of the substituted amino group include a dialkylamino group (for example, a dimethylamino group and a diethylamino group), and a diarylamino group (for example, a diphenylamino group, a bis(4-methylphenyl)amino group, a bis(4-tert-butylphenyl)amino group, and a bis(3,5-di-tert-butylphenyl)amino group).

The "acyl group" may have a substituent. The number of carbon atoms of the acyl group is usually 2 to 20 and preferably 2 to 18 without including the number of carbon atoms of the substituent. Specific examples of the acyl group include an acetyl group, a propionyl group, a butyryl group, an isobutyryl group, a pivaloyl group, a benzoyl group, a trifluoroacetyl group, and a pentafluorobenzoyl group.

The "imine residue" means a remaining atomic group obtained by removing one hydrogen atom directly bonded to a carbon atom or a nitrogen atom constituting a carbon atom-nitrogen atom double bond from an imine compound. The "imine compound" means an organic compound having a carbon atom-nitrogen atom double bond in the molecule. Examples of the imine compound include aldimine, ketimine, and a compound in which a hydrogen atom bonded to a nitrogen atom constituting a carbon atom-nitrogen atom double bond in aldimine is substituted with a substituent such as an alkyl group.

The number of carbon atoms of the imine residue is usually 2 to 20 and preferably 2 to 18. Examples of the imine residue include a group represented by the following structural formula.

[Chem. 4].

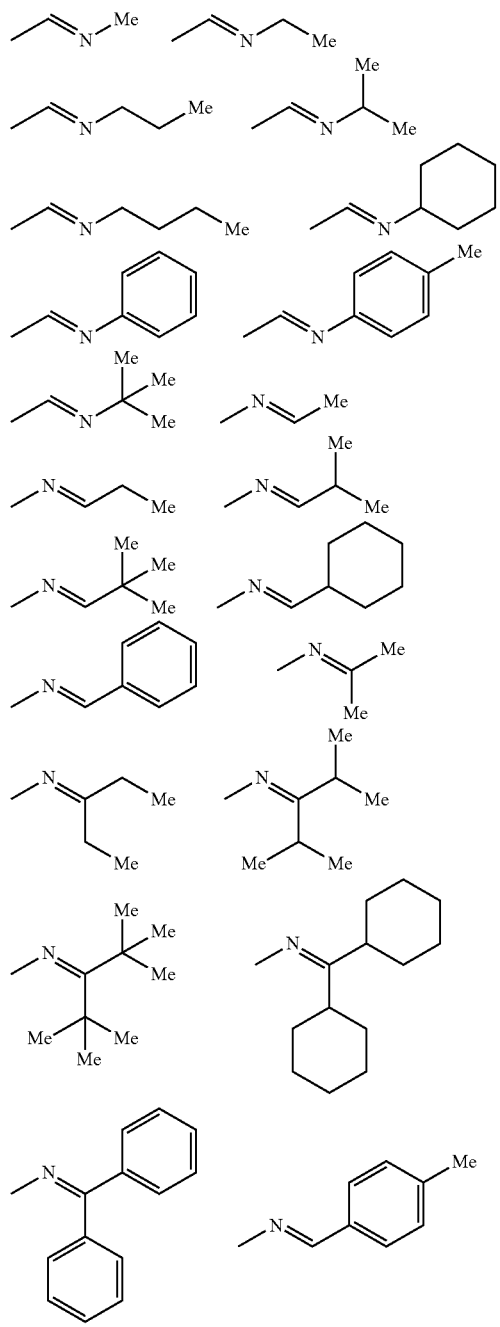

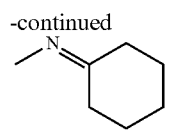

The "amide group" means a remaining atomic group obtained by removing one hydrogen atom bonded to a nitrogen atom from an amide. The number of carbon atoms of the amide group is usually about 1 to 20 and preferably 1 to 18. Specific examples of the amide group include a formamide group, an acetamide group, a propionamide group, a butyramide group, a benzamide group, a trifluoroacetamide group, a pentafluorobenzamide group, a diformamide group, a diacetamide group, a dipropylamide group, a dibutyramide group, a dibenzamide group, a ditrifluoroacetamide group, and a dipentafluorobenzamide group.

The "acid imide group" means a remaining atomic group obtained by removing one hydrogen atom bonded to a nitrogen atom from an acid imide. The number of carbon atoms of the acid imide group is usually 4 to 20. Specific examples of the acid imide group include a group shown below.

[Chem. 5]

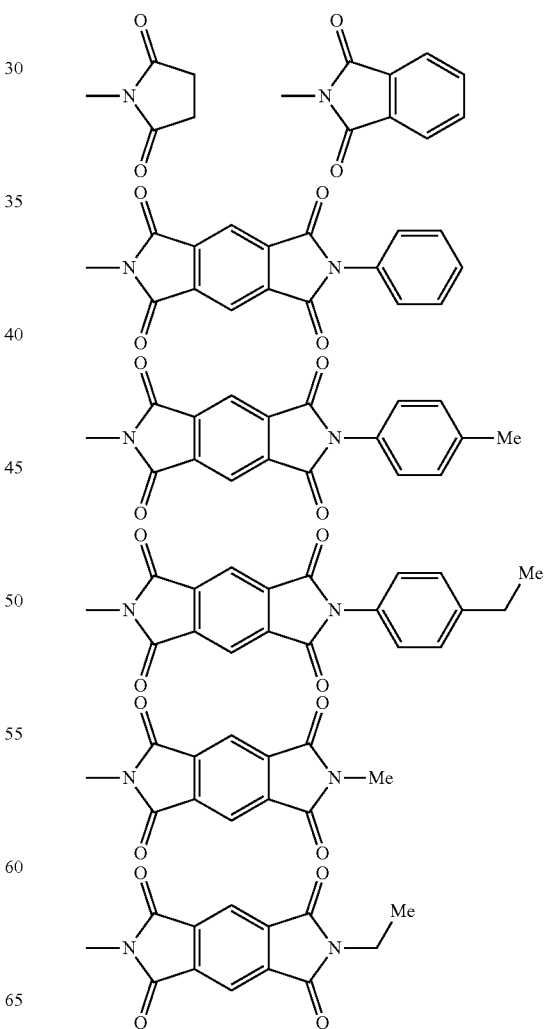

-continued

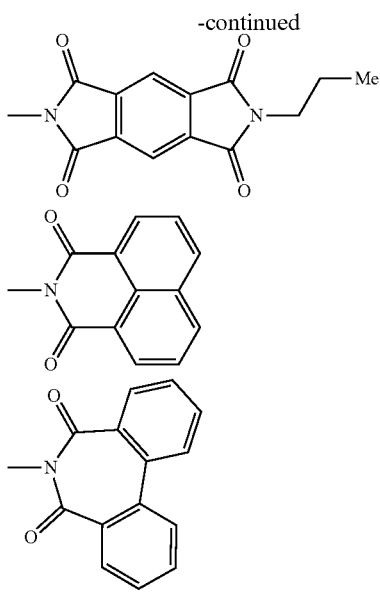

The "substituted oxycarbonyl group" means a group represented by R'—O—(C=O)—.

Here, R' represents an alkyl group, an aryl group, an arylalkyl group, or a monovalent heterocyclic group.

The number of carbon atoms of the substituted oxycarbonyl group is usually 2 to 60 and preferably 2 to 48.

Specific examples of the substituted oxycarbonyl group include a methoxycarbonyl group, an ethoxycarbonyl group, a propoxycarbonyl group, an isopropoxycarbonyl group, a butoxycarbonyl group, an isobutoxycarbonyl group, a tert-butyloxycarbonyl group, a pentyloxycarbonyl group, a hexyloxycarbonyl group, a cyclohexyloxycarbonyl group, a heptyloxycarbonyl group, an octyloxycarbonyl group, a 2-ethylhexyloxycarbonyl group, a nonyloxycarbonyl group, a decyloxycarbonyl group, a 3,7-dimethyloctyloxycarbonyl group, a dodecyloxycarbonyl group, a trifluoroethoxycarbonyl group, a pentafluoroethoxycarbonyl group, a perfluorobutoxycarbonyl group, a perfluorohexyloxycarbonyl group, a perfluorooctyloxycarbonyl group, a phenoxycarbonyl group, a naphthoxycarbonyl group, and a pyridyloxycarbonyl group.

The "alkylsulfonyl group" may be linear or branched. The alkylsulfonyl group may have a substituent. The number of carbon atoms of the alkylsulfonyl group is usually 1 to 30 without including the number of carbon atoms of the substituent. Specific examples of the alkylsulfonyl group include a methylsulfonyl group, an ethylsulfonyl group, and a dodecylsulfonyl group.

"*" attached to the chemical formula represents a bond.

The "π-conjugated system" means a system in which n electrons are delocalized over a plurality of bonds.

The "(meth)acrylic" includes acrylic, methacrylic, and a combination thereof.

In the present specification, the "ink composition" means a liquid composition used in a coating method, and is not limited to a colored liquid. In addition, the "coating method" means a method for forming a film using a liquid substance typified by an ink composition, and examples thereof include a slit coating method, a knife coating method, a spin coating method, a casting method, a micro-gravure coating method, a gravure coating method, a bar coating method, a roll coating method, a wire bar coating method, a dip coating method, a spray coating method, a screen printing method, a gravure printing method, a flexographic printing method, an offset printing method, an inkjet coating method, a dispenser printing method, a nozzle coating method, and a capillary coating method.

The "ink composition" may be a solution, or may be a dispersion such as a dispersion, an emulsion, or a suspension.

2. Ink Composition

The ink composition of the present embodiment is an ink composition containing a p-type semiconductor material, an n-type semiconductor material, and a solvent, and is an ink composition prepared by preparing a composition that is a precursor thereof and then storing (treating) the composition for a predetermined time (the number of days) under predetermined conditions, or prepared by mixing two or more stored compositions (details of the storage (treatment) will be described below).

Hereinafter, components that can be contained in the ink composition of the present embodiment will be specifically described.

Here, the p-type semiconductor material contains at least one electron-donating compound, and the n-type semiconductor material contains at least one electron-accepting compound. Whether the semiconductor material contained in the ink composition functions as either a p-type semiconductor material or an n-type semiconductor material may be determined relatively from a HOMO energy level value or a LUMO energy level value of the selected compound.

A relationship between an energy level value of each of a HOMO and a LUMO of the p-type semiconductor material and an energy level value of each of a HOMO and a LUMO of the n-type semiconductor material can be appropriately set within a range in which the (solidified) film formed using the ink composition exhibits a predetermined function such as a photoelectric conversion function or a photodetection function.

(1) p-Type Semiconductor Material

In the present embodiment, the p-type semiconductor material may be a low-molecular-weight compound or a polymer compound.

Examples of the p-type semiconductor material that is a low-molecular-weight compound include phthalocyanine, metal phthalocyanine, porphyrin, metal porphyrin, oligothiophene, tetracene, pentacene, and rubrene.

The p-type semiconductor material that can be contained in the ink composition of the present embodiment is preferably a π-conjugated polymer compound (also referred to as a D-A type conjugated polymer compound) having a donor-acceptor structure containing a donor constitutional unit (also referred to as a D constitutional unit) and an acceptor constitutional unit (also referred to as an A constitutional unit).

Here, the donor constitutional unit is a constitutional unit in which n electrons are excessive, and the acceptor constitutional unit is a constitutional unit in which n electrons are deficient.

In the present embodiment, the constitutional unit capable of constituting the p-type semiconductor material includes a constitutional unit in which a donor constitutional unit and an acceptor constitutional unit are directly bonded, and further includes a constitutional unit in which a donor constitutional unit and an acceptor constitutional unit are bonded via an arbitrary suitable spacer (group or constitutional unit).

Examples of the p-type semiconductor material that is a polymer compound include polyvinylcarbazole and a derivative thereof, polysilane and a derivative thereof, a polysiloxane derivative having an aromatic amine structure in a side chain or a main chain, polyaniline and a derivative thereof, polythiophene and a derivative thereof, polypyrrole and a derivative thereof, polyphenylene vinylene and a derivative thereof, polythienylene vinylene and a derivative thereof, and polyfluorene and a derivative thereof.

The p-type semiconductor material is preferably a polymer compound containing a constitutional unit represented by the following Formula (I) and/or a constitutional unit represented by the following Formula (II) from the viewpoint of further improving stability of the ink composition and further improving external quantum efficiency of the photoelectric conversion element.

[Chem. 6]

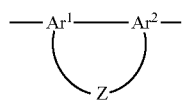

(I)

In Formula (I), $Ar^1$ and $Ar^2$ each independently represent a trivalent aromatic heterocyclic group which may have a substituent, and Z represents a group represented by any one of the following Formulas (Z-1) to (Z-7).

[Chem. 7]

(II)

In Formula (II), $Ar^3$ represents a divalent aromatic heterocyclic group.

[Chem. 8]

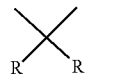

(Z-1)

(Z-2)

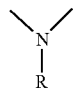

(Z-3)

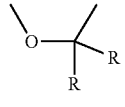

(Z-4)

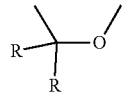

(Z-5)

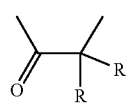

(Z-6)

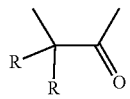

(Z-7)

In Formulas (Z-1) to (Z-7), R represents a hydrogen atom, a halogen atom, an alkyl group which may have a substituent, a cycloalkyl group which may have a substituent, an alkenyl group which may have a substituent, a cycloalkenyl group which may have a substituent, an alkynyl group which may have a substituent, a cycloalkynyl group which may have a substituent, an aryl group which may have a substituent, an alkyloxy group which may have a substituent, a cycloalkyloxy group which may have a substituent, an aryloxy group which may have a substituent, an alkylthio group which may have a substituent, a cycloalkylthio group which may have a substituent, an arylthio group which may have a substituent, a monovalent heterocyclic group which may have a substituent, a substituted amino group which may have a substituent, an imine residue which may have a substituent, an amide group which may have a substituent, an acid imide group which may have a substituent, a substituted oxycarbonyl group which may have a substituent, a cyano group, a nitro group, a group represented by $-C(=O)-R^c$, or a group represented by $-SO_2-R^d$, $R^c$ and $R^d$ each independently represent a hydrogen atom, an alkyl group which may have a substituent, a cycloalkyl group which may have a substituent, an aryl group which may have a substituent, an alkyloxy group which may have a substituent, a cycloalkyloxy group which may have a substituent, an aryloxy group which may have a substituent, or a monovalent heterocyclic group which may have a substituent, and in Formulas (Z-1) to (Z-7), when the number of R's is two, the two R's may be the same as or different from each other.

R in Formulas (Z-1) to (Z-7) is preferably a hydrogen atom, an alkyl group, or an aryl group, more preferably a hydrogen atom or an alkyl group, still more preferably a hydrogen atom or an alkyl group having 1 to 40 carbon atoms, further still more preferably a hydrogen atom or an alkyl group having 1 to 30 carbon atoms, and particularly preferably a hydrogen atom or an alkyl group having 1 to 20 carbon atoms. These groups may have a substituent. In a case where a plurality of R's are present, the plurality of R's may be the same as or different from each other.

The constitutional unit represented by Formula (I) is preferably a constitutional unit represented by the following Formula (I-1).

[Chem. 9]

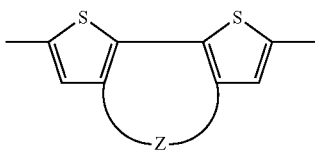

(I-1)

In Formula (I-1), Z has the same meaning as described above.

Examples of the constitutional unit represented by Formula (I-1) include constitutional units represented by the following Formulas (501) to (505).

[Chem. 10]

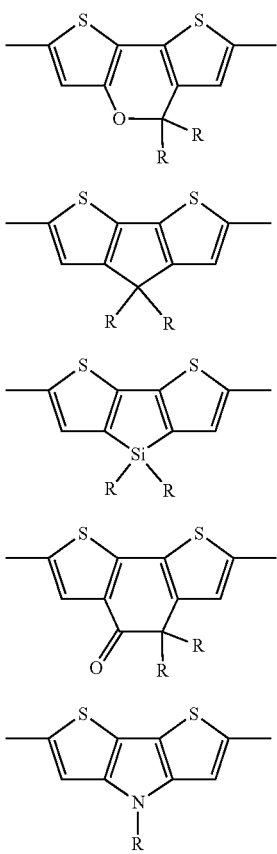

In Formulas (501) to (505), R has the same meaning as described above. In a case where two R's are present, the two R's may be the same as or different from each other.

In Formula (II), the number of carbon atoms of the divalent aromatic heterocyclic group represented by $Ar^3$ is usually 2 to 60, preferably 4 to 60, and more preferably 4 to 20. The divalent aromatic heterocyclic group represented by $Ar^3$ may have a substituent. Examples of the substituent which may be included in the divalent aromatic heterocyclic group represented by $Ar^3$ include a halogen atom, an alkyl group, an aryl group, an alkoxy group, an aryloxy group, an alkylthio group, an arylthio group, a monovalent heterocyclic group, a substituted amino group, an acyl group, an imine residue, an amide group, an acid imide group, a substituted oxycarbonyl group, an alkenyl group, an alkynyl group, a cyano group, and a nitro group.

Examples of the divalent aromatic heterocyclic group represented by $Ar^3$ include groups represented by the following Formulas (101) to (190).

[Chem. 11]

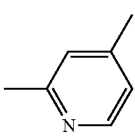

(101)

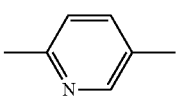

(102)

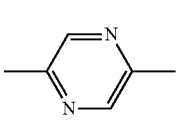

(103)

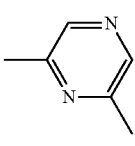

(104)

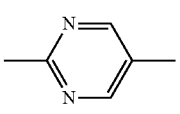

(105)

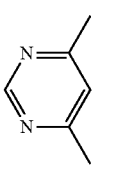

(106)

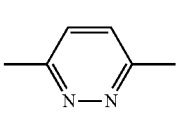

(107)

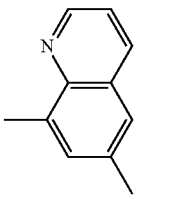

(108)

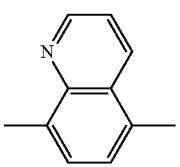

(109)

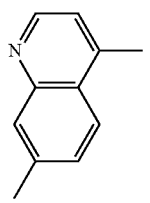
(110)
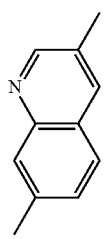
(111)
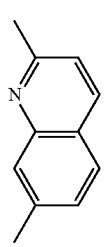
(112)
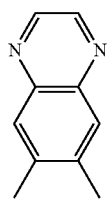
(113)
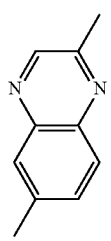
(114)
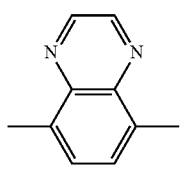
(115)
[Chem. 12]
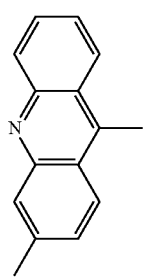
(116)
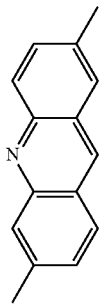
(117)
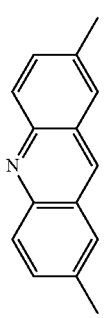
(118)
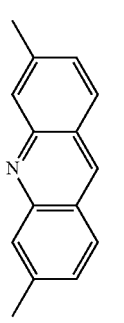
(119)
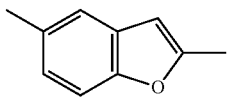
(120)
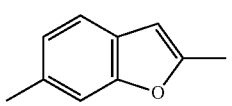
(121)
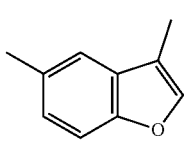
(122)
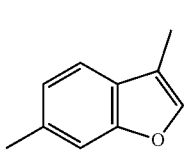
(123)
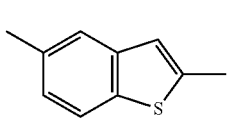
(124)

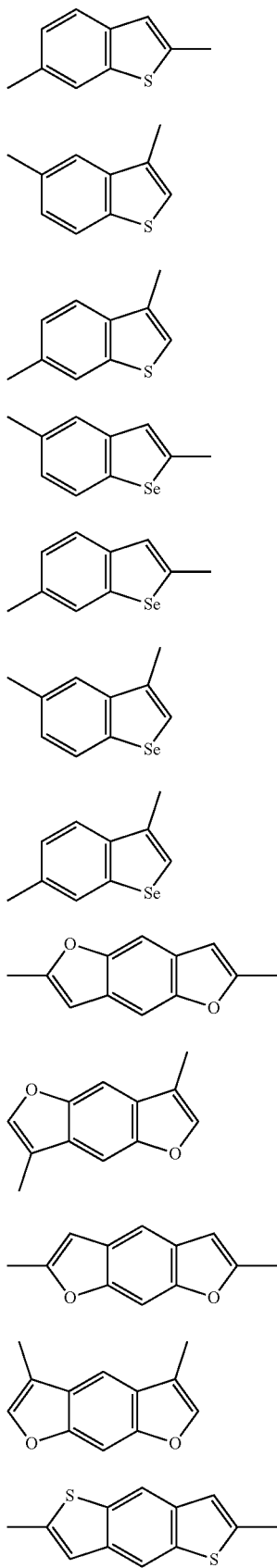

-continued
(146) 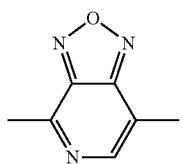
(147) 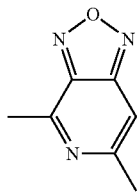
(148) 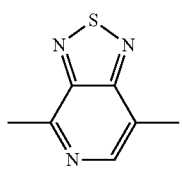
(149) 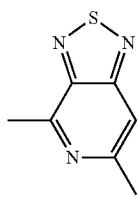
(150) 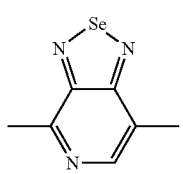
(151) 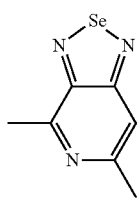
(152) 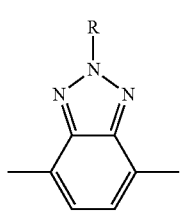
(153) 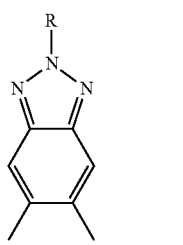
-continued
(154) 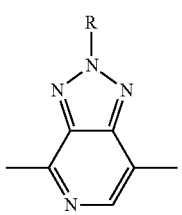
(155) 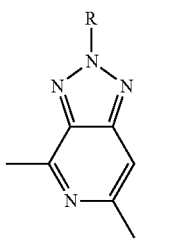
(156) 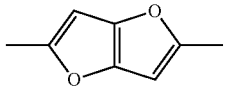
(157) 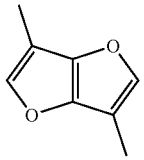
(158) 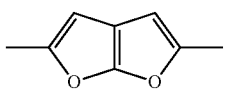
(159) 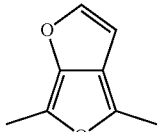
(160) 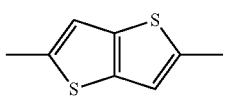
(161) 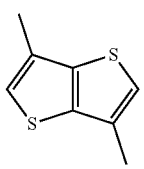
(162) 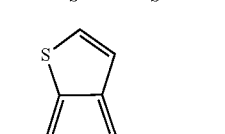
(163) 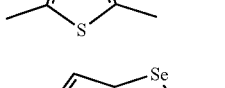
(164) 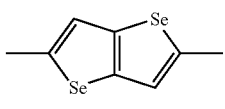

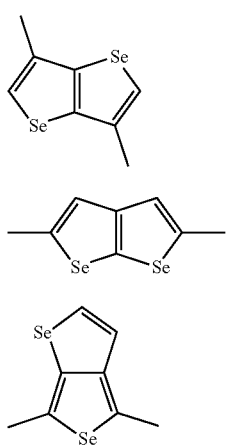
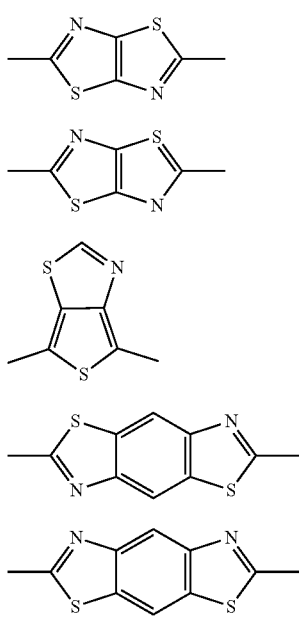
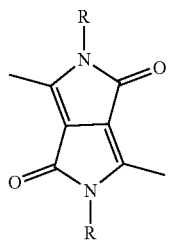
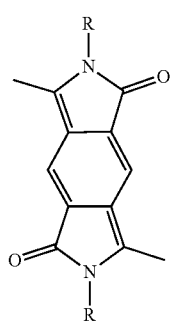
[Chem. 14]
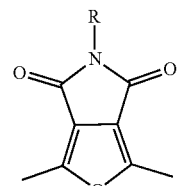
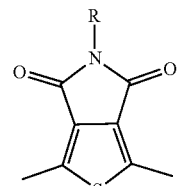
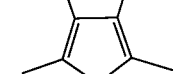
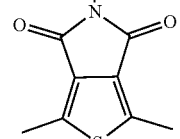
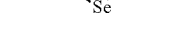
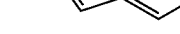
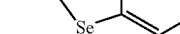
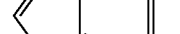
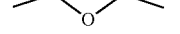
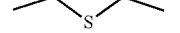

-continued (186) 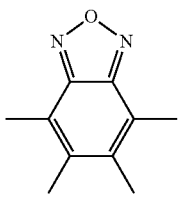

(187) 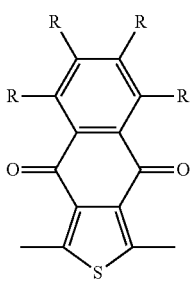

(188) 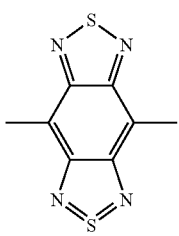

(189) 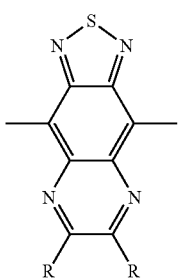

(190) 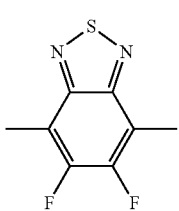

In Formulas (101) to (190), R has the same meaning as described above. In a case where a plurality of R's are present, the plurality of R's may be the same as or different from each other.

The constitutional unit represented by Formula (II) is preferably a constitutional unit represented by any one of the following Formulas (II-1) to (II-6).

[Chem. 15]

(II-1) 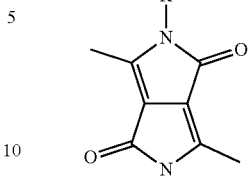

(II-2) 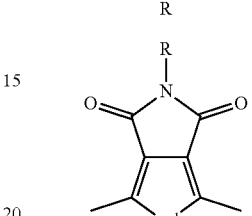

(II-3) 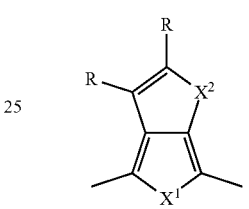

(II-4) 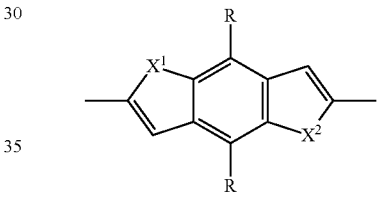

(II-5) 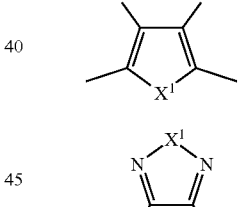

(II-6) 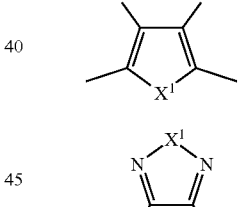

In Formulas (II-1) to (II-6), $X^1$ and $X^2$ each independently represent an oxygen atom or a sulfur atom, and R has the same meaning as described above. In a case where a plurality of R's are present, the plurality of R's may be the same as or different from each other.

Both $X^1$ and $X^2$ in Formulas (II-1) to (II-6) are preferably sulfur atoms from the viewpoint of availability of a raw material compound.

The polymer compound that is a p-type semiconductor material may contain two or more constitutional units of Formula (I) or two or more constitutional units of Formula (II).

The polymer compound that is a p-type semiconductor material may contain a constitutional unit represented by the following Formula (III) from the viewpoint of improving solubility in the solvent.

[Chem. 16]

(III)

In Formula (III), Ar$^4$ represents an arylene group.

The arylene group represented by Ar$^4$ means a remaining atomic group obtained by removing two hydrogen atoms from an aromatic hydrocarbon which may have a substituent. The aromatic hydrocarbon also includes a compound having a fused ring, and a compound in which two or more selected from the group consisting of an independent benzene ring and a fused ring are bonded directly or via a divalent group such as vinylene.

Examples of the substituent which may be included in the aromatic hydrocarbon include the same substituents as those in the above examples described as the substituent which may be included in the heterocyclic compound.

In the arylene group, the number of carbon atoms in a moiety excluding the substituent is usually 6 to 60 and preferably 6 to 20. The number of carbon atoms of the arylene group having the substituent is usually 6 to 100.

Examples of the arylene group include phenylene groups (for example, the following Formulas 1 to 3), naphthalene-diyl groups (for example, the following Formulas 4 to 13), anthracene-diyl groups (for example, the following Formulas 14 to 19), biphenyl-diyl groups (for example, the following Formulas 20 to 25), terphenyl-diyl groups (for example, the following Formulas 26 to 28), fused ring compound groups (for example, the following Formulas 29 to 35), fluorene-diyl groups (for example, the following Formulas 36 to 38), and benzofluorene-diyl groups (for example, the following Formulas 39 to 46).

[Chem. 17]

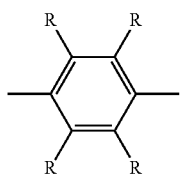
1

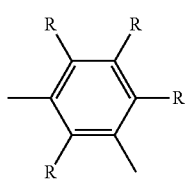
2

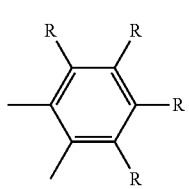
3

[Chem. 18]

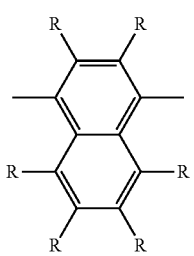
4

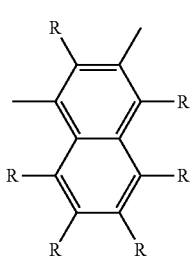
5

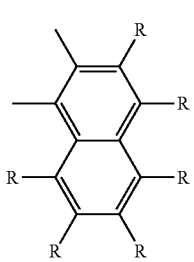
6

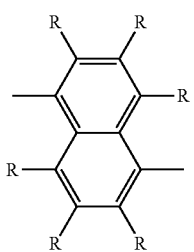
7

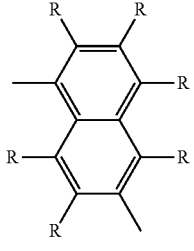
8

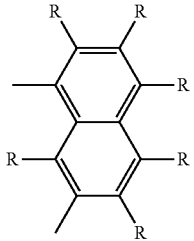
9

-continued

-continued
10
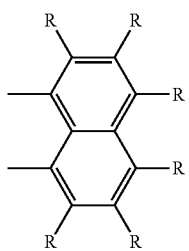
11
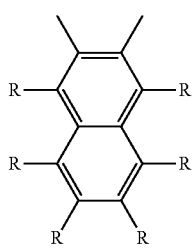
12
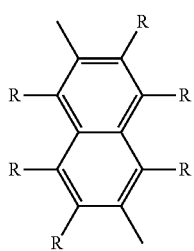
13
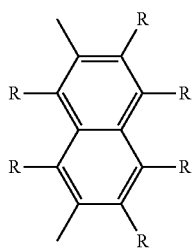
[Chem. 19]
14
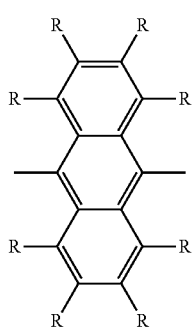
-continued
10
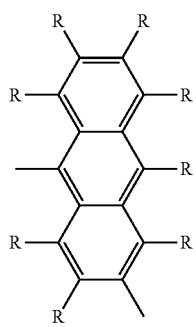
15
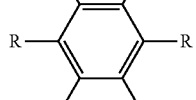
16
17
18
19

[Chem. 20]
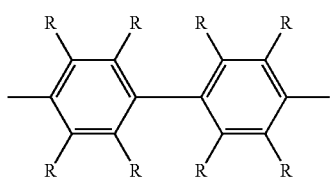 20
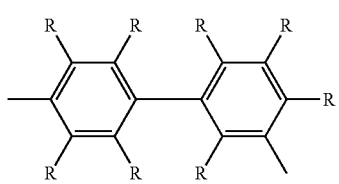 21
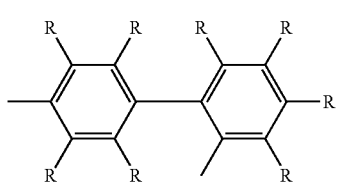 22
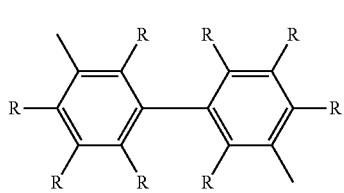 23
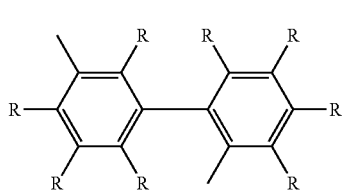 24
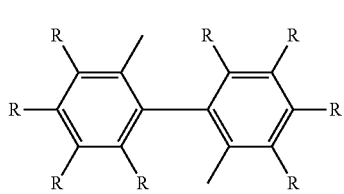 25
[Chem. 21]
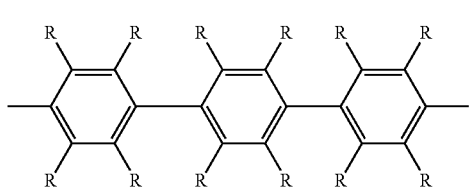 26
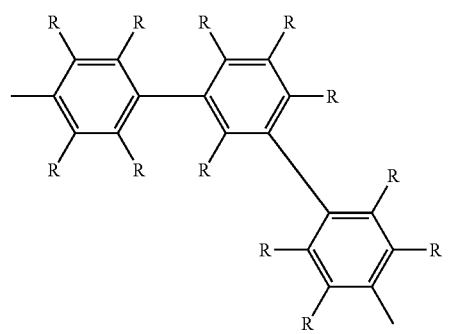 27
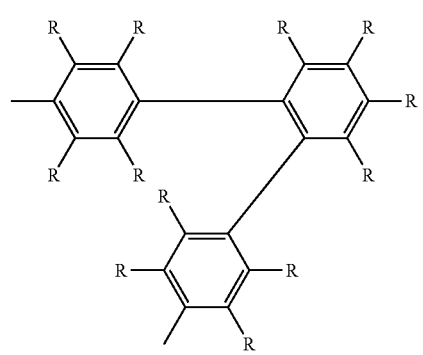 28
[Chem. 22]
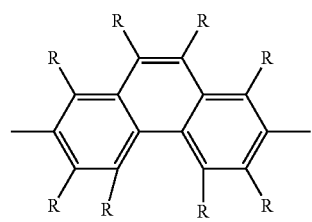 29
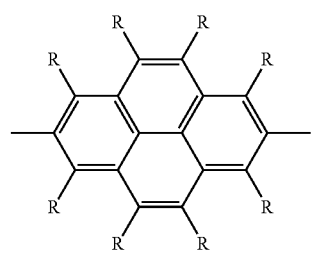 30
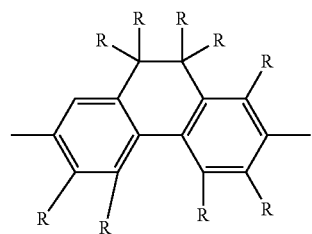 31

33
-continued
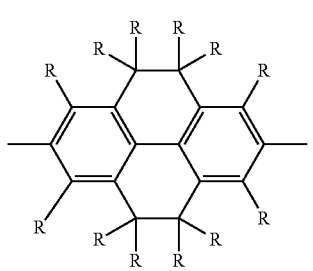
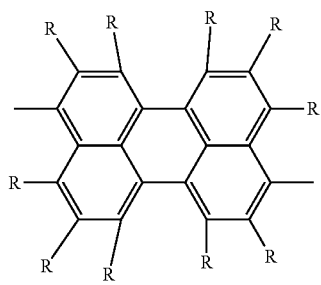
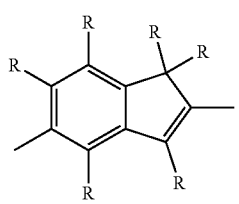
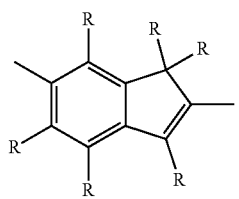
[Chem. 23]
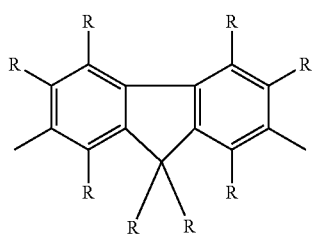
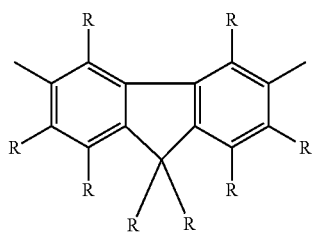
34
-continued
32
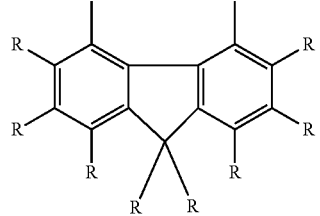
[Chem. 24]
33
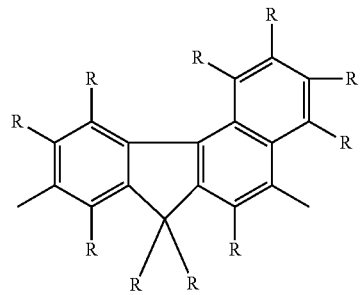
34
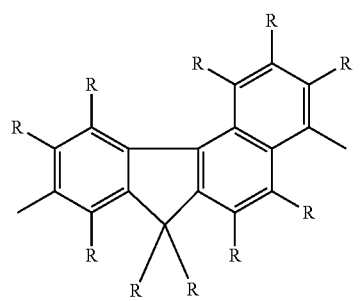
35
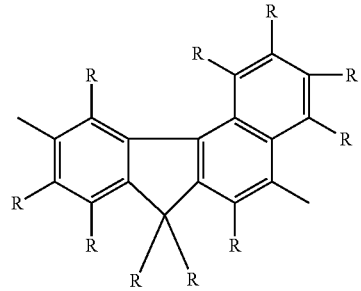
36
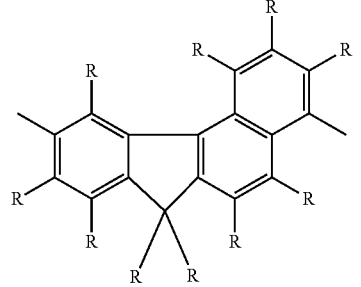
37
38
39
40
41
42

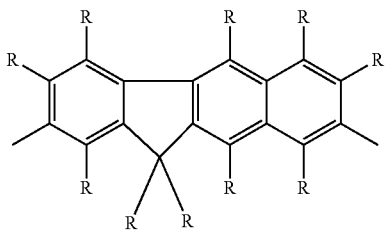

43

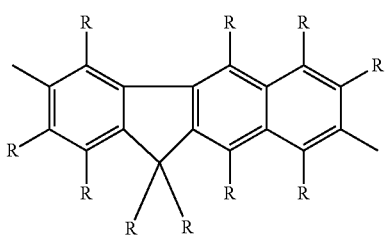

44

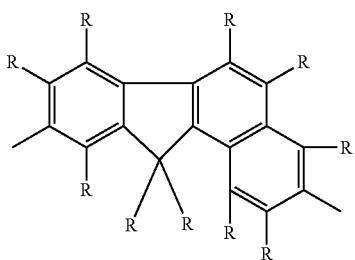

45

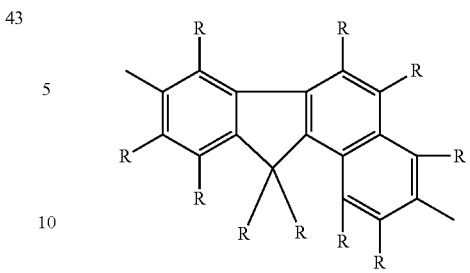

46

In Formulas 1 to 46, R has the same meaning as described above. In a case where the number of R's is plural, the plurality of R's may be the same as or different from each other.

In a case where the polymer compound as a p-type semiconductor material contains a constitutional unit represented by Formula (I) and/or a constitutional unit represented by Formula (II), when the amount of all the constitutional units contained in the polymer compound is 100 mol %, the total amount of the constitutional unit represented by Formula (I) and/or the constitutional unit represented by Formula (II) is usually 20 to 100 mol %, and preferably 40 to 100 mol % and still more preferably 50 to 100 mol % because charge transportability as the p-type semiconductor material is improved.

Preferred specific examples of the polymer compound that is a p-type semiconductor material include polymer compounds represented by the following Formulas P-1 to P-10.

[Chem. 25]

P-1

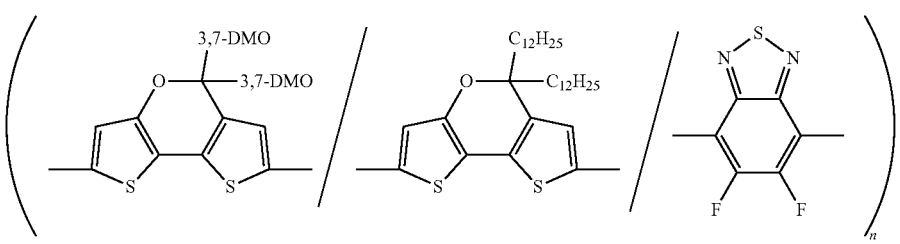

(25:25:50; mol %)

3,7-DMO = 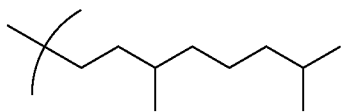

-continued
P-2
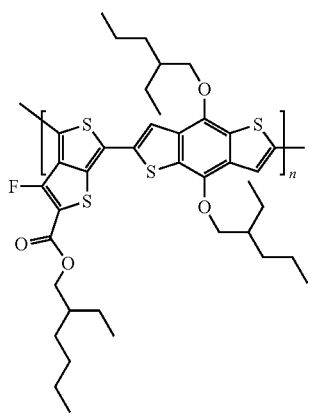
P-3
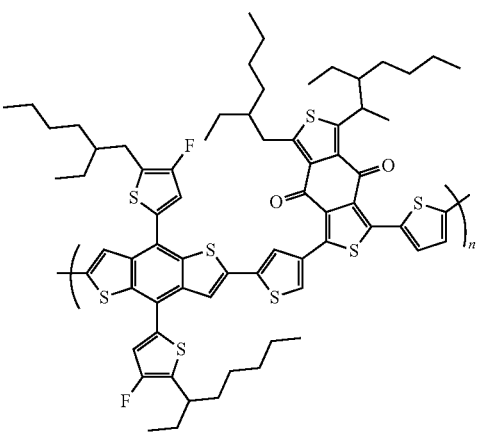
[Chem. 26]
P-4
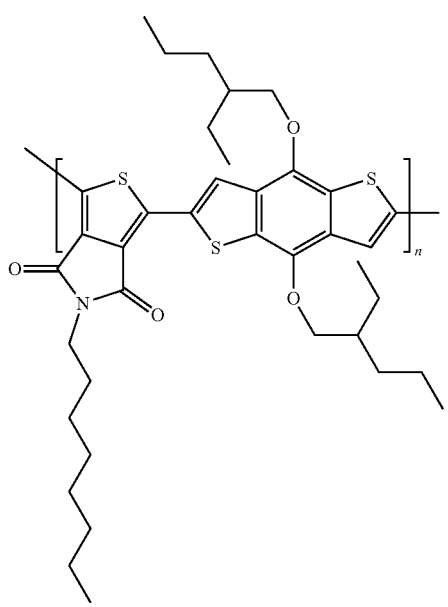
P-5
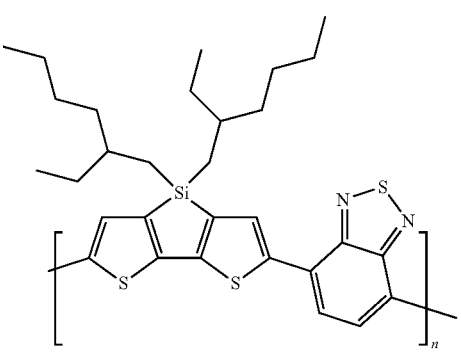
P-6
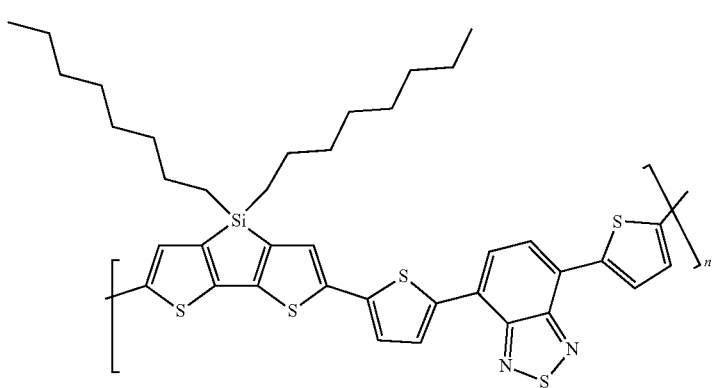

[Chem. 27]
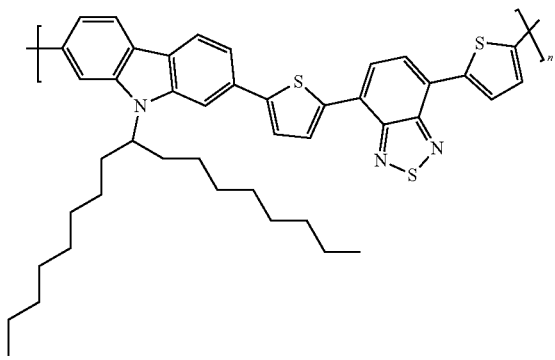
P-7
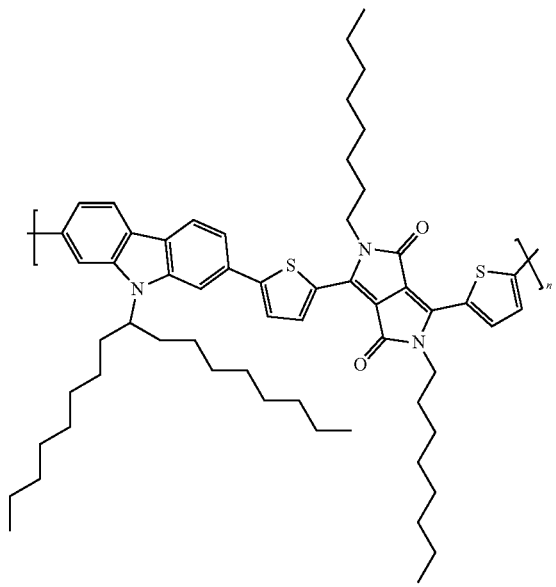
P-8
[Chem. 28]
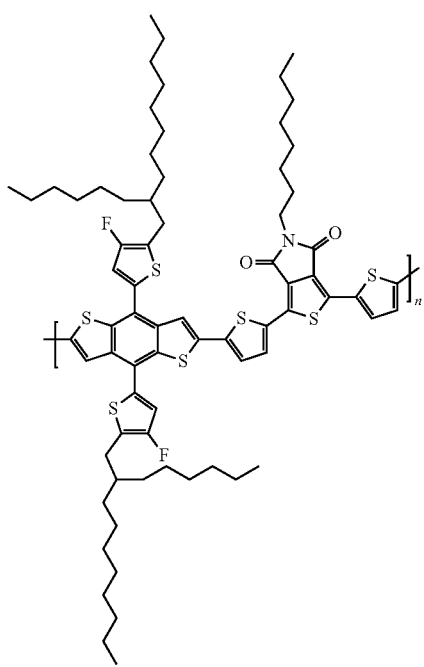
P-9

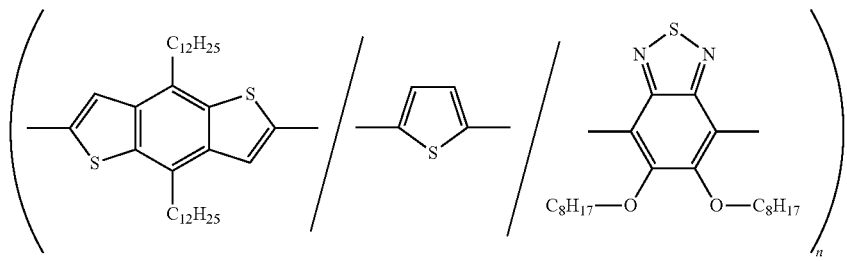

(25:25:50; mol %)

A weight average molecular weight in terms of polystyrene of the polymer compound as a p-type semiconductor material is usually $1\times10^3$ to $1\times10^8$, and is preferably $1\times10^3$ to $1\times10^6$ from the viewpoint of improving solubility in the solvent.

The ink composition of the present embodiment may contain one compound (polymer compound) as a p-type semiconductor material, or may contain two or more compounds in any combination.

(2) n-Type Semiconductor Material

The n-type semiconductor material that can be contained in the ink composition of the present embodiment may be a low-molecular-weight compound or a polymer compound.

Examples of the n-type semiconductor material (electron-accepting compound) that is a low-molecular-weight compound include an oxadiazole derivative, anthraquinodimethane and a derivative thereof, benzoquinone and a derivative thereof, naphthoquinone and a derivative thereof, anthraquinone and a derivative thereof, tetracyanoanthraquinodimethane and a derivative thereof, a fluorenone derivative, a diphenyldicyanoethylene and a derivative thereof, a diphenoquinone derivative, a metal complex of 8-hydroxyquinoline and a derivative thereof, fullerene such as $C_{60}$ fullerene and a fullerene derivative that is a derivative thereof (hereinafter, may be referred to as a fullerene compound), and a phenanthrene derivative such as bathocuproine.

Examples of the n-type semiconductor material that is a polymer compound include polyvinylcarbazole and a derivative thereof, polysilane and a derivative thereof, a polysiloxane derivative having an aromatic amine structure in a side chain or a main chain, polyaniline and a derivative thereof, polythiophene and a derivative thereof, polypyrrole and a derivative thereof, polyphenylene vinylene and a derivative thereof, polythienylene vinylene and a derivative thereof, polyquinoline and a derivative thereof, polyquinoxaline and a derivative thereof, and polyfluorene and a derivative thereof.

The n-type semiconductor material is preferably one or more selected from fullerene and a fullerene derivative, and more preferably a fullerene derivative.

Examples of the fullerene include $C_{60}$ fullerene, $C_{70}$ fullerene, $C_{76}$ fullerene, $C_{78}$ fullerene, and $C_{84}$ fullerene. Examples of the fullerene derivative include derivatives of these fullerenes. The fullerene derivative means a compound in which at least a part of fullerene is modified.

Examples of the fullerene derivative include compounds represented by the following Formulas.

[Chem. 29]

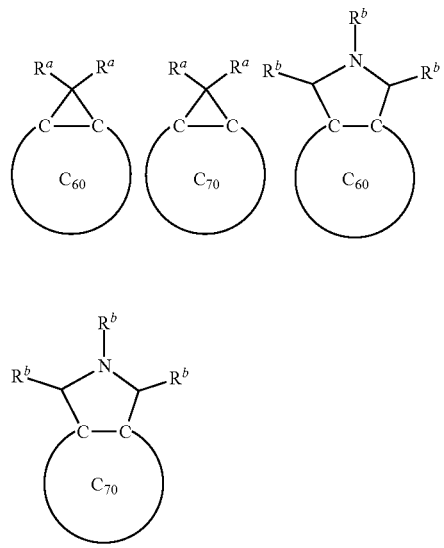

In the Formula, $R^a$ represents an alkyl group, an aryl group, a monovalent heterocyclic group, or a group having an ester structure. The plurality of $R^a$'s may be the same as or different from each other.

$R^b$ represents an alkyl group or an aryl group. The plurality of $R^b$'s may be the same as or different from each other.

Examples of the group represented by $R^a$ and having an ester structure include groups represented by the following formulas.

[Chem. 30]

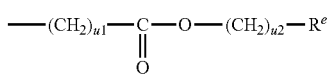

In the formula, u1 represents an integer of 1 to 6. u2 represents an integer of 0 to 6. Re represents an alkyl group, an aryl group, or a monovalent heterocyclic group.

Examples of the C$_{60}$ fullerene derivative include the following compounds.
[Chem. 31]
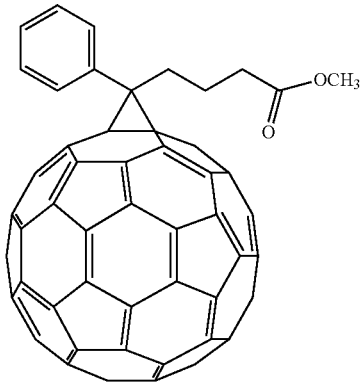
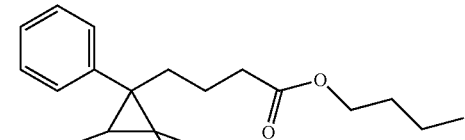
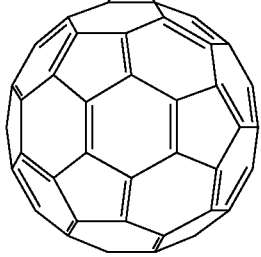
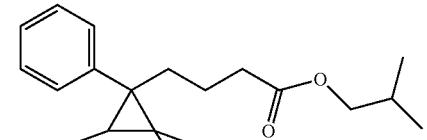
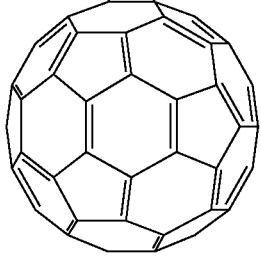
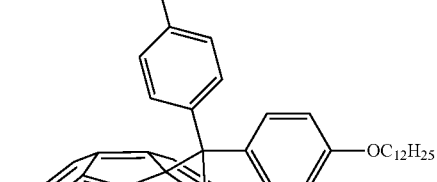
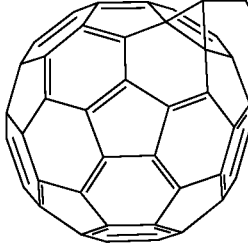
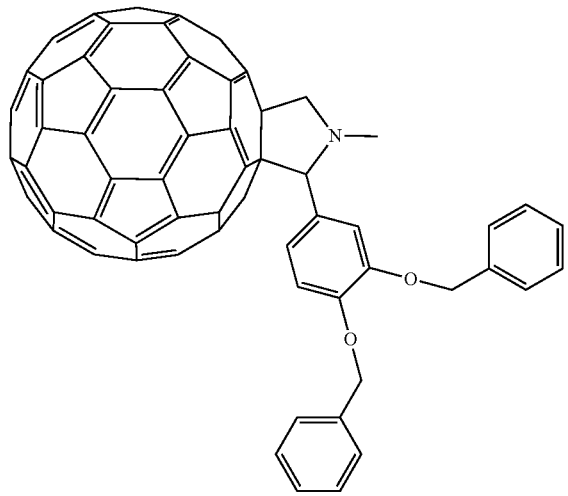
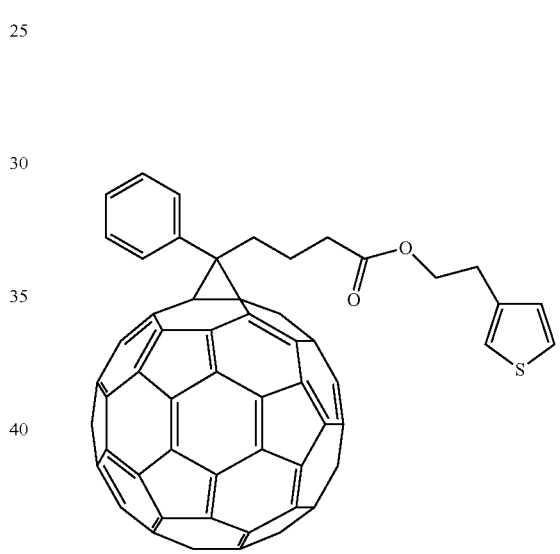
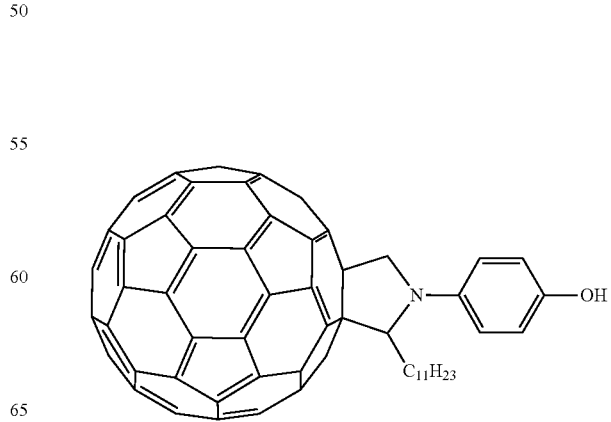

Examples of the C$_{70}$ fullerene derivative include the following compounds.

[Chem. 32]

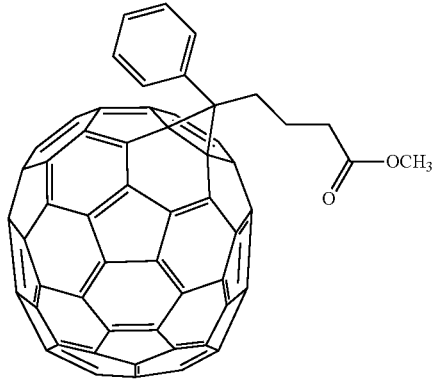

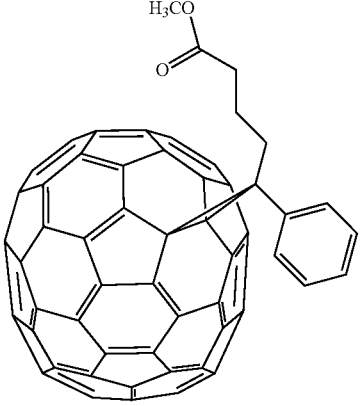

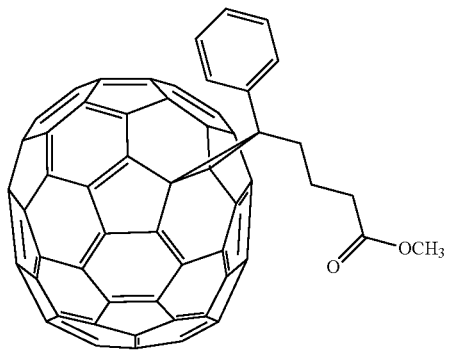

Specific examples of the fullerene derivative include
[6,6]-phenyl-C61 butyric acid methyl ester (C60PCBM),
[6,6]-phenyl-C71 butyric acid methyl ester (C70PCBM),
[6,6]-phenyl-C85 butyric acid methyl ester (C84PCBM), and
[6,6]-thienyl-C61 butyric acid methyl ester.

A compound that is not a fullerene compound is contained in the n-type semiconductor material that can be contained in the ink composition of the present embodiment. In the present specification, the n-type semiconductor material that is not a fullerene compound is referred to as a "non-fullerene compound". As the non-fullerene compound, various compounds are known, and any suitable conventionally known non-fullerene compound can be used as the n-type semiconductor material in the present embodiment.

The ink composition according to the present embodiment may contain one or a plurality of compounds as the n-type semiconductor material.

In the present embodiment, the non-fullerene compound that is an n-type semiconductor material is preferably a compound having a perylene tetracarboxylic acid diimide structure. Examples of the compound that is a non-fullerene compound and has a perylene tetracarboxylic acid diimide structure include compounds represented by the following formulas.

[Chem. 33]

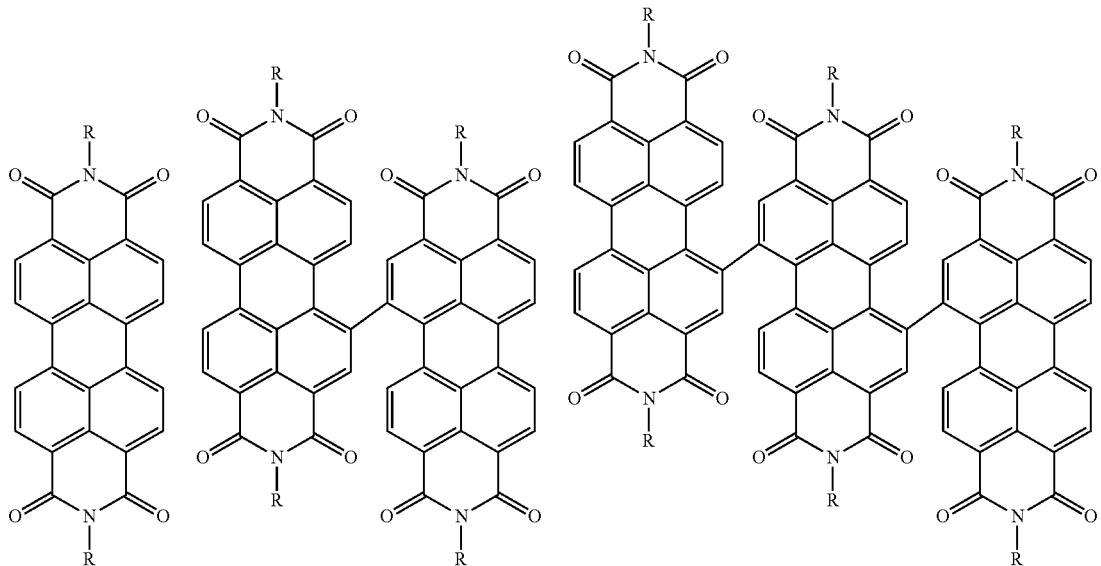

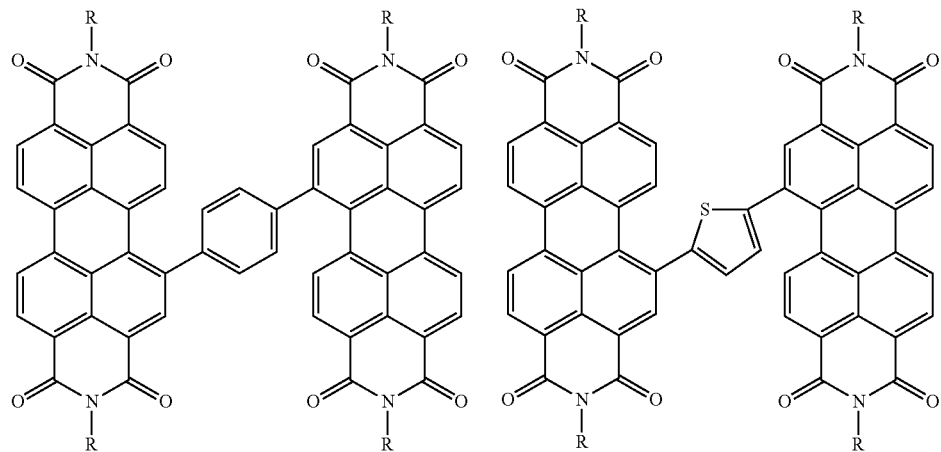
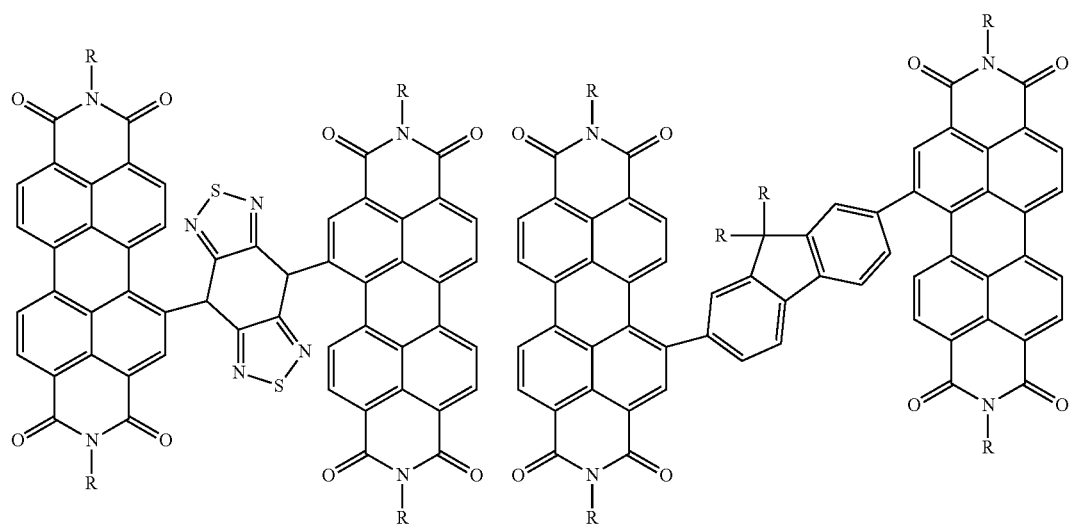
[Chem. 34]
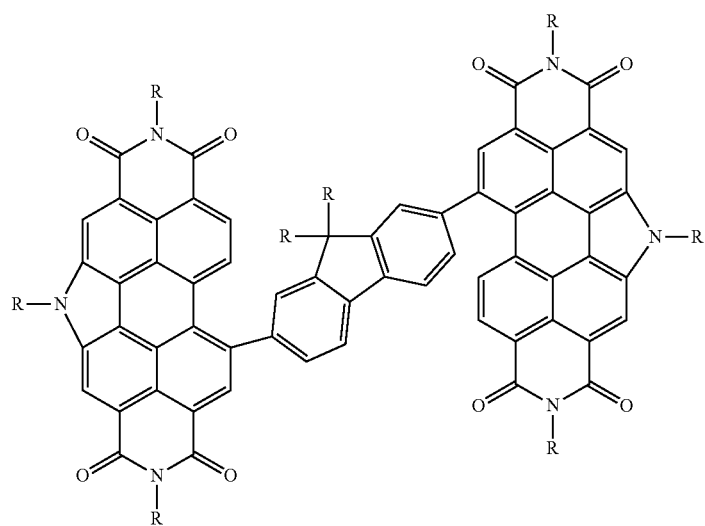

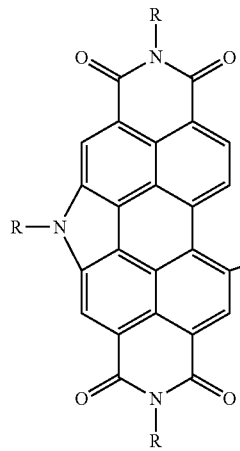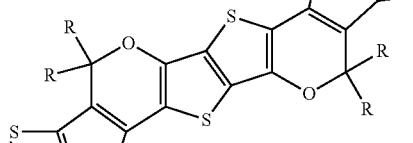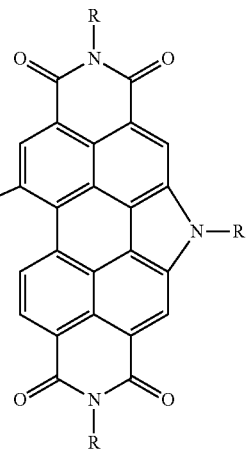
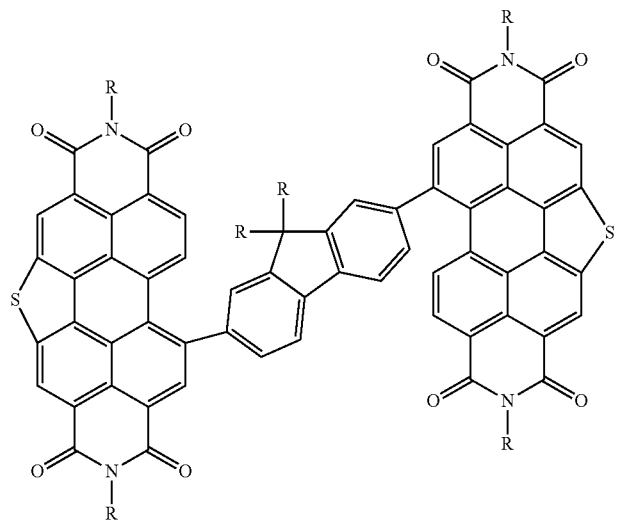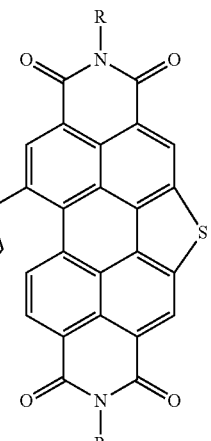
[Chem. 35]
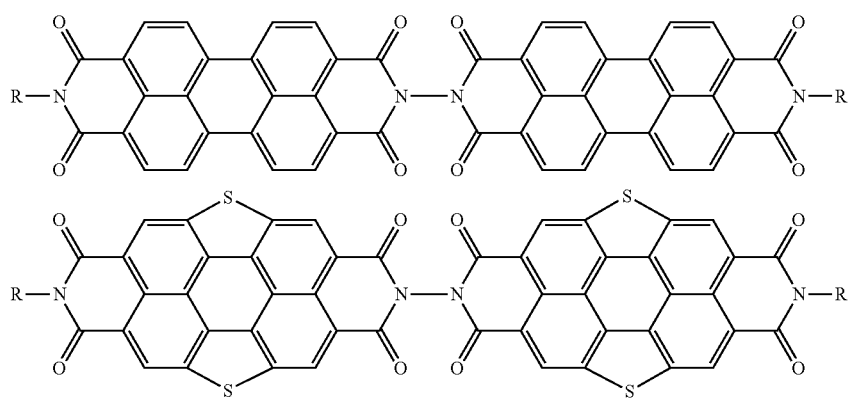

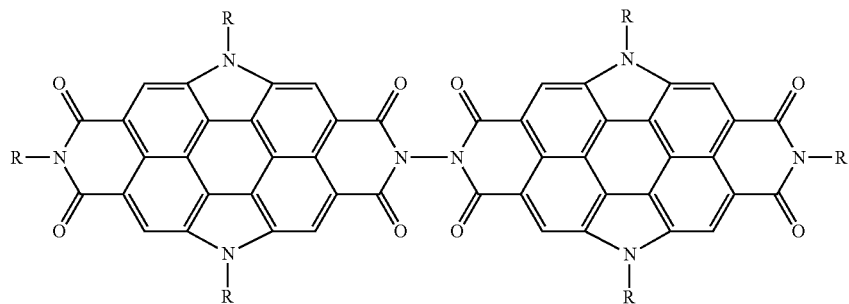
[Chem. 36]
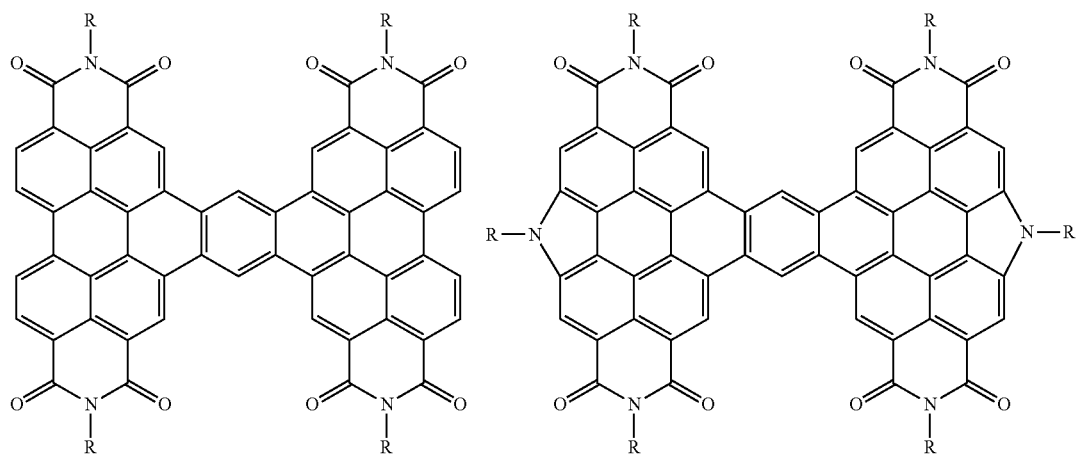
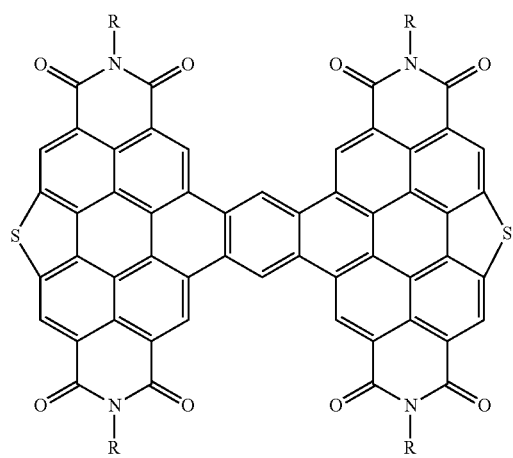

In the formula, R is as defined above. The plurality of R's may be the same as or different from each other.

In the present embodiment, the n-type semiconductor material preferably contains a compound represented by the following Formula (V). The compound represented by the following Formula (V) is a non-fullerene compound having a perylene tetracarboxylic acid diimide structure.

[Chem. 37]

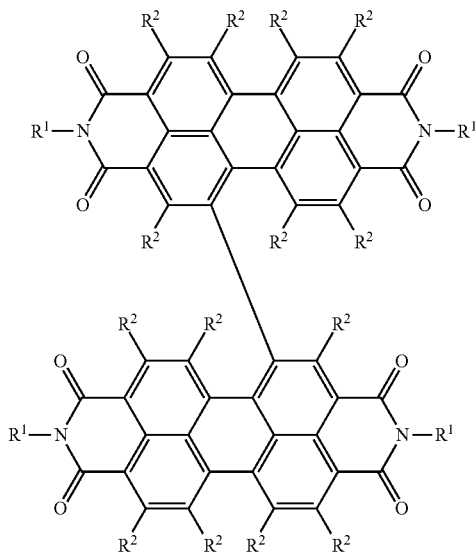

(V)

In Formula (V), $R^1$ represents a hydrogen atom, a halogen atom, an alkyl group which may have a substituent, a cycloalkyl group which may have a substituent, an alkyloxy group which may have a substituent, a cycloalkyloxy group which may have a substituent, an aryl group which may have a substituent, or a monovalent aromatic heterocyclic group which may have a substituent. The plurality of $R^1$'s may be the same as or different from each other.

Preferably, the plurality of $R^1$'s are each independently an alkyl group which may have a substituent.

$R^2$ represents a hydrogen atom, a halogen atom, an alkyl group which may have a substituent, a cycloalkyl group which may have a substituent, an alkyloxy group which may have a substituent, a cycloalkyloxy group which may have a substituent, an aryl group which may have a substituent, or a monovalent aromatic heterocyclic group which may have a substituent. The plurality of $R^2$'s may be the same as or different from each other.

Preferred examples of the compound represented by Formula (V) include a compound represented by the following formula.

[Chem. 38]

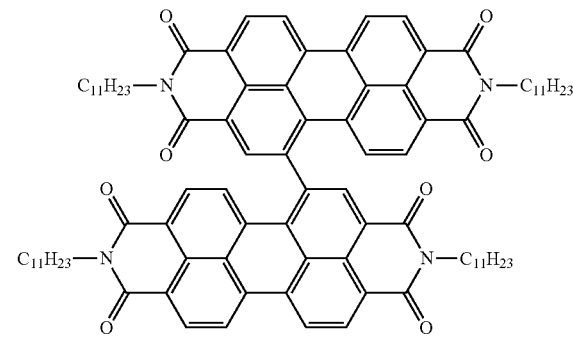

In the present embodiment, the n-type semiconductor material preferably contains a compound represented by the following Formula (VI).

$$A^1\text{-}B^{10}\text{-}A^2 \quad (VI)$$

In the Formula (VI),
$A^1$ and $A^2$ each independently represent an electron-withdrawing group, and $B^{10}$ represents a group having a π-conjugated system.

Examples of the electron-withdrawing group represented by $A^1$ or $A^2$ include a group represented by $-CH=C(-CN)_2$ and groups represented by the following Formulas (a-1) to (a-9).

[Chem. 39]

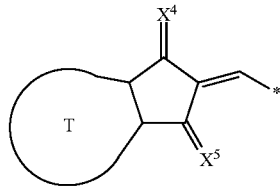

(a-1)

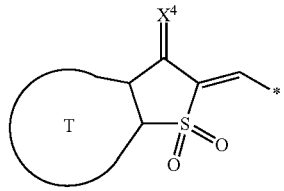

(a-2)

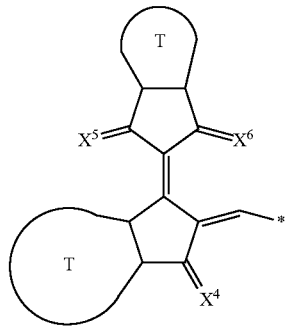

(a-3)

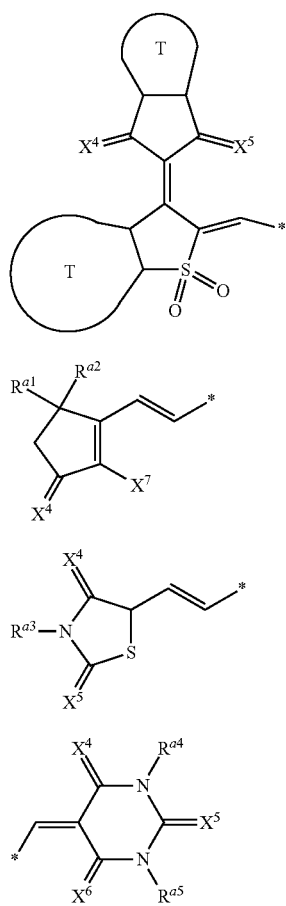

(a-4)

(a-5)

(a-6)

(a-7)

In Formulas (a-1) to (a-7),

T represents a carbocyclic ring which may have a substituent or a heterocyclic ring which may have a substituent. Each of the carbocyclic ring and the heterocyclic ring may be a single ring or a fused ring. In a case where these rings have a plurality of substituents, the plurality of substituents may be the same as or different from each other.

Examples of the carbocyclic ring which is represented by T and may have a substituent include an aromatic carbocyclic ring, and an aromatic carbocyclic ring is preferable. Specific examples of the carbocyclic ring which is represented by T and may have a substituent include a benzene ring, a naphthalene ring, an anthracene ring, a tetracene ring, a pentacene ring, a pyrene ring, and a phenanthrene ring, a benzene ring, a naphthalene ring, and a phenanthrene ring are preferable, a benzene ring and a naphthalene ring are more preferable, and a benzene ring is still more preferable. These rings may have a substituent.

Examples of the heterocyclic ring which is represented by T and may have a substituent include an aromatic heterocyclic ring, and an aromatic heterocyclic ring is preferable. Specific examples of the heterocyclic ring which is represented by T and may have a substituent include a pyridine ring, a pyridazine ring, a pyrimidine ring, a pyrazine ring, a pyrrole ring, a furan ring, a thiophene ring, an imidazole ring, an oxazole ring, a thiazole ring, and a thienothiophene ring, a thiophene ring, a pyridine ring, a pyrazine ring, a thiazole ring, and a thienothiophene ring are preferable, and a thiophene ring is more preferable. These rings may have a substituent.

Examples of the substituent which may be included in the carbocyclic ring or heterocyclic ring represented by T include a halogen atom, an alkyl group, an alkyloxy group, an aryl group, and a monovalent heterocyclic group, and a fluorine atom and/or an alkyl group having 1 to 6 carbon atoms are preferable.

$X^4$, $X^5$, and $X^6$ each independently represent an oxygen atom, a sulfur atom, an alkylidene group, or a group represented by =C(—CN)$_2$, and are preferably an oxygen atom, a sulfur atom, or a group represented by =C(—CN)$_2$.

$X^7$ represents a hydrogen atom, a halogen atom, a cyano group, an alkyl group which may have a substituent, an alkyloxy group which may have a substituent, an aryl group which may have a substituent, or a monovalent heterocyclic group.

$R^{a1}$, $R^{a2}$, $R^{a3}$, $R^{a4}$, and $R^{a5}$ each independently represent a hydrogen atom, an alkyl group which may have a substituent, a halogen atom, an alkyloxy group which may have a substituent, an aryl group which may have a substituent, or a monovalent heterocyclic group, and may be preferably an alkyl group which may have a substituent or an aryl group which may have a substituent.

[Chem. 40]

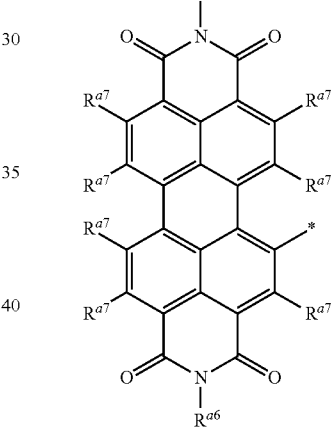

(a-8)

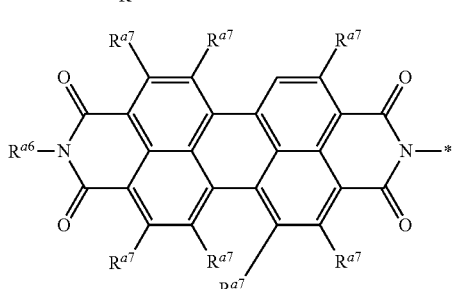

(a-9)

In Formulas (a-8) and (a-9), $R^{a6}$ and $R^{a7}$ each independently represent a hydrogen atom, a halogen atom, an alkyl group which may have a substituent, a cycloalkyl group which may have a substituent, an alkyloxy group which may have a substituent, a cycloalkyloxy group which may have a substituent, a monovalent aromatic carbocyclic group which may have a substituent, or a monovalent aromatic heterocyclic group which may have a substituent, and a plurality of $R^{a6}$'s and a plurality of $R^{a7}$'s may be the same as or different from each other.

The electron-withdrawing group represented by A¹ or A² is preferably a group represented by any one of the following Formulas (a-1-1) to (a-1-4) and (a-6-1) to (a-7-1), and is more preferably a group represented by Formula (a-1-1). Here, a plurality of $R^{10}$'s each independently represent a hydrogen atom or a substituent, and preferably represent a hydrogen atom, a halogen atom, a cyano group, or an alkyl group which may have a substituent. $R^{a3}$, $R^{a4}$, and $R^{a5}$ each independently have the same meaning as described above, and each independently preferably represent an alkyl group which may have a substituent or an aryl group which may have a substituent.

[Chem. 41]

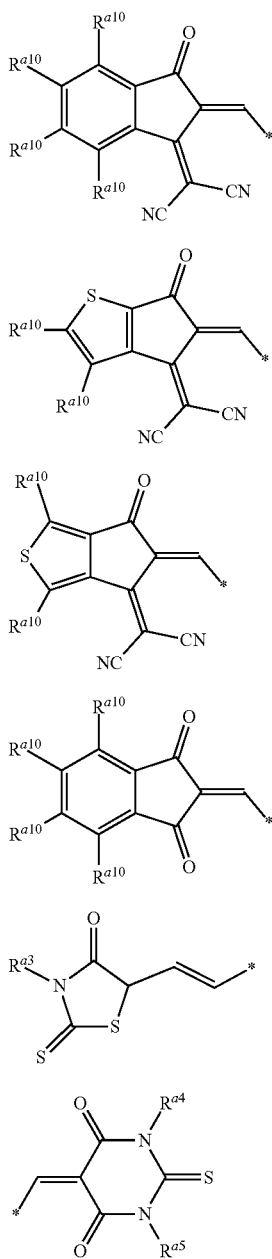

(a-1-1)

(a-1-2)

(a-1-3)

(a-1-4)

(a-6-1)

(a-7-1)

Examples of the group which is represented by $B^{10}$ and has a π-conjugated system include a group represented by —(S¹)$_{n1}$—B¹¹—(S²)$_{n2}$— in a compound represented by Formula (VII) described below.

In the present embodiment, the n-type semiconductor material is preferably a compound represented by the following Formula (VII).

$$A^1\text{-}(S^1)_{n1}\text{—}B^{11}\text{—}(S^2)_{n2}\text{-}A^2 \qquad \text{(VII)}$$

In Formula (VII), A¹ and A² each independently represent an electron-withdrawing group. Examples and preferred examples of A¹ and A² are the same as the examples and preferred examples described in A¹ and A² in Formula (VI).

S¹ and S² each independently represent a divalent carbocyclic group which may have a substituent, a divalent heterocyclic group which may have a substituent, or a group represented by —C($R^{s1}$)=C($R^{s2}$)— (where, $R^{s1}$ and $R^{s2}$ each independently represent a hydrogen atom, a substituent (preferably, a hydrogen atom, a halogen atom, an alkyl group which may have a substituent, or a monovalent heterocyclic group which may have a substituent), or a group represented by —C≡C—).

The divalent carbocyclic group which may have a substituent and the divalent heterocyclic group which may have a substituent may be fused rings, the divalent carbocyclic group and the divalent heterocyclic group being represented by S¹ or S². In a case where the divalent carbocyclic group or the divalent heterocyclic group has a plurality of substituents, the plurality of substituents may be the same as or different from each other.

In Formula (VII), n1 and n2 each independently represent an integer of 0 or more and preferably each independently represent 0 or 1, and both n1 and n2 more preferably represent 0 or 1.

Examples of the divalent carbocyclic group include a divalent aromatic carbocyclic group.

Examples of the divalent heterocyclic group include a divalent aromatic heterocyclic group.

In a case where the divalent aromatic carbocyclic group or the divalent aromatic heterocyclic group is a fused ring, all of the rings constituting the fused ring may be fused rings having aromaticity, or only some rings constituting the fused ring may be fused rings having aromaticity.

Examples of S¹ and S² include a group represented by any one of Formulas (101) to (190) described as the examples of the divalent aromatic heterocyclic group represented by Ar³ described above, and a group in which a hydrogen atom in this group is substituted with a substituent.

S¹ and S² preferably each independently represent a group represented by the following Formula (s-1) or (s-2).

[Chem. 42]

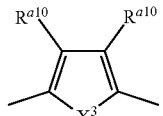

(s-1)

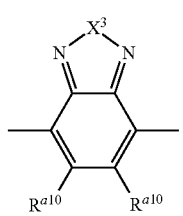

(s-2)

In Formulas (s-1) and (s-2), $X^3$ represents an oxygen atom or a sulfur atom.

$R^{a10}$ is as defined above.

$S^1$ and $S^2$ preferably each independently represent a group represented by Formula (142), Formula (148), or Formula (184), or a group in which a hydrogen atom in this group is substituted with a substituent, and more preferably a group represented by Formula (142) or Formula (184), or a group in which one hydrogen atom in the group represented by Formula (184) is substituted with an alkyloxy group.

$B^{11}$ is a fused ring group having two or more structures selected from the group consisting of a carbocyclic structure and a heterocyclic structure, or a fused ring group that does not have an ortho-peri-fused structure, and represents a fused ring group which may have a substituent.

The fused ring group represented by $B^{11}$ may have a structure in which two or more structures that are the same as each other are fused.

In a case where the fused ring group represented by $B^{11}$ has a plurality of substituents, the plurality of substituents may be the same as or different from each other.

Examples of a carbocyclic structure that constitutes the fused ring group represented by $B^{11}$ include a ring structure represented by the following Formula (Cy1) or (Cy2).

[Chem. 43]

 (Cy1)

 (Cy2)

Examples of a heterocyclic structure that constitutes the fused ring group represented by $B^{11}$ include a ring structure represented by any one of the following Formulas (Cy3) to (Cy10).

[Chem. 44]

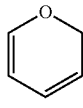 (Cy3)

 (Cy4)

 (Cy5)

 (Cy6)

 (Cy7)

 (Cy8)

 (Cy9)

 (Cy10)

In Formula (VII), $B^{11}$ is preferably a fused ring group having two or more structures selected from the group consisting of structures represented by Formulas (Cy1) to (Cy10), a fused ring group that does not have an ortho-peri-fused structure, or a fused ring group which may have a substituent. $B^{11}$ may have a structure obtained by fusing two or more identical structures among the structures represented by Formulas (Cy1) to (Cy10).

$B^{11}$ is more preferably a fused ring group having two or more structures selected from the group consisting of structures represented by Formulas (Cy1) to (Cy6) and (Cy8), a fused ring group that does not have an ortho-peri-fused structure, or a fused ring group which may have a substituent.

The substituent which may be included in the fused ring group and is represented by $B^{11}$ is preferably an alkyl group which may have a substituent, an aryl group which may have a substituent, an alkyloxy group which may have a substituent, or a monovalent heterocyclic group which may have a substituent. The aryl group which may be included in the fused ring group represented by $B^{11}$ may be substituted with, for example, an alkyl group.

Examples of the fused ring group represented by $B^{11}$ include groups represented by the following Formulas (b-1) to (b-14), and a group in which a hydrogen atom in this group is further substituted with a substituent (preferably, an alkyl group which may have a substituent, an aryl group which may have a substituent, an alkyloxy group which may have a substituent, or a monovalent heterocyclic group which may have a substituent). As the fused ring group represented by $B^{11}$, a group represented by the following Formula (b-2) or (b-3), or a group in which a hydrogen atom in this group is further substituted with a substituent (preferably, an alkyl group which may have a substituent, an aryl group which may have a substituent, an alkyloxy group which may have a substituent, or a monovalent heterocyclic group which may have a substituent) is preferable, and a group represented by the following Formula (b-2) or (b-3) is more preferable.

[Chem. 45]

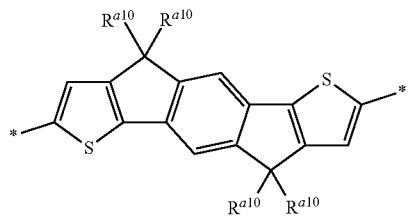 (b-1)

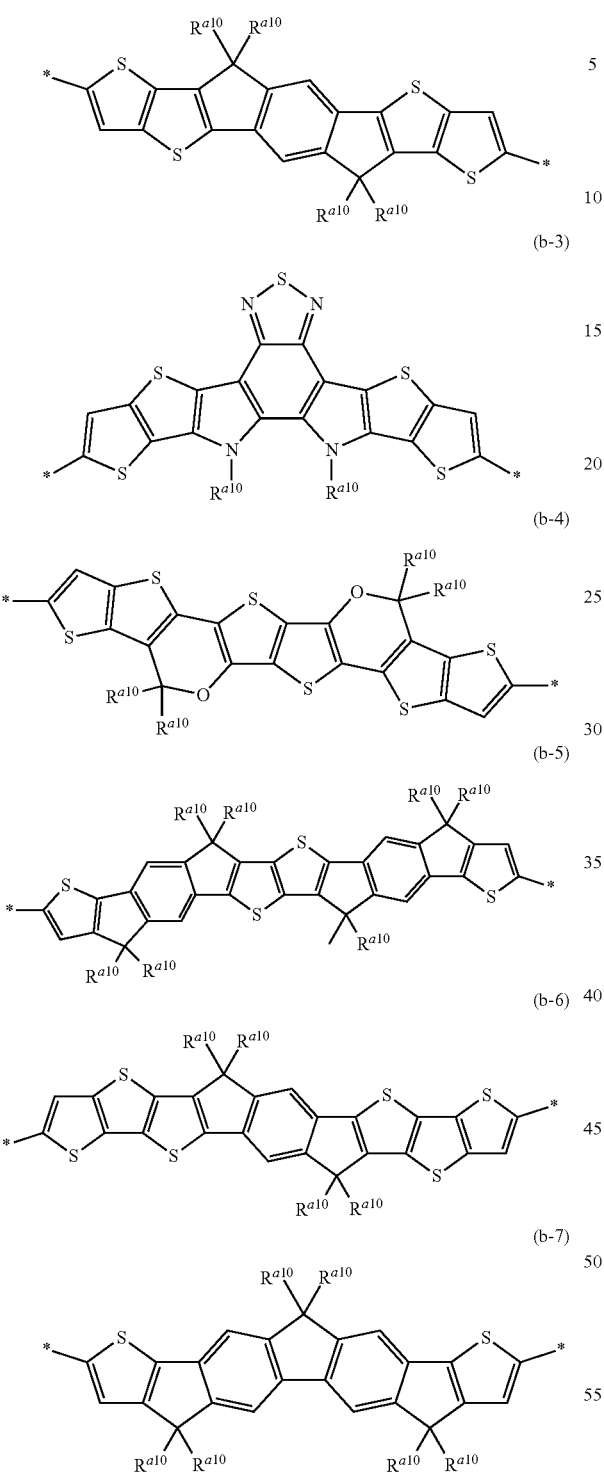
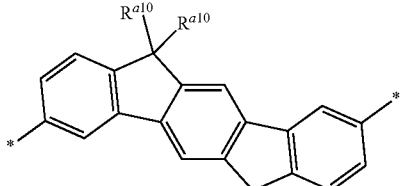
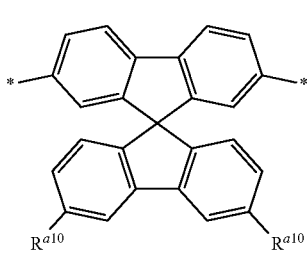
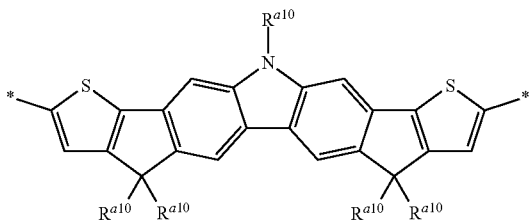
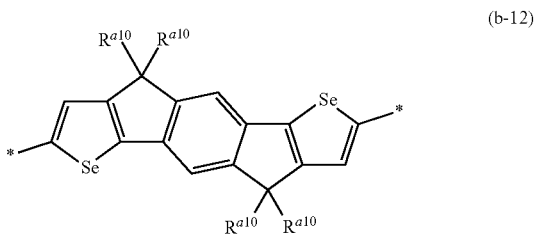
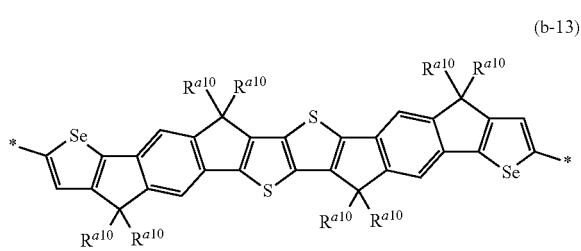
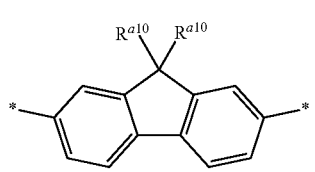
In Formulas (b-1) to (b-14),
$R^{a10}$ is as defined above.
In Formulas (b-1) to (b-14), a plurality of $R^{a10}$'s are preferably each independently an alkyl group which may have a substituent or an aryl group which may have a substituent.
Examples of the compound represented by Formula (VI) or Formula (VII) include a compound represented by the following formula.

[Chem. 47]

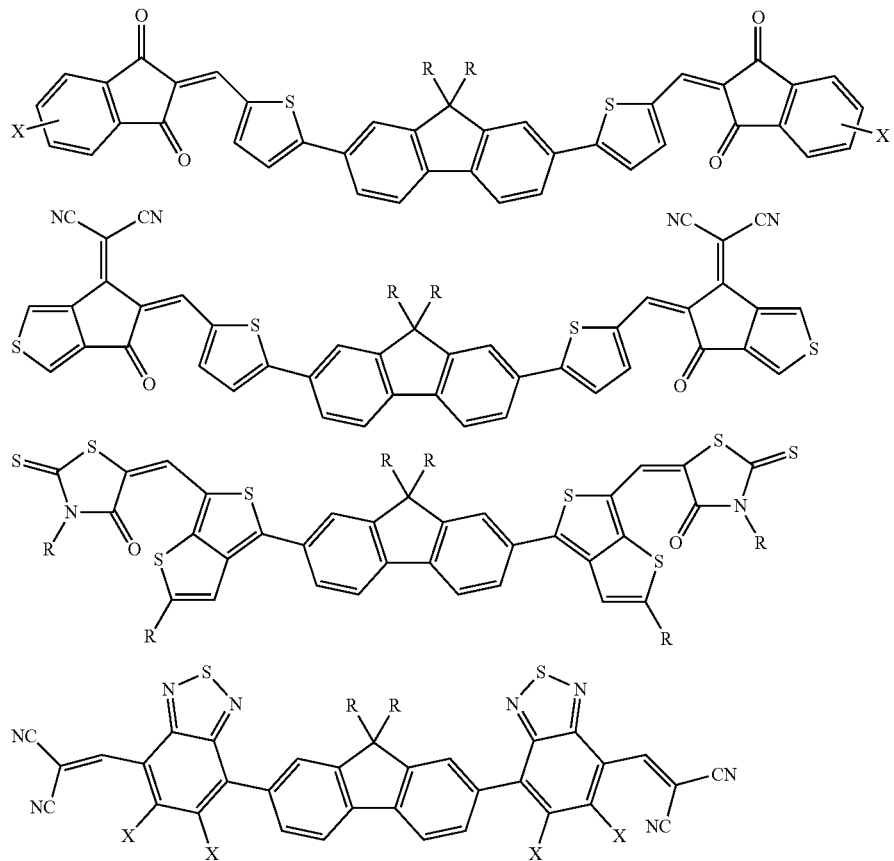

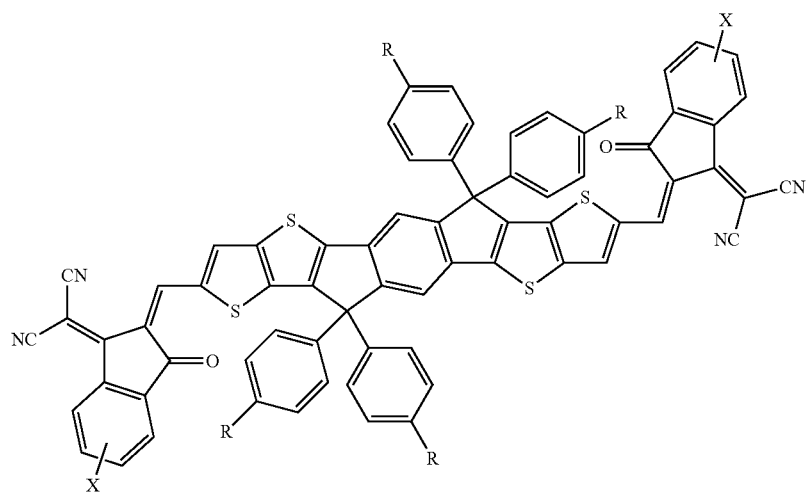

In the formula, R is as defined above, and X represents a hydrogen atom, a halogen atom, a cyano group, or an alkyl group which may have a substituent.

In the formula, R is preferably a hydrogen atom, an alkyl group which may have a substituent, an aryl group which may have a substituent, or an alkyloxy group which may have a substituent.

Examples of the compound represented by Formula (VI) or Formula (VII) include a compound represented by the following formula.

[Chem. 48]

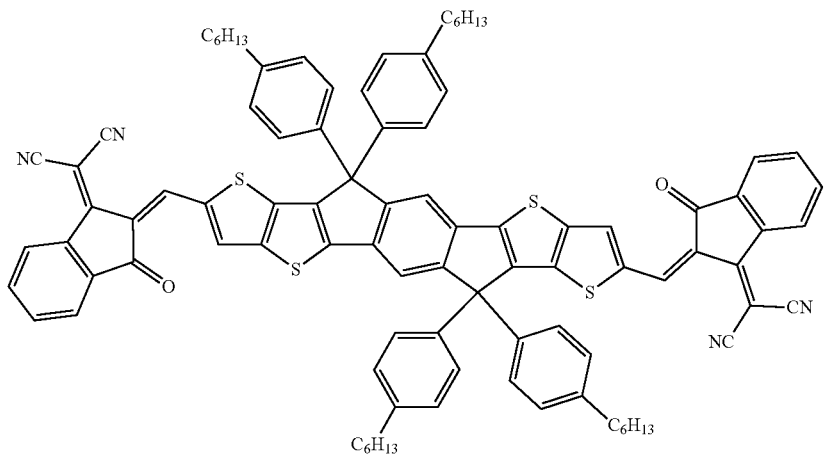

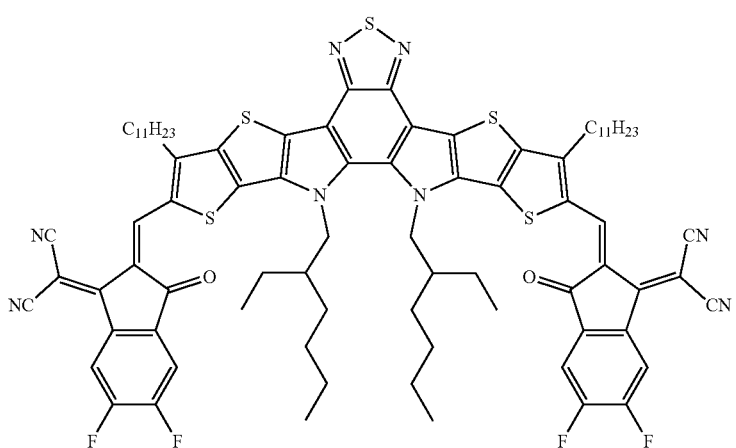

In the ink composition of the present embodiment, the n-type semiconductor material may further contain a combination of the fullerene and fullerene derivative (fullerene compound) described above, in addition to the non-fullerene compound.

Preferred specific examples of the n-type semiconductor material in the present embodiment include compounds represented by the following formulas.

[Chem. 49]

N-1

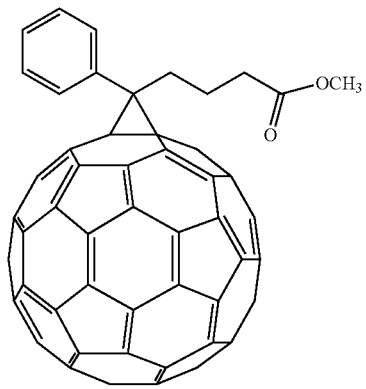

N-2
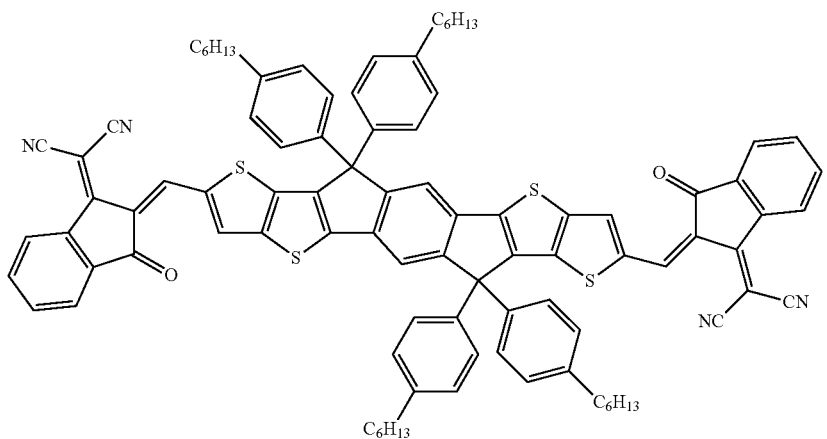
N-3
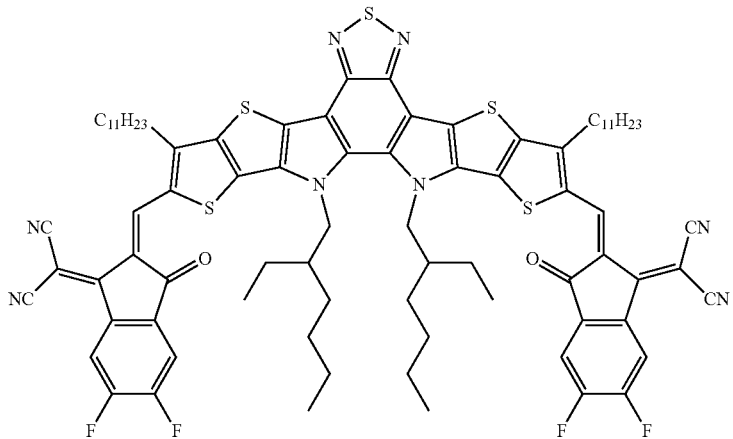
[Chem. 50]
N-4
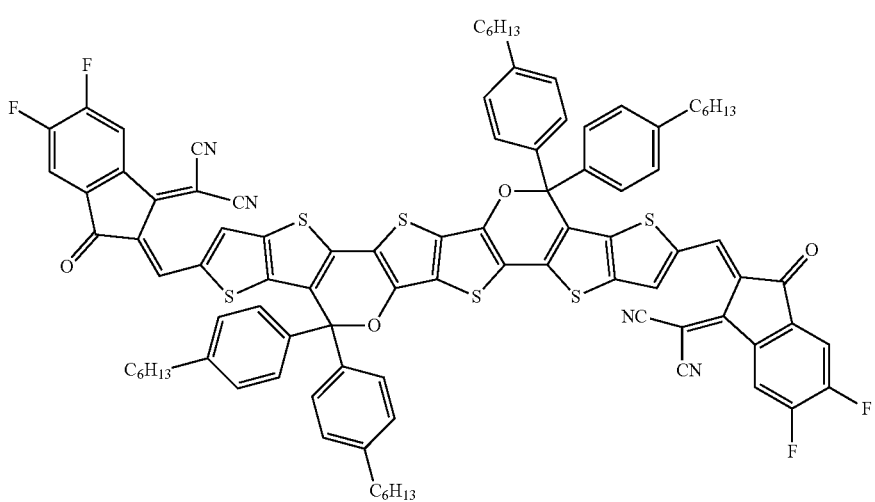

N-5
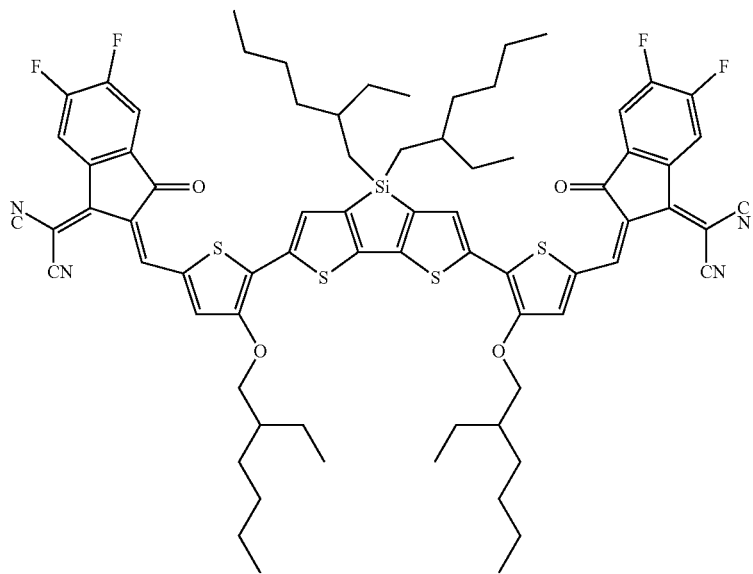
N-6
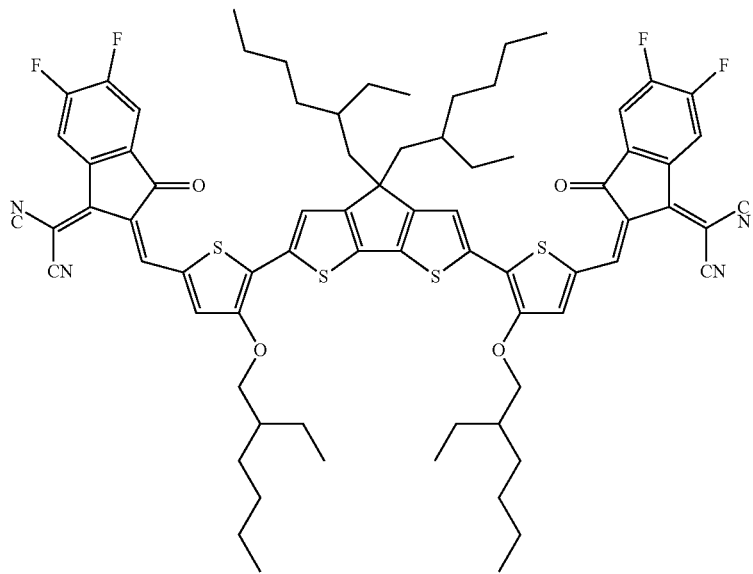

[Chem. 51]

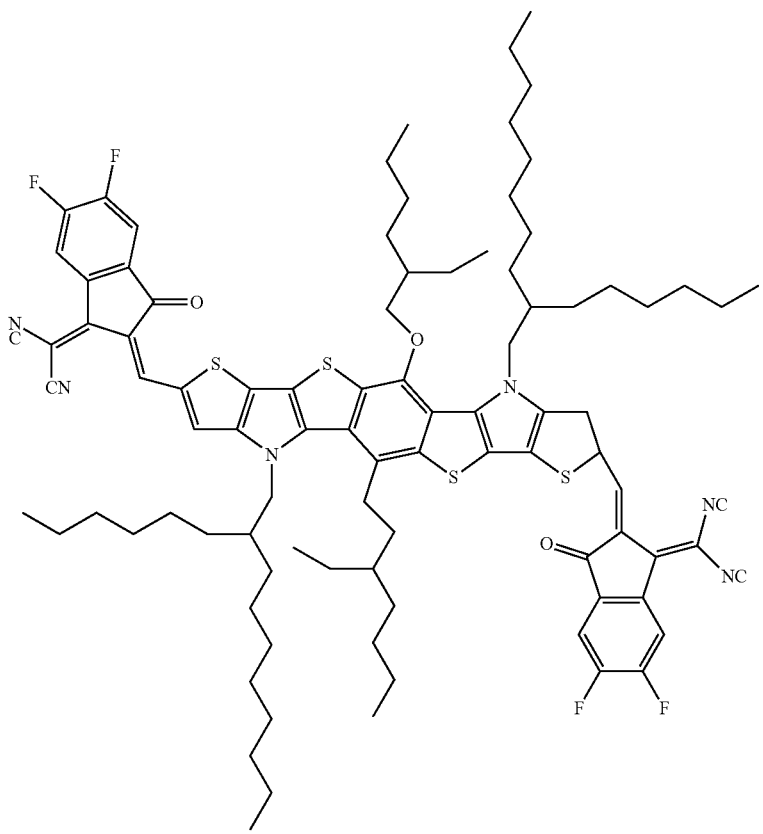

N-7

(3) Solvent

The ink composition of the present embodiment may contain an aromatic hydrocarbon as a solvent. The aromatic hydrocarbon may have a substituent. The aromatic hydrocarbon is particularly preferably a compound capable of dissolving the p-type semiconductor material described above.

Examples of the aromatic hydrocarbon that can be used as a solvent include toluene, xylene (for example, o-xylene, m-xylene, or p-xylene), trimethylbenzene (for example, mesitylene or 1,2,4-trimethylbenzene (pseudocumene)), butylbenzene (for example, n-butylbenzene, sec-butylbenzene, or tert-butylbenzene), methylnaphthalene (for example, 1-methylnaphthalene), 1,2,3,4-tetrahydronaphthalene (tetralin), indane, 1-chloronaphthalene, chlorobenzene, and dichlorobenzene (1,2-dichlorobenzene).

The solvent may be composed of only one aromatic hydrocarbon or two or more aromatic hydrocarbons.

The aromatic hydrocarbon that can constitute the solvent is preferably one or more selected from the group consisting of toluene, o-xylene, m-xylene, p-xylene, mesitylene, 1,2,4-trimethylbenzene, n-butylbenzene, sec-butylbenzene, tert-butylbenzene, methylnaphthalene, tetralin, 1-chloronaphthalene, chlorobenzene, and dichlorobenzene (1,2-dichlorobenzene), and more preferably toluene, o-xylene, m-xylene, p-xylene, mesitylene, 1,2,4-trimethylbenzene, n-butylbenzene, sec-butylbenzene, tert-butylbenzene, methylnaphthalene, tetralin, indane, 1-chloronaphthalene, chlorobenzene, or dichlorobenzene (1,2-dichlorobenzene).

The ink composition of the present embodiment can contain an alkyl halide as a solvent. Examples of the alkyl halide that can be used as a solvent include chloroform.

The ink composition of the present embodiment contains, as a solvent, one or more selected from the group consisting of toluene, o-xylene, m-xylene, p-xylene, mesitylene, 1,2,4-trimethylbenzene, n-butylbenzene, sec-butylbenzene, tert-butylbenzene, methylnaphthalene, tetralin, indane, 1-chloronaphthalene, chlorobenzene, or dichlorobenzene (1,2-dichlorobenzene), and chloroform.

In the ink composition of the present embodiment, in addition to the solvent described above, in particular, an additional solvent selected from the viewpoint of enhancing solubility of the n-type semiconductor material may be used in combination.

In the present embodiment, examples of the additional solvent include an aromatic carbonyl compound, an aromatic ester compound, and a nitrogen-containing heterocyclic compound.

Examples of the aromatic carbonyl compound include acetophenone which may have a substituent, propiophenone which may have a substituent, butyrophenone which may have a substituent, cyclohexylphenone which may have a substituent, and benzophenone which may have a substituent.

Examples of the aromatic ester compound include methyl benzoate which may have a substituent, ethyl benzoate which may have a substituent, propyl benzoate which may have a substituent, butyl benzoate which may have a substituent, isopropyl benzoate which may have a substituent, benzyl benzoate which may have a substituent, cyclohexyl benzoate which may have a substituent, and phenyl benzoate which may have a substituent.

Examples of the nitrogen-containing heterocyclic compound include pyridine which may have a substituent, quinoline which may have a substituent, quinoxaline which may have a substituent, 1,2,3,4-tetrahydroquinoline which may have a substituent, pyrimidine which may have a substituent, pyrazine which may have a substituent, and quinazoline which may have a substituent.

The nitrogen-containing heterocyclic compound may have a substituent that directly binds to a ring structure.

Examples of the substituent which may be included in the ring structure (for example, a quinoline ring structure, a 1,2,3,4-tetrahydroquinoline ring structure, or a quinoxaline ring structure) of the nitrogen-containing heterocyclic compound include an alkyl group having 1 to 5 carbon atoms, an alkoxy group having 1 to 5 carbon atoms, a halogen group, and an alkylthio group.

Examples of the nitrogen-containing heterocyclic compound having a pyridine ring structure include pyridine which may have a substituent, quinoline which may have a substituent, and isoquinoline which may have a substituent.

Examples of the nitrogen-containing heterocyclic compound having a pyrazine ring structure include pyrazine which may have a substituent and quinoxaline which may have a substituent.

Examples of the nitrogen-containing heterocyclic compound having a tetrahydropyridine ring structure include 1,2,3,4-tetrahydroquinoline which may have a substituent and 1,2,3,4-tetrahydroisoquinoline which may have a substituent.

Examples of the nitrogen-containing heterocyclic compound having a pyrimidine ring structure include pyrimidine which may have a substituent and quinazoline which may have a substituent.

In the present embodiment, as an additional solvent, the solvent may further contain only one aromatic carbonyl compound, aromatic ester compound, or nitrogen-containing heterocyclic compound, or may further contain two or more selected from these compounds.

(Weight Ratio of Solvent to Additional Solvent)

In a case where the ink composition of the present embodiment contains the solvent and the additional solvent, a weight ratio of the solvent to the additional solvent (solvent/additional solvent) is preferably within a range of 80/20 to 99.9/0.1 from the viewpoint of further improving solubility of each of the p-type semiconductor material and the n-type semiconductor material.

(Weight Percentage of Solvent in Ink Composition)

When the total weight of the ink composition is 100% by mass, the total weight of the solvent contained in the ink composition is preferably 90% by mass or more, more preferably 92% by mass or more, and still more preferably 95% by mass or more, from the viewpoint of further improving solubility of each of the p-type semiconductor material and the n-type semiconductor material, but is preferably 99.9% by mass or less from the viewpoint of further increasing a concentration of each of the p-type semiconductor material and the n-type semiconductor material in the ink composition and easily forming a layer having a predetermined thickness or more.

The ink composition may further contain an optional solvent in addition to the solvent and the additional solvent described above. When the total weight of all the solvents contained in the ink composition is 100% by weight, a content of the optional solvent is preferably 10% by mass or less, more preferably 5% by mass or less, and still more preferably 3% by weight or less. As the optional solvent, a solvent having a boiling point higher than that of the additional solvent is preferably used.

(Concentrations of p-Type Semiconductor Material and n-Type Semiconductor Material in Ink Composition)

The total concentration of the p-type semiconductor material and the n-type semiconductor material in the ink composition can be any suitable concentration depending on a required thickness of the functional layer (active layer), desired properties, and the like. The total concentration of the p-type semiconductor material and the n-type semiconductor material is preferably 0.01% by mass or more and more preferably 0.1% by mass or more, but is preferably 10% by mass or less and more preferably 5% by mass or less, and is still more preferably 0.01% by mass or more and 20% by mass or less, particularly preferably 0.01% by mass or more and 10% by weight or less, further particularly preferably 0.01% by mass or more and 5% by mass or less, and most preferably 0.1% by mass or more and 5% by mass or less.

In the ink composition, the p-type semiconductor material and the n-type semiconductor material may be dissolved or dispersed. In the ink composition, at least a part of each of the p-type semiconductor material and the n-type semiconductor material may be dissolved, or all of the p-type semiconductor material and the n-type semiconductor material may be dissolved.

(Weight Ratio (p/n ratio) of p-Type Semiconductor Material to n-Type Semiconductor Material)

A weight ratio of the p-type semiconductor material to the n-type semiconductor material (p-type semiconductor material/n-type semiconductor material) in the ink composition is preferably 1/9 or more, more preferably 1/5 or more, and still more preferably 1/3 or more, but is preferably 9/1 or less, more preferably 5/1 or less, and still more preferably 3/1 or less.

3. Method for Producing Ink Composition

A method for producing an ink composition of the present embodiment includes a step of preparing one or more compositions in which one or both of the p-type semiconductor material and the n-type semiconductor material described above are dissolved in the solvent, and a step of storing the composition for 4 days or longer to prepare the ink composition.

In the present embodiment, the composition (ink composition) that is a precursor for preparing the ink composition can be produced by any suitable conventionally known method. In particular, in a case where two or more solvents are used, for example, an ink composition can be produced by a method of preparing a mixed solvent obtained by mixing the solvent and the additional solvent described above and then adding a p-type semiconductor material and an n-type semiconductor material to the mixed solvent, or a method for preparing (producing) an ink composition, the method including: preparing a (first) composition obtained by adding a p-type semiconductor material to a solvent, preparing a (second) composition obtained by adding an n-type semiconductor material to a solvent in addition to the (first) composition, and mixing the two obtained compositions, that is, a production method in which a step of preparing a composition includes a step of preparing two or more compositions and a step of preparing an ink composition includes a step of mixing the two or more compositions.

When preparing the composition (ink composition) that is a precursor, the solvent (and the additional solvent), and the p-type semiconductor material and the n-type semiconductor material may be mixed by heating to a temperature equal to or lower than the boiling point of the solvent.

In the present embodiment, the step of preparing the composition (ink composition) is preferably performed under a condition of 0° C. or higher and 200° C. or lower, and preferably performed under a condition of 0° C. or higher and 100° C. or lower.

In the present embodiment, the step of preparing the ink composition preferably further includes a step of filtering the prepared composition (ink composition).

Specifically, when producing the composition (ink composition), after the solvent (and the additional solvent), and the p-type semiconductor material and the n-type semiconductor material are mixed, the obtained mixture (composition) may be filtered using any suitable conventionally known filter having a predetermined pore diameter, and the filtrate may be used as the ink composition.

As the filter, for example, a filter formed of a fluororesin such as polyvinylidene fluoride (PVdF) or polytetrafluoroethylene (PTFE) can be used.

As described above, the ink composition of the present embodiment is an ink composition prepared by a step preparing a composition that is a precursor thereof and then storing (treating) the composition for a predetermined time (the number of days) under predetermined conditions, or prepared by mixing two or more stored compositions.

In the present embodiment, as a container that can be used for storing of the composition (ink composition) that is a precursor of the ink composition prepared as described above, any suitable conventionally known container can be used.

The container used for storing the composition (ink composition) of the present embodiment is an enclosed container that can freely enclose and take out the composition (ink composition) and has a gas barrier property, and the shape and the like of the container are not particularly limited as long as the composition (ink composition) can be enclosed in an airtight state.

In the present embodiment, examples of the container include a bag-shaped container, a reagent bottle, a bottle-shaped container such as a reagent bottle, and a combination thereof that satisfy the conditions described above.

A material constituting the container is not particularly limited under a condition in which the object and effect of the present invention are not impaired. Examples of the material include glass, ceramic, a resin-based material such as polyethylene, polyethylene terephthalate, or polytetrafluoroethylene (PTFE), a metal such as an alloy, and a combination thereof.

In the present embodiment, examples of the container include a glass vial bottle, a glass quartz bottle, a glass gallon bottle, a plastic reagent bottle, a liner base bottle, and a metal canister can.

In the present embodiment, a capacity of the container that can be used is not particularly limited. The capacity of the container can be set to any suitable capacity in consideration of a size of a space that can be secured for storage, transportation, ease of handling, and the like.

In the present embodiment, when the step of storing the composition (ink composition) contained in the container described above is performed, the step of storing the composition is preferably performed under light shielding from the viewpoint of improving the properties of the photoelectric conversion element.

In the present embodiment, when the step of storing the composition (ink composition) contained in the container is performed, the step of storing the composition is preferably performed at a temperature of room temperature or lower, and specifically, is preferably performed at 30° C. or lower, from the viewpoint of improving the properties of the photoelectric conversion element.

In the present embodiment, when the step of storing the composition (ink composition) contained in the container is performed, a storage time is preferably 4 days or longer, and can be further 7 days or longer, 14 days or longer, or 30 days or longer, from the viewpoint of improving the properties of the photoelectric conversion element.

An upper limit of the storage time of the composition (ink composition) is not particularly limited under a condition in which the properties (physical properties) of the ink composition and the properties of the photoelectric conversion element to be manufactured are not impaired.

In the present embodiment, the storage time can be, for example, 1 year or shorter, preferably can be 6 months or shorter, and may be 3 months (90 days) or shorter.

When the ink composition is produced by the production method as described above, the properties of the photoelectric conversion element manufactured using the ink composition are not deteriorated, but rather the properties of the photoelectric conversion element, for example, the external quantum efficiency (EQE) and the photoelectric conversion efficiency of the photoelectric conversion element can be further improved, and the sensitivity in a case where the photoelectric conversion element is used as a photodetector can be further improved.

It is presumed that the above action and effects are caused by the fact that the semiconductor materials, particularly the p-type semiconductor materials, in the composition (ink composition) are reversibly and slowly aggregated with each other by storing the composition (ink composition) as described above, which is advantageous in separation and transportation of charges. In particular, it is presumed that by using the D-A type conjugated polymer compound having a donor-acceptor structure having a large cohesive force between molecules as the p-type semiconductor material, the aggregation proceeds more remarkably, and the external quantum efficiency is further enhanced.

4. Applications of Ink Composition

The ink composition of the present embodiment is usually used for forming a film containing a p-type semiconductor material and an n-type semiconductor material.

The ink composition of the present embodiment is suitably used for forming an active layer included in a photoelectric conversion element. In particular, the photoelectric conversion element including the active layer formed using the ink composition of the present embodiment has improved external quantum efficiency. Therefore, the ink composition of the present embodiment can be particularly suitably used for forming an active layer included in a photodetector to which a reverse bias voltage is applied at the time of use.

5. Solidified Film of Ink Composition

After a film is formed using the ink composition of the present embodiment, the solvent is removed from the film to solidify the film, such that a solidified film of the ink composition can be formed. The solidified film of the ink composition can be suitably used for forming a functional layer, particularly an active layer, included in a photodetector.

The solidified film of the ink composition can be produced by any suitable production method.

In the present embodiment, a method for producing a solidified film of an ink composition includes a step (i) of applying an ink composition to an object to be coated to obtain a coating film, and a step (ii) of removing a solvent from the obtained coating film. Hereinafter, the step (i) and the step (ii) will be described.

[Step (i)]

In the step (i), as a method of applying an ink composition to an object to be coated, any suitable conventionally known coating method described above can be used. In the present embodiment, as the coating method, a slit coating method, a knife coating method, a spin coating method, a microgravure coating method, a gravure coating method, a bar coating method, an inkjet coating method, a nozzle coating method, or a capillary coating method is preferable, a slit coating method, a spin coating method, a capillary coating method, or a bar coating method is more preferable, and a slit coating method or a spin coating method is still more preferable.

In the step (i), the ink composition is applied to any object to be coated. The ink composition can be applied to a functional layer that can be included in a photoelectric conversion element, such as an electrode (anode or cathode), an electron transport layer, or a hole transport layer, in a step of manufacturing the photoelectric conversion element.

[Step (ii)]

In step (ii), any suitable method can be used as a method of removing the solvent from the coating film of the ink composition formed in the step (i) Examples of the method of removing the solvent include drying methods such as a hot air drying method, an infrared heating drying method, a flash lamp annealing drying method, and a reduced pressure drying method.

6. Photoelectric Conversion Element (1) Configuration of Photoelectric Conversion Element A photoelectric conversion element according to the present embodiment includes a first electrode, a second electrode, and an active layer provided between the first electrode and the second electrode, and the active layer is the solidified film described above.

Hereinafter, a configuration example of the photoelectric conversion element of the present embodiment will be specifically described with reference to the drawings.

FIG. 1 is a view schematically illustrating a configuration example of the photoelectric conversion element.

As illustrated in FIG. 1, a photoelectric conversion element 10 is provided on a support substrate 11. The photoelectric conversion element 10 includes a first electrode 12 provided so as to be in contact with the support substrate 11, an electron transport layer 13 provided so as to be in contact with the first electrode 12, an active layer 14 provided so as to be in contact with the electron transport layer 13, a hole transport layer 15 provided so as to be in contact with the active layer 14, and a second electrode 16 provided so as to be in contact with the hole transport layer 15. In this configuration example, a sealing member 17 is further provided so as to be in contact with the first electrode 16.

Hereinafter, constituent elements that can be included in the photoelectric conversion element of the present embodiment will be specifically described.

(Substrate)

The photoelectric conversion element is usually formed on a substrate (support substrate). In addition, there is also a case where sealing is performed by a substrate (sealing substrate). One of a pair of electrodes including a first electrode and a second electrode is usually formed on the substrate. A material of the substrate is not particularly limited as long as it is a material that is not chemically changed particularly when a layer containing an organic compound is formed.

Examples of the material of the substrate include glass, plastic, a polymer film, and silicon. In a case where an opaque substrate is used, it is preferable that an electrode (in other words, the electrode provided on a side far from the opaque substrate) provided on an opposite side to an electrode provided on the opaque substrate is a transparent or translucent electrode.

(Electrode)

The photoelectric conversion element includes a first electrode and a second electrode that are a pair of electrodes. At least one electrode of the first electrode and the second electrode is preferably a transparent or translucent electrode in order to allow light to be incident.

Examples of a material of the transparent or translucent electrode include a conductive metal oxide film and a translucent metal thin film. Specific examples of the material of the transparent or translucent electrode include indium oxide, zinc oxide, tin oxide, and a conductive material such as indium tin oxide (ITO), indium zinc oxide (IZO), or NESA, which is a composite thereof, gold, platinum, silver, and copper. As the material of the transparent or translucent electrode, ITO, IZO, or tin oxide is preferable. In addition, as the electrode, a transparent conductive film using an organic compound such as polyaniline and a derivative thereof, or polythiophene and a derivative thereof, as a material, may be used. The transparent or translucent electrode may be the first electrode or the second electrode.

When one electrode of the pair of electrodes is transparent or translucent, the other electrode may be an electrode having low light transmittance. Examples of the material of the electrode having low light transmittance include a metal and a conductive polymer. Specific examples of a material of the electrode having low light transmittance include metals such as lithium, sodium, potassium, rubidium, cesium, magnesium, calcium, strontium, barium, aluminum, scandium, vanadium, zinc, yttrium, indium, cerium, samarium, europium, terbium, and ytterbium, and an alloy of two or more of these metals, an alloy of one or more of these metals and one or more metals selected from the group consisting of gold, silver, platinum, copper, manganese, titanium, cobalt, nickel, tungsten, and tin, graphite, a graphite interlayer compound, polyaniline and a derivative thereof, and polythiophene and a derivative thereof. Examples of the alloy include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy.

(Active Layer)

The photoelectric conversion element of the present embodiment includes the solidified film of the ink composition described above as an active layer. The active layer of the present embodiment has a bulk heterojunction type structure.

In the present embodiment, a thickness of the active layer is not particularly limited. The thickness of the active layer can be any suitable thickness in consideration of a balance between suppression of a dark current and extraction of a generated photocurrent. The thickness of the active layer is preferably 100 nm or more, more preferably 150 nm or more, and still more preferably 200 nm or more, particularly from the viewpoint of further reducing the dark current. In addition, the thickness of the active layer is preferably 10 µm or less, more preferably 5 µm or less, and still more preferably 1 µm or less.

(Intermediate Layer)

As illustrated in FIG. 1, the photoelectric conversion element of the present embodiment preferably includes an intermediate layer (buffer layer) such as a charge transport layer (an electron transport layer, a hole transport layer, an electron injection layer, or a hole injection layer) as a constituent element for improving characteristics such as photoelectric conversion efficiency.

In addition, examples of a material used for the intermediate layer include a metal such as calcium, an inorganic oxide semiconductor such as molybdenum oxide or zinc oxide, and a mixture (PEDOT:PSS) of poly(3,4-ethylenedioxythiophene) (PEDOT) and poly(4-styrenesulfonate) (PSS).

The intermediate layer can be formed by any suitable conventionally known forming method. The intermediate layer can be formed by a vacuum vapor deposition method or a coating method similar to that in the formation method of the active layer.

As illustrated in FIG. 1, the photoelectric conversion element of the present embodiment preferably includes an electron transport layer provided between the first electrode and the active layer. The electron transport layer has a function of transporting electrons from the active layer to the electrode.

In another embodiment, the photoelectric conversion element may not include an electron transport layer.

The electron transport layer provided in contact with the first electrode may be particularly referred to as an electron injection layer. The electron transport layer (electron injection layer) provided in contact with the first electrode has a function of promoting injection of electrons into the first electrode. The electron transport layer (electron injection layer) may be in contact with the active layer.

The electron transport layer contains an electron transporting material. Examples of the electron transporting material include polyalkyleneimine and a derivative thereof, a polymer compound having a fluorene structure, a metal such as calcium, and a metal oxide.

Examples of the polyalkyleneimine and the derivative thereof include a polymer obtained by polymerizing one or two or more of alkyleneamines having 2 to 8 carbon atoms, such as ethyleneimine, propyleneimine, butyleneimine, dimethylethylenimine, pentyleneimine, hexyleneimine, heptyleneimine, and octyleneimine, particularly, alkyleneimines having 2 to 4 carbon atoms, by a normal method, and a polymer chemically modified by reacting these alkyleneimines with various compounds. As the polyalkyleneimine and the derivative thereof, polyethyleneimine (PEI) and ethoxylated polyethyleneimine (PEIE) are preferable.

Examples of the polymer compound having a fluorene structure include poly[(9,9-bis(3'-(N,N-dimethylamino)propyl)-2,7-fluoren)-ortho-2,7-(9,9'-dioctylfluorene)] (PFN) and PFN-P2.

Examples of the metal oxide include zinc oxide, gallium-doped zinc oxide, aluminum-doped zinc oxide, titanium oxide, and niobium oxide. As the metal oxide, a metal oxide containing zinc is preferable, and zinc oxide is particularly preferable.

Examples of other electron transporting materials include poly(4-vinylphenol) and perylene diimide.

The photoelectric conversion element according to the present embodiment preferably has a configuration in which an intermediate layer is an electron transport layer, and a substrate (support substrate), a first electrode, an electron transport layer, an active layer, a hole transport layer, and a second electrode are laminated in this order so as to be in contact with each other.

As illustrated in FIG. 1, the photoelectric conversion element of the present embodiment preferably includes a hole transport layer provided between the second electrode and the active layer as the intermediate layer. The hole transport layer has a function of transporting holes from the active layer to the second electrode. The hole transport layer may be in contact with the second electrode.

The hole transport layer may be in contact with the active layer.

In another embodiment, the photoelectric conversion element may not include a hole transport layer.

The hole transport layer provided in contact with the second electrode may be particularly referred to as a hole injection layer. The hole transport layer (hole injection layer) provided in contact with the second electrode has a function of promoting injection of holes generated in the active layer into the second electrode.

The hole transport layer contains a hole transporting material. Examples of the hole transporting material include polythiophene and a derivative thereof, an aromatic amine compound, a polymer compound containing a constitutional unit having an aromatic amine residue, CuSCN, CuI, NiO, tungsten oxide ($WO_3$), and molybdenum oxide ($MoO_3$).

(Sealing Member)

It is preferable that the photoelectric conversion element of the present embodiment further includes a sealing member and is a sealing body sealed by the sealing member.

Any suitable conventionally known member can be used as the sealing member. Examples of the sealing member include a combination of a glass substrate as a substrate (sealing substrate) and a sealing material (adhesive) as a UV curable resin.

The sealing member may be a sealing layer having a layer structure of one or more layers. Examples of the layer constituting the sealing layer include a gas barrier layer and a gas barrier film.

The sealing layer is preferably formed of a material having a property of blocking moisture (water vapor barrier property) or a property of blocking oxygen (oxygen barrier property). Examples of a preferred material as the material of the sealing layer include an organic material such as polyethylene trifluoride, polytrifluoroethylene chloride (PCTFE), polyimide, polycarbonate, polyethylene terephthalate, alicyclic polyolefin, or an ethylene vinyl alcohol copolymer, and an inorganic material such as silicon oxide, silicon nitride, aluminum oxide, or diamond-like carbon.

The sealing member is usually formed of a material that can withstand a heat treatment performed when the sealing member is incorporated into a device to which a photoelectric conversion element is applied, for example, a device of an application example described below.

(2) Method for Manufacturing Photoelectric Conversion Element

The photoelectric conversion element of the present embodiment can be manufactured by any suitable conventionally known manufacturing method. The photoelectric conversion element of the present embodiment may be manufactured by combining steps suitable for the material selected for forming the constituent elements.

Hereinafter, as an embodiment of the present invention, a method for manufacturing a photoelectric conversion element having a configuration in which a substrate (support substrate), a first electrode, a hole transport layer, an active layer, an electron transport layer, and a second electrode are in contact with each other in this order will be described.

(Step of Preparing Substrate)

In the present step, for example, a support substrate provided with a first electrode is prepared. In addition, it is possible to prepare a support substrate provided with a first electrode by obtaining a substrate provided with a conductive thin film formed of the electrode material described above from the market and patterning the conductive thin film to form the first electrode, if necessary.

In the method for manufacturing a photoelectric conversion element according to the present embodiment, the method of forming the first electrode in the case of forming the first electrode on the support substrate is not particularly limited. The first electrode can be formed on a structure (for example, a support substrate, an active layer, or a hole transport layer) in which the first electrode is to be formed by any suitable conventionally known method such as a vacuum vapor deposition method, a sputtering method, an ion-plating method, a plating method, or a coating method.

(Step of Forming Hole Transport Layer)

The method for manufacturing a photoelectric conversion element may include a step of forming a hole transport layer (hole injection layer) provided between the active layer and the first electrode.

A method of forming the hole transport layer is not particularly limited. From the viewpoint of further simplifying the step of forming the hole transport layer, it is preferable to form a hole transport layer by any suitable conventionally known coating method.

The hole transport layer can be formed, for example, by a coating method or a vacuum vapor deposition method using a coating liquid containing the material that can constitute the hole transport layer described above and a solvent.

(Step of Forming Active Layer)

In the method for manufacturing a photoelectric conversion element of the present embodiment, an active layer is formed on the hole transport layer. The active layer can be formed by any suitable conventionally known forming step. In the present embodiment, the active layer is preferably produced by a coating method using the ink composition described above.

The active layer can be formed in the same manner as that in "Solidified Film" described above. In the present embodiment, the active layer can be formed by a step including a step of applying an ink composition containing a p-type semiconductor material, an n-type semiconductor material, and a solvent onto the hole transport layer to form a coating film, and a step of drying the coating film.

(Step of Forming Electron Transport Layer)

The method for manufacturing a photoelectric conversion element of the present embodiment may include a step of forming an electron transport layer (electron injection layer) provided so as to be in contact with the active layer.

A method of forming the electron transport layer is not particularly limited. From the viewpoint of further simplifying the step of forming the electron transport layer, it is preferable to form an electron transport layer by any suitable conventionally known vacuum vapor deposition method.

(Step of Forming Second Electrode)

A method of forming the second electrode is not particularly limited. The second electrode can be formed using the electrode material exemplified above by any suitable conventionally known method such as a coating method, a vacuum vapor deposition method, a sputtering method, an ion-plating method, or a plating method. Through the steps described above, the photoelectric conversion element of the present embodiment is manufactured.

(Step of Forming Sealing Body)

In the present embodiment, when forming a sealing body, any suitable conventionally known sealing material (adhesive) and substrate (sealing substrate) are used. Specifically, a sealing material such as a UV curable resin is applied onto the support substrate so as to surround the periphery of the manufactured photoelectric conversion element, and bonding is performed with the sealing material without a gap, and then, the photoelectric conversion element is sealed in a gap between the support substrate and the sealing substrate using a method suitable for the selected sealing material such as irradiation with UV rays, such that a sealing body of the photoelectric conversion element can be obtained.

(3) Applications of Photoelectric Conversion Element

Examples of applications of the photoelectric conversion element of the present embodiment include a photodetector and a solar cell.

More specifically, the photoelectric conversion element of the present embodiment can allow a photocurrent to flow by irradiating light from the transparent or translucent electrode in a state in which a voltage (reverse bias voltage) is applied between the electrodes, and can be operated as a photodetector (photosensor). In addition, the photodetector can also be used as an image sensor by integrating a plurality of photodetectors. The photoelectric conversion element of the present embodiment can be particularly suitably used as a photodetector.

In addition, the photoelectric conversion element of the present embodiment can generate photovoltaic power between the electrodes by being irradiated with light, and can be operated as a solar cell. A solar cell module can also be formed by integrating a plurality of photoelectric conversion elements.

(4) Application Examples of Photoelectric Conversion Element

The photoelectric conversion element according to the present embodiment can be suitably applied, as a photodetector, to a detection unit included in various electronic devices such as a workstation, a personal computer, a portable information terminal, an access management system, a digital camera, and a medical device.

The photoelectric conversion element of the present embodiment is included in the above-described exemplary electronic devices, and can be preferably applied to, for example, an image detection unit (for example, an image sensor such as an X-ray sensor) for a solid-state imaging device such as an X-ray imaging device or a CMOS image sensor, a detection unit (for example, a near-infrared sensor) of a biometric information authentication device that detects a predetermined feature of a part of a living body such as a fingerprint detection unit, a face detection unit, a vein detection unit, or an iris detection unit, and a detection unit of an optical biosensor such as a pulse oximeter.

The photoelectric conversion element of the present embodiment can also be suitably applied to a time-of-flight (TOF) type distance measuring device (TOF type distance measuring device) as an image detection unit for a solid-state imaging device.

In the TOF type distance measuring device, a distance is measured by allowing the photoelectric conversion element to receive reflected light obtained by reflection of light emitted from a light source on an object to be measured. Specifically, the distance to the object to be measured is determined by detecting the flight time until the irradiation light emitted from the light source is reflected by the object to be measured and returns as reflected light. The TOF type includes a direct TOF method and an indirect TOF method. In the direct TOF method, a difference between the time when light is emitted from the light source and the time when the reflected light is received by the photoelectric conversion element is directly measured, and in the indirect TOF method, a distance is measured by converting a change in charge accumulation amount depending on the flight time into a time change. As a distance measuring principle for obtaining a flight time by charge accumulation used in the indirect TOF method, there are a continuous wave (in particular, sinusoidal wave) modulation method and a pulse modulation method for obtaining a flight time from phases of light emitted from a light source and reflected light reflected by an object to be measured.

Hereinafter, among the detection units to which the photoelectric conversion element according to the present embodiment can be suitably applied, configuration examples of an image detection unit for a solid-state imaging device and an image detection unit for an X-ray imaging device, a fingerprint detection unit and a vein detection unit for a biometric authentication device (for example, a fingerprint authentication device, a vein authentication device, or the like), and an image detection unit of a TOF type distance measuring device (indirect TOF method) will be described with reference to the drawings.

(Image Detection Unit for Solid-State Imaging Device)

FIG. 2 is a view schematically illustrating a configuration example of an image detection unit for a solid-state imaging device.

An image detection unit 1 includes a CMOS transistor substrate 20, an interlayer insulating film 30 provided so as to cover the CMOS transistor substrate 20, a photoelectric conversion element 10 according to the embodiment of the present invention provided on the interlayer insulating film 30, an interlayer wiring portion 32 provided so as to penetrate through the interlayer insulating film 30 and electrically connecting the CMOS transistor substrate 20 and the photoelectric conversion element 10, a sealing layer 40 provided so as to cover the photoelectric conversion element 10, and a color filter 50 provided on the sealing layer 40.

The CMOS transistor substrate 20 is included in a form according to a design with any suitable conventionally known configuration.

The CMOS transistor substrate 20 includes a functional element such as a CMOS transistor circuit (MOS transistor circuit) for realizing various functions that includes a transistor, a capacitor, and the like formed in a thickness of the substrate.

Examples of the functional element include a floating diffusion, a reset transistor, an output transistor, and a selection transistor.

With such a functional element, a wiring, and the like, a signal reading circuit and the like are built in the CMOS transistor substrate 20.

The interlayer insulating film 30 can be formed of any suitable conventionally known insulating material such as silicon oxide or an insulating resin. The interlayer wiring portion 32 can be formed of any suitable conventionally known conductive material (wiring material) such as copper or tungsten. The interlayer wiring portion 32 may be, for example, an in-hole wiring simultaneously formed with formation of a wiring layer or a buried plug formed separately from the wiring layer.

The sealing layer 40 can be formed of any suitable conventionally known material under a condition in which permeation of harmful substances such as oxygen and water that may cause functional deterioration of the photoelectric conversion element 10 can be prevented or suppressed. The sealing layer 40 can have the same configuration as that of the sealing member 17 described above.

As the color filter 50, for example, a primary color filter formed of any suitable conventionally known material and corresponding to the design of the image detection unit 1 can be used. In addition, as the color filter 50, a complementary color filter capable of reducing the thickness as compared with the primary color filter can also be used. As the complementary color filter, for example, a color filter in which three types of (yellow, cyan, and magenta), three types of (yellow, cyan, and transparent), three types of (yellow, transparent, magenta), and three types of (transparent, cyan, and magenta) are combined can be used. This color filter can be arbitrarily preferably arranged corresponding to the design of the photoelectric conversion element 10 and the CMOS transistor substrate 20 on the condition that the color image data can be generated.

Light received by the photoelectric conversion element 10 through the color filter 50 is converted into an electrical signal according to the amount of received light by the photoelectric conversion element 10, and is output to the outside of the photoelectric conversion element 10 through the electrodes as a light reception signal, that is, an electrical signal corresponding to an imaging target.

Then, the light reception signal output from the photoelectric conversion element 10 is input to the CMOS transistor substrate 20 via the interlayer wiring portion 32, is read by the signal reading circuit built in the CMOS transistor substrate 20, and is subjected to signal processing by a further suitable conventionally known functional unit (not illustrated), such that image information is generated based on the imaging target.

(Fingerprint Detection Unit)

FIG. 3 is a view schematically illustrating a configuration example of a fingerprint detection unit integrally configured in a display device.

A display device 2 of a portable information terminal includes a fingerprint detection unit 100 including the photoelectric conversion element 10 according to the embodiment of the present invention as a main constituent element, and a display panel unit 200 provided on the fingerprint detection unit 100 and displaying a predetermined image.

In this configuration example, the fingerprint detection unit 100 is provided in an area coinciding with a display area 200a of the display panel unit 200. In other words, the display panel unit 200 is integrally laminated on the fingerprint detection unit 100.

In a case where the fingerprint detection unit is performed only in a partial area of the display area 200a, the fingerprint detection unit 100 may be provided corresponding to only the partial area.

The fingerprint detection unit 100 includes the photoelectric conversion element 10 according to the present embodiment of the present invention as a functional unit exhibiting an essential function. The fingerprint detection unit 100 can include any suitable conventionally known member such as a protection film, a support substrate, a sealing substrate, a sealing member, a barrier film, a bandpass filter, or an infrared cut film (not illustrated) in a form corresponding to a design that can obtain desired characteristics. The configuration of the image detection unit described above can also be adopted for the fingerprint detection unit 100.

The photoelectric conversion element 10 can be included in the display area 200*a* in any form. For example, a plurality of photoelectric conversion elements 10 may be arranged in a matrix.

As described above, the photoelectric conversion element 10 is provided on the support substrate 11, and electrodes (first electrode and second electrode) are provided in the support substrate 11 in, for example, a matrix.

The light received by the photoelectric conversion element 10 is converted into an electrical signal according to the amount of received light by the photoelectric conversion element 10, and is output to the outside of the photoelectric conversion element 10 through the electrodes as a light reception signal, that is, an electrical signal corresponding to an imaged fingerprint.

In this configuration example, the display panel unit 200 is configured as an organic electroluminescent display panel (organic EL display panel) including a touch sensor panel. For example, instead of the organic EL display panel, the display panel unit 200 may be configured as a display panel having any suitable conventionally known configuration such as a liquid crystal display panel including a light source such as a backlight.

The display panel unit 200 is provided on the fingerprint detection unit 100 described above. The display panel unit 200 includes an organic electroluminescent element (organic EL element) 220 as a functional unit exhibiting an essential function. The display panel unit 200 may further include any suitable conventionally known member such as a substrate (a support substrate 210 or a sealing substrate 240) such as a suitable conventionally known glass substrate, a sealing member, a barrier film, a polarizing plate such as a circular polarizing plate, or a touch sensor panel 230, in a form corresponding to desired characteristics.

In the configuration examples described above, the organic EL element 220 is used as a light source of a pixel in the display area 200*a*, and is also used as a light source for imaging a fingerprint in the fingerprint detection unit 100.

Here, an operation of the fingerprint detection unit 100 will be briefly described.

At the time of executing fingerprint authentication, the fingerprint detection unit 100 detects a fingerprint using light emitted from the organic EL element 220 of the display panel unit 200. Specifically, the light emitted from the organic EL element 220 passes through a constituent element existing between the organic EL element 220 and the photoelectric conversion element 10 of the fingerprint detection unit 100, and is reflected by the skin (finger surface) of the fingertip of the finger placed so as to be in contact with a surface of the display panel unit 200 in the display area 200*a*. At least a part of the light reflected by the finger surface is transmitted through the constituent element existing between the organic EL element 220 and the photoelectric conversion element 10, and is converted into an electrical signal corresponding to the amount of light received by the photoelectric conversion element 10. Then, image information on the fingerprint of the finger surface is obtained from the converted electrical signal.

The portable information terminal including the display device 2 performs fingerprint authentication by comparing the obtained image information with previously recorded fingerprint data for fingerprint authentication by any suitable conventionally known step.

(Image Detection Unit for X-Ray Imaging Device)

FIG. 4 is a view schematically illustrating a configuration example of an image detection unit for an X-ray imaging device.

An image detection unit 1 for an X-ray imaging device includes a CMOS transistor substrate 20, an interlayer insulating film 30 provided so as to cover the CMOS transistor substrate 20, a photoelectric conversion element 10 according to the embodiment of the present invention provided on the interlayer insulating film 30, an interlayer wiring portion 32 provided so as to penetrate through the interlayer insulating film 30 and electrically connecting the CMOS transistor substrate 20 and the photoelectric conversion element 10, a sealing layer 40 provided so as to cover the photoelectric conversion element 10, a scintillator 42 provided on the sealing layer 40, a reflective layer 44 provided so as to cover the scintillator 42, and a protection layer 46 provided so as to cover the reflective layer 44.

The CMOS transistor substrate 20 is included in a form according to a design with any suitable conventionally known configuration.

The CMOS transistor substrate 20 includes a functional element such as a CMOS transistor circuit (MOS transistor circuit) for realizing various functions that includes a transistor, a capacitor, and the like formed in a thickness of the substrate.

Examples of the functional element include a floating diffusion, a reset transistor, an output transistor, and a selection transistor.

With such a functional element, a wiring, and the like, a signal reading circuit and the like are built in the CMOS transistor substrate 20.

The interlayer insulating film 30 can be formed of any suitable conventionally known insulating material such as silicon oxide or an insulating resin. The interlayer wiring portion 32 can be formed of any suitable conventionally known conductive material (wiring material) such as copper or tungsten. The interlayer wiring portion 32 may be, for example, an in-hole wiring simultaneously formed with formation of a wiring layer or a buried plug formed separately from the wiring layer.

The sealing layer 40 can be formed of any suitable conventionally known material under a condition in which permeation of harmful substances such as oxygen and water that may cause functional deterioration of the photoelectric conversion element 10 can be prevented or suppressed. The sealing layer 40 can have the same configuration as that of the sealing member 17 described above.

The scintillator 42 can be formed of any suitable conventionally known material corresponding to the design of the image detection unit 1 for an X-ray imaging device. Examples of the suitable material for the scintillator 42 include inorganic crystals of inorganic materials such as cesium iodide (CsI), sodium iodide (NaI), zinc sulfide (ZnS), gadolinium oxysulfide (GOS), and gadolinium silicate (GSO), organic crystals of organic materials such as anthracene, naphthalene, and stilbene, an organic liquid obtained by dissolving an organic material such as diphenyl oxazole (PPO) or terphenyl (TP) in an organic solvent such as toluene, xylene, and dioxane, gas such as xenon or helium, and plastic.

The constituent elements described above can be arranged in any suitable manner corresponding to the design of the photoelectric conversion element 10 and the CMOS transistor substrate 20 under a condition in which the scintillator 42 can convert the incident X-ray into light having a wavelength centered on the visible region to generate image data.

The reflective layer 44 reflects light converted by the scintillator 42. The reflective layer 44 can reduce a loss of the converted light and increase detection sensitivity. In addition, the reflective layer 44 can also block light directly incident from the outside.

The protection layer 46 can be formed of any suitable conventionally known material under a condition in which permeation of harmful substances such as oxygen and water that may cause functional deterioration of the scintillator 42 can be prevented or suppressed.

Here, the operation of the image detection unit 1 for an X-ray imaging device having the configuration described above will be briefly described.

When radiation energy such as X-rays or γ-rays is incident on the scintillator 42, the scintillator 42 absorbs the radiation energy and converts the radiation energy into light (fluorescence) having a wavelength from ultraviolet to infrared regions centered on the visible region. Then, the light converted by the scintillator 42 is received by the photoelectric conversion element 10.

As described above, light received by the photoelectric conversion element 10 through the scintillator 42 is converted into an electrical signal according to the amount of received light by the photoelectric conversion element 10, and is output to the outside of the photoelectric conversion element 10 through the electrodes as a light reception signal, that is, an electrical signal corresponding to an imaging target. The radiation energy (X-ray) to be detected may be incident from either the scintillator 42 or the photoelectric conversion element 10.

Then, the light reception signal output from the photoelectric conversion element 10 is input to the CMOS transistor substrate 20 via the interlayer wiring portion 32, is read by the signal reading circuit built in the CMOS transistor substrate 20, and is subjected to signal processing by a further suitable conventionally known functional unit (not illustrated), such that image information is generated based on the imaging target.

(Vein Detection Unit)

FIG. 5 is a view schematically illustrating a configuration example of a vein detection unit for a vein authentication device.

A vein detection unit 300 for a vein authentication device includes a cover portion 306 that partitions an insertion portion 310 into which a finger (for example, one or more fingertips, fingers, and palms) that is an object to be measured is inserted at the time of measurement, a light source portion 304 that is provided on the cover portion 306 and irradiates the object to be measured with light, a photoelectric conversion element 10 that receives the light emitted from the light source portion 304 through the object to be measured, a support substrate 11 that supports the photoelectric conversion element 10, and a glass substrate 302 that is arranged so as to face the support substrate 11 with the photoelectric conversion element 10 interposed therebetween, is spaced apart from the cover portion 306 at a predetermined distance, and partitions the insertion portion 306 together with the cover portion 306.

In this configuration example, the light source portion 304 is a transmission imaging system in which the light source portion is integrated with the cover portion 306 so as to be spaced apart from the photoelectric conversion element 10 with the object to be measured interposed therebetween during use, but the light source portion 304 is not necessarily located on the cover portion 306.

Under a condition in which the object to be measured can be efficiently irradiated with the light emitted from the light source portion 304, for example, a reflection imaging system of irradiating the object to be measured from the photoelectric conversion element 10 may be adopted.

The vein detection unit 300 includes the photoelectric conversion element 10 according to the present embodiment of the present invention as a functional unit exhibiting an essential function. The vein detection unit 300 can include any suitable conventionally known member such as a protection film, a sealing member, a barrier film, a bandpass filter, a near infrared transmission filter, a visible light cut film, or a finger placement guide (not illustrated) in a form corresponding to a design that can obtain desired characteristics. The configuration of the image detection unit 1 described above can also be adopted for the vein detection unit 300.

The photoelectric conversion element 10 can be included in any form. For example, a plurality of photoelectric conversion elements 10 may be arranged in a matrix.

As described above, the photoelectric conversion element 10 is provided on the support substrate 11, and electrodes (first electrode and second electrode) are provided in the support substrate 11 in, for example, a matrix.

The light received by the photoelectric conversion element 10 is converted into an electrical signal according to the amount of received light by the photoelectric conversion element 10, and is output to the outside of the photoelectric conversion element 10 through the electrodes as a light reception signal, that is, an electrical signal corresponding to an imaged vein.

At the time of vein detection (at the time of use), the object to be measured may or may not be in contact with the glass substrate 302 provided on the photoelectric conversion element 10.

Here, an operation of the vein detection unit 300 will be briefly described.

At the time of vein detection, the vein detection unit 300 detects a vein pattern of the object to be measured using light emitted from the light source portion 304. Specifically, the light emitted from the light source portion 304 passes through the object to be measured and is converted into an electrical signal corresponding to the amount of light received by the photoelectric conversion element 10. Then, image information on the vein pattern of the object to be measured is obtained from the converted electrical signal.

In the vein authentication device, vein authentication is performed by comparing the obtained image information with the vein data for the vein authentication recorded in advance by any suitable conventionally known step.

(Image Detection Unit for TOF Type Distance Measuring Device)

FIG. 6 is a view schematically illustrating a configuration example of an image detection unit for an indirect time-of-flight (TOF) type distance measuring device.

An image detection unit 400 for a TOF type distance measuring device includes a CMOS transistor substrate 20, an interlayer insulating film 30 provided so as to cover the CMOS transistor substrate 20, a photoelectric conversion element 10 according to the embodiment of the present invention provided on the interlayer insulating film 30, two floating diffusion layers 402 arranged to be spaced from each other so as to interpose the photoelectric conversion element 10 therebetween, an insulating layer 40 provided so as to cover the photoelectric conversion element 10 and the floating diffusion layer 402, and two photo-gates 404 provided on the insulating layer 40 and arranged to be spaced apart from each other.

A part of the insulating layer 40 is exposed from a gap between the two photo-gates 404 spaced apart from each other, and the remaining region is shielded from light by a light shielding portion 406. The CMOS transistor substrate 20 and the floating diffusion layer 402 are electrically connected by an interlayer wiring portion 32 provided so as to penetrate the interlayer insulating film 30.

The interlayer insulating film 30 can be formed of any suitable conventionally known insulating material such as silicon oxide or an insulating resin. The interlayer wiring portion 32 can be formed of any suitable conventionally known conductive material (wiring material) such as copper or tungsten. The interlayer wiring portion 32 may be, for example, an in-hole wiring simultaneously formed with formation of a wiring layer or a buried plug formed separately from the wiring layer.

In this configuration example, the insulating layer 40 can have any suitable conventionally known configuration such as a field oxide film formed of silicon oxide.

The photo-gate 404 can be formed of any suitable conventionally known material such as polysilicon.

The image detection unit 400 for a TOF type distance measuring device includes the photoelectric conversion element 10 according to the embodiment of the present invention as a functional unit exhibiting an essential function. The image detection unit 400 for a TOF type distance measuring device can include any suitable conventionally known member such as a protection film, a support substrate, a sealing substrate, a sealing member, a barrier film, a bandpass filter, or an infrared cut film (not illustrated) in a form corresponding to a design that can obtain desired characteristics.

Here, an operation of the image detection unit 400 for a TOF type distance measuring device will be briefly described.

Light is emitted from a light source, the light emitted from the light source is reflected by an object to be measured, and the reflected light is received by the photoelectric conversion element 10. The two photo-gates 404 are provided between the photoelectric conversion element 10 and the floating diffusion layer 402, and pulses are alternately applied, such that signal charges generated by the photoelectric conversion element 10 are transferred to one of the two floating diffusion layers 402, and charges are accumulated in the floating diffusion layers 402. When light pulses arrive so as to spread equally with respect to the timing at which the two photo-gates 404 are opened, the amounts of charges accumulated in the two floating diffusion layers 402 become equal. When the light pulses arrive at the other photo-gate 404 later than the timing at which the light pulses arrive at the one photo-gate 404, a difference in the amounts of charges accumulated in the two floating diffusion layers 402 occurs.

The difference in the amount of charges accumulated in the floating diffusion layer 402 depends on the delay time of the light pulse. Since a distance L to the object to be measured has a relationship of L=(1/2) ctd using a round-trip time of light td and a velocity of light c, when the delay time can be estimated from the difference in the amounts of charges accumulated in the two floating diffusion layers 402, the distance to the object to be measured can be determined.

The amount of light received by the photoelectric conversion element 10 is converted into an electrical signal as the difference in the amounts of charges accumulated in the two floating diffusion layers 402, and is output to the outside of the photoelectric conversion element 10 as a light reception signal, that is, an electrical signal corresponding to the object to be measured.

Then, the light reception signal output from the floating diffusion layers 402 is input to the CMOS transistor substrate 20 via the interlayer wiring portion 32, is read by the signal reading circuit built in the CMOS transistor substrate 20, and is further subjected to signal processing by any suitable conventionally known functional unit (not illustrated), such that distance information is generated based on the object to be measured.

7. Photodetector

As described above, the photoelectric conversion element of the present embodiment can have a photodetection function capable of converting the emitted light into an electrical signal according to the amount of received light and outputting the electrical signal to an external circuit through the electrode. Therefore, the photoelectric conversion element according to the embodiment of the present invention can be particularly suitably applied as a photodetector having a photodetection function. Here, the photodetector of the present embodiment may be a photoelectric conversion element itself, and may further include a functional element for voltage control or the like in addition to the photoelectric conversion element.

EXAMPLES

Hereinafter, Examples will be shown in order to describe the present invention in more detail. The present invention is not limited to the following Examples.

[Semiconductor Material]

As a material P-1, the material synthesized with reference to the method described in WO 2013/051676 A was used.

As a material P-2, trade name: PTB7 manufactured by 1-Material Inc. was used.

As a material P-3, trade name: PBDB-T-2F manufactured by 1-Material Inc. was used.

As a material N-1, trade name: E100 manufactured by Frontier Carbon Corporation was used.

As a material N-2, trade name: ITIC manufactured by 1-Material Inc. was used.

As a material N-3, trade name: Y6 manufactured by 1-Material Inc. was used.

The specific structures of the materials P-1 to P-3 as the p-type semiconductor materials and the materials N-1 to N-3 as the n-type semiconductor materials used in the present Example are shown in Tables 1 and 2.

TABLE 1
| Reference sign | Chemical structure |
|---|---|
| p-Type semiconductor material | P-1 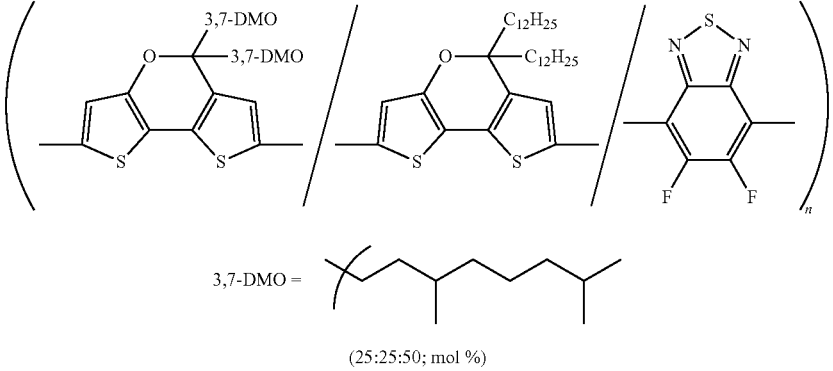 (25:25:50; mol %) |
| | P-2 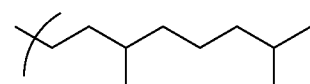 |
| | P-3 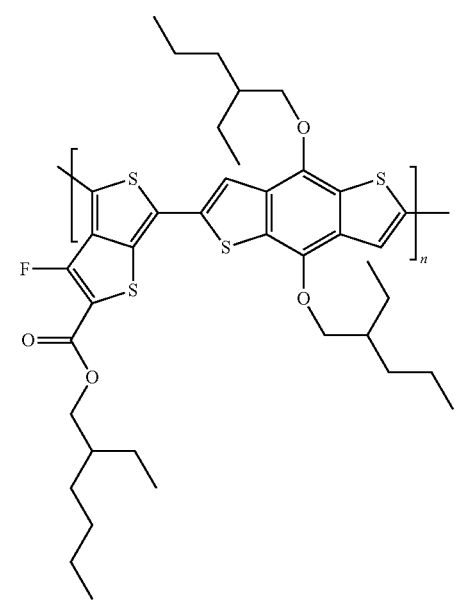 |

TABLE 2

| Reference sign | | Chemical structure |
|---|---|---|
| n-Type semiconductor material | N-1 | 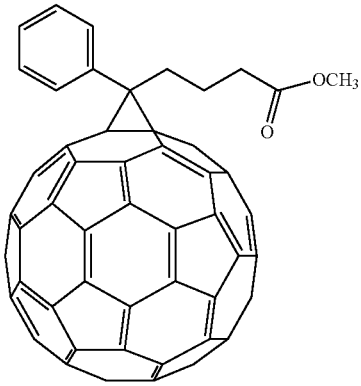<br>C60PCBM |
| | N-2 | 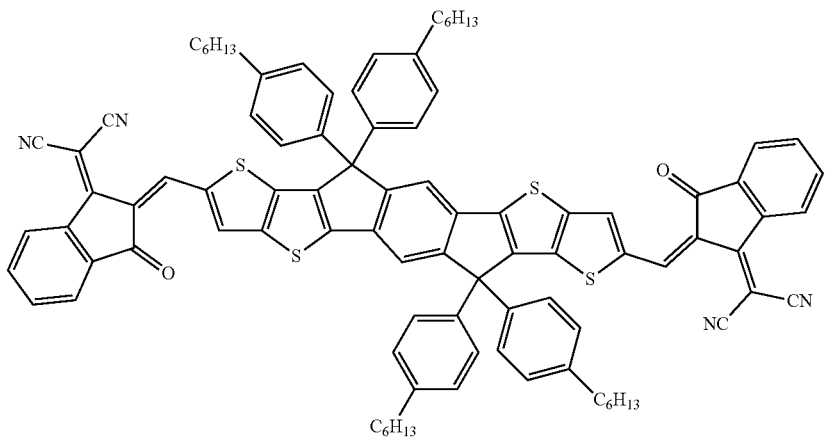 |
| | N-3 | 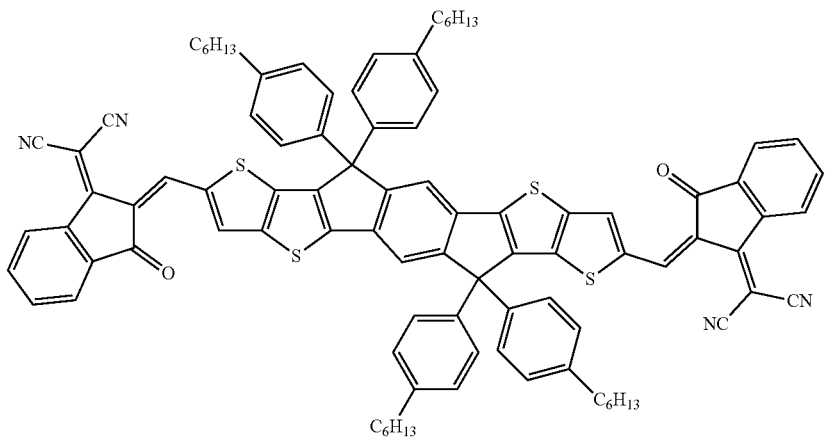 |

Example 1

Preparation of Ink Composition

1. Preparation of Composition

The material P-1 as a p-type semiconductor material and the material N-1 as an n-type semiconductor material were mixed with 1,2,3,4-tetrahydronaphthalene so that the amount of the material P-1 was 0.8% by mass with respect to the entire composition and the amount of the material N-1 was 1.6% by mass with respect to the total mass of the composition, the mixture was stirred at 60° C. for 6 hours, and then, the mixture was filtered with a filter, thereby obtaining a composition (ink (I-1A)).

2. Storage of Composition

The obtained composition (ink composition (I-1A)) was contained in a glass vial bottle (10 mL) and stored at 27° C.

for 7 days under light shielding. Here, the ink composition after storage for 7 days is referred to as an ink composition (I-1B7). The storage time and composition of each of the ink compositions (I-1A) and (I-1B7) are shown in Table 3.

Note that the reference sign "A" related to the ink composition means that the composition (ink composition) is not subjected to a storage treatment, that is, the initial ink composition having a storage time of 0 hours, the reference sign "B" indicates the stored ink composition, and the number added immediately after the reference sign "B" indicates the storage time (the number of days).

[Manufacture and Evaluation of Photoelectric Conversion Element]

1. Manufacture of Photoelectric Conversion Element

Preparation of Glass Substrate

A glass substrate on which an ITO film was formed at a thickness of 100 nm by a sputtering method (hereinafter, simply referred to as a glass substrate) was prepared. Then, the glass substrate was subjected to a cleaning treatment by an ozone UV treatment.

(Formation of Electron Transport Layer)

Next, the glass substrate was immersed in a solution obtained by dissolving 0.1% by mass of a polyethyleneimine 80% ethoxylated aqueous solution (manufactured by Sigma-Aldrich Co., LLC, 37% by mass of aqueous solution) in water for 5 minutes, and the glass substrate was pulled up and then placed on a hot plate, and the glass substrate was dried in the air under a condition of 100° C. for 10 minutes. Then, the washed glass substrate was washed with water, and the washed glass substrate was placed on a hot plate, and the glass substrate was dried in the air under a condition of 100° C. for 10 minutes, thereby forming an electron transport layer on an ITO film functioning as a first electrode (cathode).

(Formation of Active Layer)

Next, the ink composition (I-1B7) was applied onto the electron transport layer by a slot die coating method to form a coating film, and then a vacuum drying treatment (pressure: 10 Pa, 70° C.) was performed for 5 minutes. The glass substrate on which the coating film subjected to the drying treatment was formed was placed on a hot plate, and the glass substrate was dried under a condition of 100° C. for 12 minutes, thereby forming an active layer. A thickness of the formed active layer was about 530 nm.

(Formation of Electrode)

Then, a suspension (manufactured by Heraeus, Clevios F HC Solar) obtained by dissolving poly(3,4-ethylenedioxythiophene)/polystyrene sulfonic acid in water was applied onto the formed active layer by a spin coating method, thereby forming a coating film. The glass substrate in which the coating film was formed on the active layer was placed in an oven, and the glass substrate was dried under a condition of 85° C. for 30 minutes, thereby forming a second electrode (anode). A thickness of the formed second electrode was about 120 nm.

2. Evaluation of Photoelectric Conversion Element (Measurement of External Quantum Efficiency (EQE))

In a state where a reverse bias voltage of 2 V was applied to the photoelectric conversion element manufactured as described above, a current value generated by irradiating the photoelectric conversion element with monochromatic light of 530 nm (number of photons: $5\times10^{14}$) was measured using a spectral sensitivity measuring device (manufactured by Bunkoukeiki Co., Ltd., trade name: CEP-2000 type), and EQE was determined by a known method.

Examples 2 to 5, Comparative Example 1, and Reference Examples 1 to 3

Preparation and Storage of Composition (Ink Composition)

Ink compositions (I-2A) and (I-3A) were further prepared in the same manner as that of Example 1, except that the p-type semiconductor material, the n-type semiconductor material, and the solvent were selected as shown in Table 3. Hereinafter, the weight ratio (mixing ratio) of the solvent is also shown in the table.

Ink compositions (I-1B3), (I-1B14), (I-1B30), (I-2B90), and (I-3B90) were prepared in the same manner as that of Example 1, except that the storage was performed by changing the storage time (the number of days) as shown in Table 5.

[Manufacture and Evaluation of Photoelectric Conversion Element]

1. Manufacture of Photoelectric Conversion Element

Photoelectric conversion elements according to Examples 2 to 5, Comparative Example 1, and Reference Examples 1 to 3 were manufactured in the same manner as that of Example 1 except for using the ink compositions (I-1B3), (I-1B14), (I-1B30), (I-2B90), and (I-3B90).

TABLE 3

|  | Ink composition | Storage time (day) | p-Type semiconductor material | n-Type semiconductor material | Solvent 1 (weight ratio) | Solvent 2 (weight ratio) |
| --- | --- | --- | --- | --- | --- | --- |
| Reference Example 1 | I-1A | 0 | P-1 | N-1 | 1,2,3,4-Tetrahydronaphthalene (100) | None |
| Comparative Example 1 | I-1B3 | 3 |  |  |  |  |
| Example 1 | I-1B7 | 7 |  |  |  |  |
| Example 2 | I-1B14 | 14 |  |  |  |  |
| Example 3 | I-1B30 | 30 |  |  |  |  |
| Reference Example 2 | I-2A | 0 |  |  | o-Xylene (96) | Acetophenone (4) |
| Example 4 | I-2B90 | 90 |  |  |  |  |
| Reference Example 3 | I-3A | 0 |  |  | o-Xylene (97) | Methyl benzoate (3) |
| Example 5 | I-3B90 | 90 |  |  |  |  |

2. Evaluation of Photoelectric Conversion Element

For each of the ink compositions, a relative rate (%) of EQE obtained by the photoelectric conversion element manufactured using the ink composition after a lapse of a predetermined storage time as a material of the active layer to the initial EQE obtained by the photoelectric conversion element manufactured using the initial ink compositions (I-1A), (I-2A), and (I-3A) having a storage time of 0 day as materials of the active layer, that is, a rate (%) of EQE of the photoelectric conversion element manufactured using the ink composition after a lapse of a predetermined storage time based on the initial EQE as a reference (100%) was determined. The results (evaluations 1 to 6) are shown in Table 4.

TABLE 4

|  | Ink composition | Storage time (day) | Relative rate of EQE (%) |
|---|---|---|---|
| Evaluation 1 | I-1B3 | 3 | 100 |
| Evaluation 2 | I-1B7 | 7 | 104 |
| Evaluation 3 | I-1B14 | 14 | 104 |
| Evaluation 4 | I-1B30 | 30 | 108 |
| Evaluation 5 | I-2B90 | 90 | 102 |
| Evaluation 6 | I-3B90 | 90 | 112 |

As a result, it was found that EQE of the photoelectric conversion element was improved by storing the ink compositions (I-1A), (I-2A), and (I-3A) for longer than 3 days and 4 days or longer.

Example 6 and Reference Example 4

Preparation of Composition (Ink Composition)

As shown in Table 5, the p-type semiconductor material P-2 as a p-type semiconductor material and the n-type semiconductor material N-1 as an n-type semiconductor material were mixed with 1,2-dichlorobenzene so that the amount of the p-type semiconductor material P-2 was 1.5% by mass with respect to the total weight of the composition and the amount of the n-type semiconductor material N-1 was 1.5% by mass with respect to the total mass of the composition, the mixture was stirred at 50° C. for 6 hours, and then, the mixture was filtered with a filter, thereby obtaining an ink composition (I-4A).

[Storage of Composition]

The obtained ink composition (I-4A) was contained in a glass vial bottle (10 mL), and the ink composition was stored under light shielding and a condition of 30° C. or lower for 14 days, thereby preparing an ink composition (I-4B14).

[Manufacture and Evaluation of Photoelectric Conversion Element]

1. Manufacture of Photoelectric Conversion Element

A glass substrate on which an ITO film was formed at a thickness of 100 nm by a sputtering method was prepared. The glass substrate was subjected to a surface treatment by an ozone UV treatment.

(Formation of Active Layer)

The ink composition (I-4A) or the ink composition (I-4B14) was applied onto the ITO film of the surface-treated glass substrate by a spin coating method to form a coating film. The glass substrate on which the coating film was formed was placed on a hot plate, and the coating film was dried in the air under a condition of 70° C. for 2 minutes. Subsequently, the glass substrate on which the coating film was formed was placed on a hot plate, and the coating film was dried in a nitrogen gas atmosphere under a condition of 100° C. for 10 minutes, thereby forming an active layer. A thickness of the formed active layer was about 350 nm.

(Formation of Electron Transport Layer)

Then, 45% by mass of an isopropanol dispersion (manufactured by TAYCA CORPORATION, HTD-711Z) of zinc oxide nanoparticles (particle diameter of 20 to 30 nm) was diluted 10 times the parts by mass of the isopropanol dispersion with 3-pentanol, thereby preparing a coating liquid. The coating liquid was applied onto the active layer formed by a spin coating method at a thickness of 40 nm, and the active layer was subjected to a heat treatment at 70° C. for 5 minutes, thereby forming an electron transport layer.

(Formation of Electrode and Formation of Sealing Layer)

Thereafter, an Ag film as an electrode (second electrode) was formed on the electron transport layer at a thickness of about 80 nm using a resistance heating vapor deposition device.

Then, a UV-curable sealing agent was applied to the periphery of the glass substrate on which the electrode was formed, and a glass plate was bonded to an upper portion of the electrode and then sealed by irradiation with UV rays, thereby obtaining a photoelectric conversion element. The shape of the obtained photoelectric conversion element was a square of 2 mm×2 mm.

2. Evaluation of Photoelectric Conversion Element (Measurement of External Quantum Efficiency (EQE))

In a state where a reverse bias voltage of 2 V was applied to the manufactured photoelectric conversion element, a current value generated by irradiating the photoelectric conversion element with monochromatic light of 530 nm (number of photons: $5 \times 10^{14}$) was measured using a spectral sensitivity measuring device (manufactured by Bunkoukeiki Co., Ltd., trade name: CEP-2000 type), and EQE was determined by a known method. The results (evaluation 7) are shown in Table 6.

TABLE 5

|  | Ink composition | Storage time (day) | p-Type semiconductor material | Concentration of p-type semiconductor material (% by mass) | n-Type semiconductor material | Concentration of n-type semiconductor material (% by mass) | Solvent |
|---|---|---|---|---|---|---|---|
| Reference Example 4 | I-4A | 0 | P-2 | 1.5 | N-2 | 1.5 | 1,2-Dichlorobenzene |
| Example 6 | I-4B14 | 14 |  |  |  |  |  |

TABLE 6

| | Ink composition | Storage time (day) | Relative rate of EQE (%) |
|---|---|---|---|
| Evaluation 7 | I-4B14 | 14 | 109 |

As a result, it was found that EQE of the photoelectric conversion element was improved by storing the ink composition (I-4A) for longer than 3 days and 4 days or longer.

Example 7 and Reference Example 5

Preparation of Ink Composition, and Manufacture and Evaluation of Photoelectric Conversion Element An ink composition (I-5A) and an ink composition (I-5B14) were prepared in the same manner as that of Example 6 except that the p-type semiconductor material, the n-type semiconductor material, the solvent, and the storage time of the ink composition were changed as shown in Table 7, a photoelectric conversion element was manufactured using the ink composition (I-5A) (Reference Example 5) or the ink composition (I-5B14) (Example 7), and evaluation was performed. The results (evaluation 8) are shown in Table 8.

TABLE 7

| | Ink coirposition | Storage time (day) | p-Type semiconductor material | Concentration of p-type semiconductor material (% by mass) | n-Type semiconductor material | Concentration of n-type semiconductor material (% by mass) | Solvent 1 (weight ratio) | Solvent 2 (weight ratio) |
|---|---|---|---|---|---|---|---|---|
| Reference Example 5 | I-5A | 0 | P-3 | 1.2 | N-3 | 1.2 | Chloroform (99.5) | 1-Chloronaphthalene (0.5) |
| Example 7 | I-5B14 | 14 | | | | | | |

TABLE 8

| | Ink composition | Storage time (day) | Relative rate of EQE (%) |
|---|---|---|---|
| Evaluation 8 | I-5B14 | 14 | 131 |

As a result, it was found that EQE of the photoelectric conversion element was improved by storing the ink composition (I-5A) for longer than 3 days and 4 days or longer.

Example 8

Preparation of Composition (Semiconductor Material Solution)

First, a mixed solvent obtained by mixing chloroform and 1-chloronaphthalene was prepared as a solvent at a mixing ratio (weight ratio) of chloroform/1-chloronaphthalene=99.5/0.5.

Then, the material P-3 was a p-type semiconductor material was weighed and mixed in a mixed solvent so that the amount thereof was 2.4% by mass, the mixture was stirred at 50° C. for 6 hours, and then, the mixture was filtered with a filter, thereby preparing a composition (hereinafter, referred to as a P-3 solution) as a semiconductor material solution containing the material P-3 (2.4% by mass). In addition, the material N-3 as an n-type semiconductor material was used and mixed in a mixed solvent so that the amount thereof was 2.4% by mass, thereby preparing a composition (hereinafter, referred to as an N-3 solution) as a semiconductor material solution containing the material N-3 (2.4% by mass).

[Storage of Semiconductor Material Solution]

Each of the P-3 solution and the N-3 solution was contained in a glass vial bottle (10 mL), and each of the solutions was stored under light shielding and a condition of 30° C. for 14 days. Thereafter, the P-3 solution and the N-3 solution were mixed in equal amounts to obtain an ink composition I-6B14 as shown in Table 9.

TABLE 9

| | Ink composition | Storage time (day) | p-Type semiconductor material | Concentration of p-type semiconductor material (% by mass) | n-Type semiconductor material | Concentration of n-type semiconductor material (% by mass) | Solvent 1 (weight ratio) | Solvent 2 (weight ratio) |
|---|---|---|---|---|---|---|---|---|
| Example 8 | I-6B14 | 14 | P-3 | 1.2 | N-3 | 1.2 | Chloroform (99.5) | 1-Chloronaphthalene (0.5) |

[Manufacture and Evaluation of Photoelectric Conversion Element]

A photoelectric conversion element was manufactured and evaluated in the same manner as that of Example 6 except for using the ink composition I-6B14. The results (evaluation 9) are shown in Table 10.

TABLE 10

| | Ink composition | Storage time (day) | Relative rate of EQE (%) |
|---|---|---|---|
| Evaluation 9 | I-6B14 | 14 | 115 |

As a result, it was found that even when the ink composition prepared by mixing the P-3 solution containing the p-type semiconductor material and the N-3 solution containing the n-type semiconductor material stored for longer than 3 days and 4 days or longer was used, EQE of the photoelectric conversion element was improved as compared with Reference Example 5 using the ink composition (I-5A).

DESCRIPTION OF REFERENCE SIGNS

1 Image detection unit
2 Display device
10 Photoelectric conversion element
11, 210 Support substrate
12 First electrode
13 Electron transport layer
14 Active layer
15 Hole transport layer
16 Second electrode
17 Sealing member
20 CMOS transistor substrate
30 Interlayer insulating film
32 Interlayer wiring portion
40 Sealing layer
42 Scintillator
44 Reflective layer
46 Protection layer
50 Color filter
100 Fingerprint detection unit
200 Display panel unit
200a Display area
220 Organic EL element
230 Touch sensor panel
240 Sealing substrate
300 Vein detection unit
302 Glass substrate
304 Light source portion
306 Cover portion
310 Insertion portion
400 Image detection unit for TOF type distance measuring device
402 Floating diffusion layer
404 Photo-gate
406 Light shielding portion

The invention claimed is:

1. A method for producing an ink composition for manufacturing photoelectric conversion element containing a p-type semiconductor material, an n-type semiconductor material, and a solvent, the method comprising:

a step of preparing a composition comprising (a) the solvent and (b) the p-type semiconductor material dissolved in the solvent, wherein the prepared composition comprises (a) the solvent and (b) the p-type semiconductor material dissolved in the solvent; and a step of storing the prepared composition for 4 days or longer to prepare the ink composition, wherein the p-type semiconductor material contains a polymer compound containing a constitutional unit represented by the following Formula (I) and/or a constitutional unit represented by the following Formula (II):

[Chem. 1]

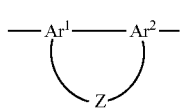

(I)

in Formula (I), $Ar^1$ and $Ar^2$ each independently represent a trivalent aromatic heterocyclic group which may have a substituent, and Z represents a group represented by any one of the following Formulas (Z-1) to (Z-7),

[Chem. 2]

(II)

in Formula (II), $Ar^3$ represents a divalent aromatic heterocyclic group,

[Chem. 3]

(Z-1)

(Z-2)

(Z-3)

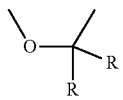

(Z-4)

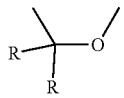

(Z-5)

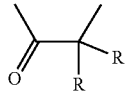

(Z-6)

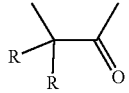

(Z-7)

in Formulas (Z-1) to (Z-7), R represents
a hydrogen atom,
a halogen atom, an alkyl group which may have a substituent,
a cycloalkyl group which may have a substituent,
an alkenyl group which may have a substituent,
a cycloalkenyl group which may have a substituent,
an alkynyl group which may have a substituent,
a cycloalkynyl group which may have a substituent,
an aryl group which may have a substituent,
an alkyloxy group which may have a substituent,
a cycloalkyloxy group which may have a substituent,
an aryloxy group which may have a substituent,
an alkylthio group which may have a substituent,
a cycloalkylthio group which may have a substituent,
an arylthio group which may have a substituent,
a monovalent heterocyclic group which may have a substituent,
a substituted amino group which may have a substituent,
an imine residue which may have a substituent,
an amide group which may have a substituent,
an acid imide group which may have a substituent,
a substituted oxycarbonyl group which may have a substituent,
a cyano group,
a nitro group,
a group represented by —C(=O)—$R^c$, or
a group represented by —SO$_2$-$R^d$,
$R^c$ and $R^d$ each independently represent
a hydrogen atom,
an alkyl group which may have a substituent,
a cycloalkyl group which may have a substituent,
an aryl group which may have a substituent,
an alkyloxy group which may have a substituent,
a cycloalkyloxy group which may have a substituent,
an aryloxy group which may have a substituent, or
a monovalent heterocyclic group which may have a substituent, and
in Formulas (Z-1) to (Z-7), when the number of R's is two, the two R's may be the same as or different from each other.

2. The method for producing an ink composition according to claim 1, wherein the solvent contains an aromatic hydrocarbon.

3. The method for producing an ink composition according to claim 1, wherein the step of preparing the composition is performed under a condition of 0° C. or higher and 200° ° C. or lower.

4. The method for producing an ink composition according to claim 1, wherein the step of storing the composition is performed under light shielding.

5. The method for producing an ink composition according to claim 1, wherein the step of preparing the composition includes a step of producing two or more compositions, and
the step of preparing the ink composition includes a step of mixing the two or more compositions.

6. The method for producing an ink composition according to claim 1, wherein the step of preparing the ink composition further includes a step of filtering the composition.

7. A solidified film obtained by solidifying the ink composition produced by the method for producing an ink composition according to claim 1.

8. A photodetector comprising a first electrode, a second electrode, and an active layer provided between the first electrode and the second electrode,
wherein the active layer is the solidified film according to claim 7.

9. The method for producing an ink composition according to claim 1, wherein the prepared composition further comprises the n-type semiconductor material dissolved in the solvent.

10. The method for producing an ink composition according to claim 9, wherein the n-type semiconductor material contains a fullerene derivative.

11. The method for producing an ink composition according to claim 9, wherein the n-type semiconductor material contains a non-fullerene compound.

* * * * *